United States Patent
Dupre et al.

(10) Patent No.: US 11,892,325 B2
(45) Date of Patent: Feb. 6, 2024

(54) POSITION SENSOR DEVICES, METHODS AND SYSTEMS BASED ON MAGNETIC FIELD GRADIENTS

(71) Applicant: Melexis Technologies SA, Bevaix (CH)

(72) Inventors: Nicolas Dupre, Bevaix (CH); Yves Bidaux, Bevaix (CH)

(73) Assignee: MELEXIS TECHNOLOGIES, Bevaix (CH)

( * ) Notice: Subject to any disclaimer, the term of this patent is extended or adjusted under 35 U.S.C. 154(b) by 384 days.

(21) Appl. No.: 17/207,301

(22) Filed: Mar. 19, 2021

(65) Prior Publication Data
US 2021/0293580 A1      Sep. 23, 2021

(30) Foreign Application Priority Data

Mar. 23, 2020 (EP) ................................. 20165060

(51) Int. Cl.
| | |
|---|---|
| G01D 5/14 | (2006.01) |
| G01B 7/30 | (2006.01) |
| G01K 13/00 | (2021.01) |
| G01L 5/00 | (2006.01) |

(52) U.S. Cl.
CPC ............. G01D 5/145 (2013.01); G01B 7/30 (2013.01); G01K 13/00 (2013.01); G01L 5/00 (2013.01)

(58) Field of Classification Search
CPC ........... G01P 15/08; G01P 3/46; G01R 33/07; G01R 33/022; G01R 15/202; G01R 33/0094

See application file for complete search history.

(56) References Cited

U.S. PATENT DOCUMENTS

| | | | | |
|---|---|---|---|---|
| 6,232,832 | B1 * | 5/2001 | Kirkpatrick | H03F 3/45475 327/309 |
| 9,846,204 | B2 * | 12/2017 | Huber | G01R 33/0082 |
| 2006/0028204 | A1 | 2/2006 | Oohira | |
| 2011/0270553 | A1 * | 11/2011 | Ausserlechner | G01N 27/72 702/183 |

(Continued)

FOREIGN PATENT DOCUMENTS

| | | |
|---|---|---|
| EP | 3109658 A1 | 12/2016 |
| EP | 3321638 A1 | 5/2018 |

(Continued)

OTHER PUBLICATIONS

"Atan2," retrieved from https://en.wikipedia.org/wiki/Atan2 on Mar. 18, 2021, 9 pages.

(Continued)

*Primary Examiner* — Jermele M Hollington
*Assistant Examiner* — Temilade S Rhodes-Vivour
(74) *Attorney, Agent, or Firm* — Workman Nydegger

(57) ABSTRACT

A method of determining a linear or angular position of a magnetic sensor device relative to a magnetic source, or vice versa, the sensor device includes at least four magnetic sensor elements. The method involves the steps of: a) determining a first magnetic field gradient; b) determining a second magnetic field gradient; c) determining a ratio of the first and second magnetic field gradient; d) converting the ratio into a position; while matching signal paths of the magnetic sensor elements so as to improve signal-to-noise.

18 Claims, 55 Drawing Sheets

(56) References Cited

U.S. PATENT DOCUMENTS

| | | | |
|---|---|---|---|
| 2016/0155282 A1* | 6/2016 | Miura | G01R 33/0094 |
| | | | 209/567 |
| 2018/0080800 A1* | 3/2018 | Chen | G01D 5/142 |
| 2018/0284175 A1* | 10/2018 | Bickford | G01R 29/0878 |
| 2018/0372475 A1 | 12/2018 | Yoshiya | |
| 2019/0079142 A1 | 3/2019 | Close et al. | |

FOREIGN PATENT DOCUMENTS

| | | |
|---|---|---|
| WO | 9854547 A1 | 12/1998 |
| WO | 2014029885 A1 | 2/2014 |

OTHER PUBLICATIONS

Extended Search Report and Written Opinion from European Application No. 20165060.3, dated Sep. 14, 2020.

* cited by examiner gradient = (V2-V1)

= s2.I2.[Bz1m + Bzext] - s1.I1.[Bz2m + Bzext]

= (s2.I2-s1.I1).Bzext + (s2.I2.Bz1m - s1.I1.Bz2m)

(assume I1≈I2) and (assume s1.I1≈s2.I2)

≈ (s2-s1).I1.Bzext + (s1.I1).(ΔBzm)

- real gradient signal
- error term caused by sensitivity mismatch if Bzext ≠ 0

800 a) determining a first magnetic field difference (e.g. ΔBx) or gradient (e.g. dBx/dx) of a first magnetic field component (e.g. Bx), based on a first mathematical combination of signals obtained from four magnetic sensor elements,
while adjusting the signal paths of the magnetic sensor elements using a first control function (f3) or a first set of control functions

1001 b) determining a second magnetic field difference (e.g. ΔBz) or gradient (e.g. dBz/dx) of a second magnetic field component (e.g. Bz), based on a second mathematical combination of signals obtained from said four magnetic sensor elements,
while adjusting the signal paths of some of the magnetic sensor elements using a second control function (f4) or a second set of control functions

1002 c) calculating a ratio of the first magnetic field difference or gradient and the second magnetic field difference or gradient

1003 d) determining a linear or angular position based on said ratio, optionally taking into account a factor K or a function K(T),
e.g. using an arc tangent function,
e.g. in accordance with arctan( gradient1/gradient2 )
   or in accordance with arctan(K*gradient1/gradient2)
   or in accordance with arctan(K(T)*gradient1/gradient2)

1004

1000

FIG. 10 a) determining a first magnetic field difference or a first magnetic field gradient of a first magnetic field component
based on signals obtained from a first and a second magnetic sensor element, by matching the signal path of the second sensor element to the signal path of the first sensor element, e.g. using a method of FIG. 9(a)-9(d)

↓ 1101 b) determining a second magnetic field difference or a second magnetic field gradient of a second magnetic field component based on signals obtained from a third and a fourth magnetic sensor element, by matching the signal path of the fourth sensor element to the signal path of the third sensor element, e.g. using a method of FIG. 9(a)-9(d)

↓ 1102 c) calculating a ratio of the first magnetic field difference or gradient and the second magnetic field difference or gradient

↓ 1103 d) determining a linear or angular position based on said ratio, optionally taking into account a factor K or a function K(T), e.g. using an arc tangent function,
e.g. in accordance with arctan( gradient1/gradient2 )
  or in accordance with arctan(K*gradient1/gradient2)
  or in accordance with arctan(K(T)*gradient1/gradient2)

a) determining a first magnetic field difference (e.g. ΔBx/Δx) or gradient (e.g. dBx/dx) of a first magnetic field component (e.g. Bx) oriented in a first direction (X) along said first direction (X) based on signals from a first and second magnetic sensor,
by matching the signal path of the second sensor element to the signal path of the first sensor element, e.g. using a method of FIG. 9(a)-9(d)

↘ 1121 b) determining a second magnetic field difference (e.g. ΔBz/Δx) or gradient (e.g. dBz/dx) of a second magnetic field component (Bz) oriented in a second direction (Z) perpendicular to the first direction (X), along said first direction (X),
based on signals from a third and a fourth magnetic sensor,
by matching the signal path of the fourth sensor element to the signal path of the third sensor element, e.g. using a method of FIG. 9(a)-9(d)

↘ 1122 c) calculating a ratio of the first magnetic field difference or gradient and the second magnetic field difference or gradient

↘ 1123 d) determining a linear or angular position based on said ratio, optionally taking into account a factor K or a function K(T),
e.g. using an arc tangent function,
e.g. in accordance with arctan( gradient1/gradient2 )
   or in accordance with arctan(K*gradient1/gradient2)
   or in accordance with arctan(K(T)*gradient1/gradient2)

a) determining a first magnetic field difference (e.g. ΔBz/Δx) or a first magnetic field gradient (e.g. dBz/dx) of a magnetic field component (e.g. Bz) oriented in a first direction (e.g. Z) along a second direction (e.g. X) perpendicular to the first direction (e.g. Z), based on signals from a first and a second magnetic sensor, by matching the signal path of the second sensor element to the signal path of the first sensor element, e.g. using a method of FIG. 9(a)-9(d)

↘ 1141 b) determining a second magnetic field difference (e.g. ΔBz/Δy) or a second magnetic field gradient (e.g. dBz/dy) of said magnetic field component (e.g. Bz) oriented in said first direction (e.g. Z) along a third direction (e.g. Y) perpendicular to the first and second direction (e.g. Z, X), based on signals from a third and a fourth magnetic sensor, by matching the signal path of the fourth sensor element to the signal path of the third sensor element, e.g. using a method of FIG. 9(a)-9(d)

↘ 1142 c) calculating a ratio of the first magnetic field difference or gradient and the second magnetic field difference or gradient

↘ 1143 d) determining a linear or angular position based on said ratio, optionally taking into account a factor K or a function K(T), e.g. using an arc tangent function, e.g. in accordance with arctan( gradient1/gradient2 )
  or in accordance with arctan(K*gradient1/gradient2)
  or in accordance with arctan(K(T)*gradient1/gradient2)

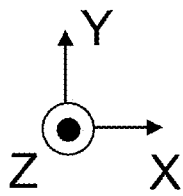
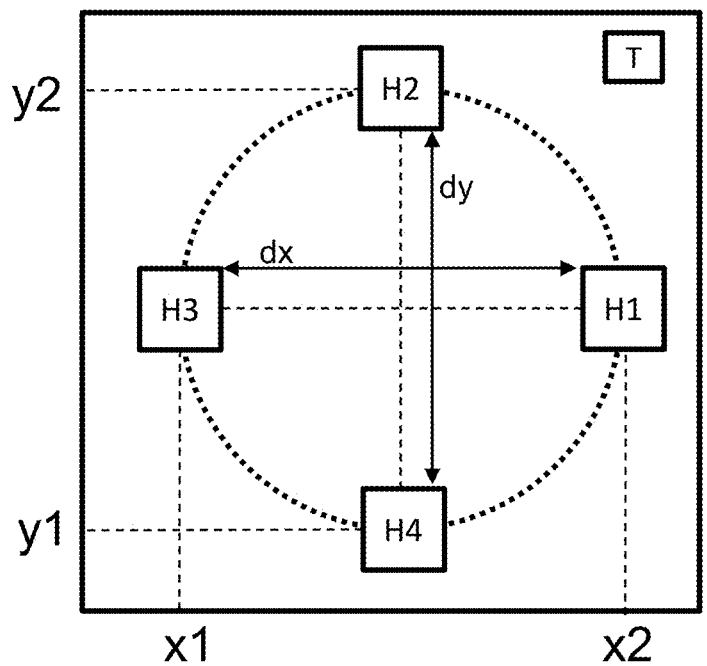
FIG. 12(a)
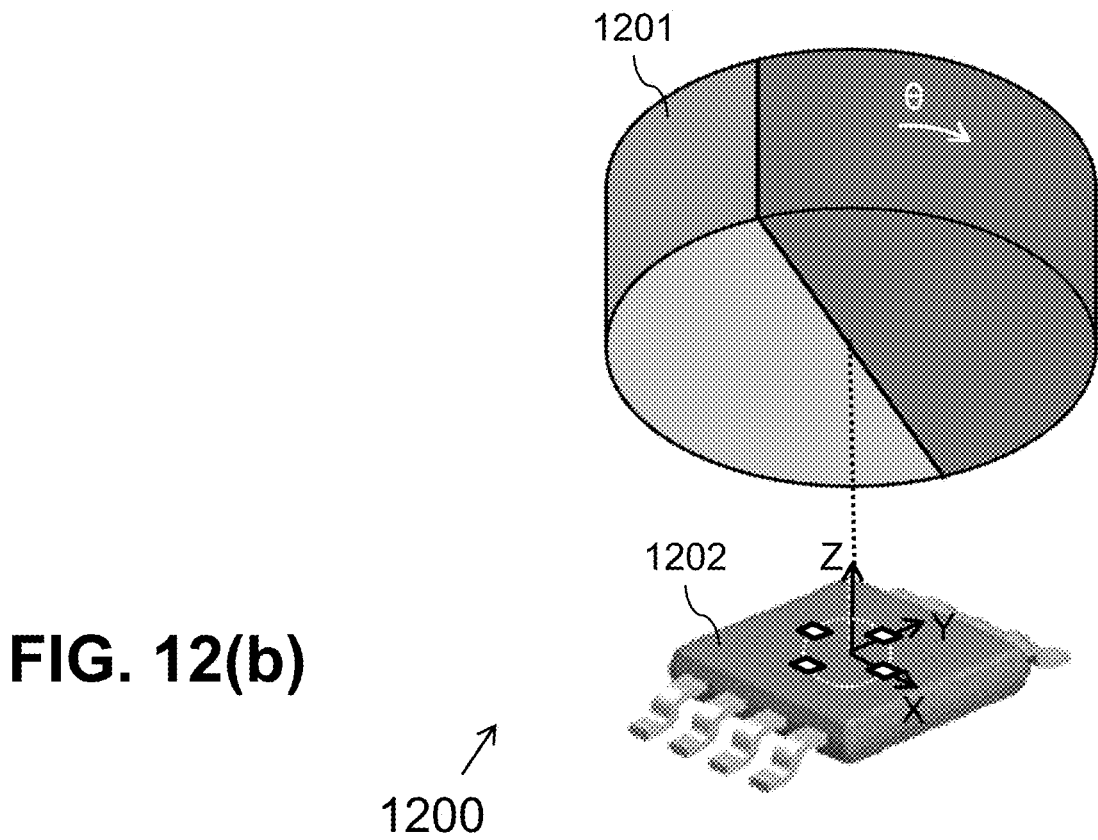
FIG. 12(b)

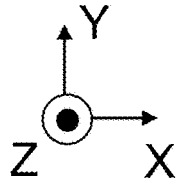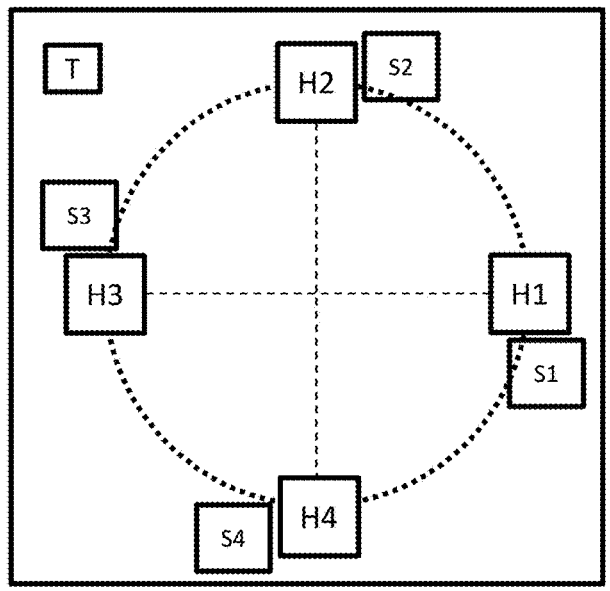
FIG. 13(a)
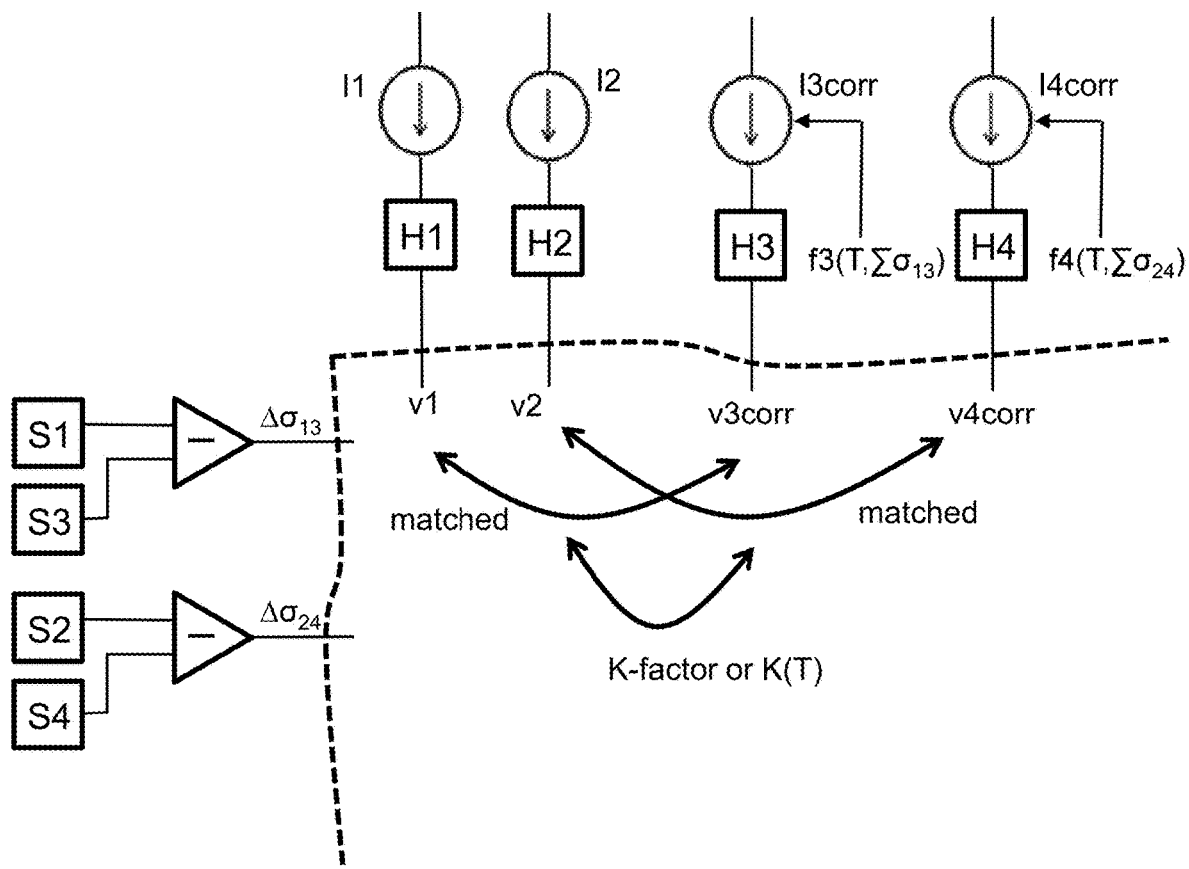
FIG. 13(b)

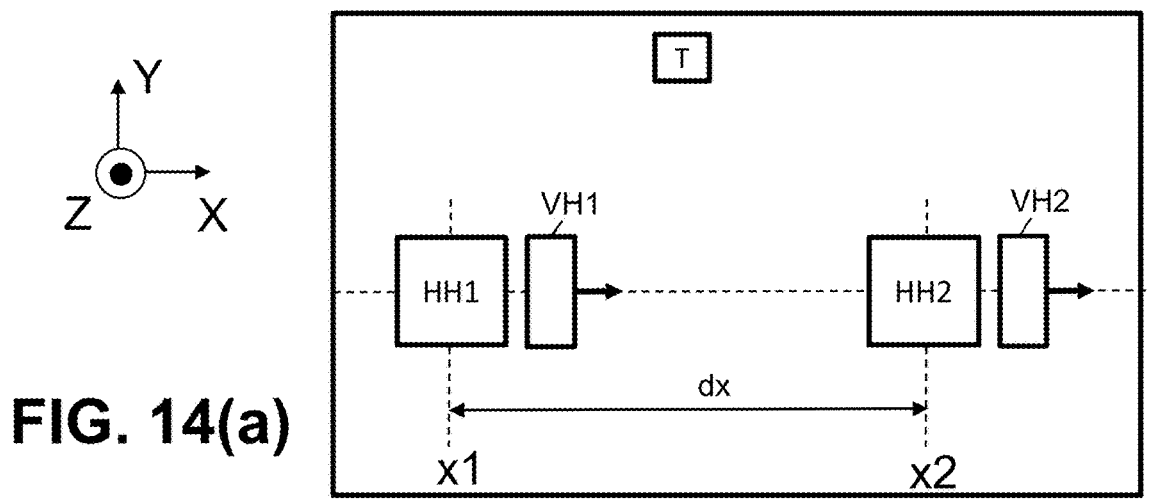
FIG. 14(a)
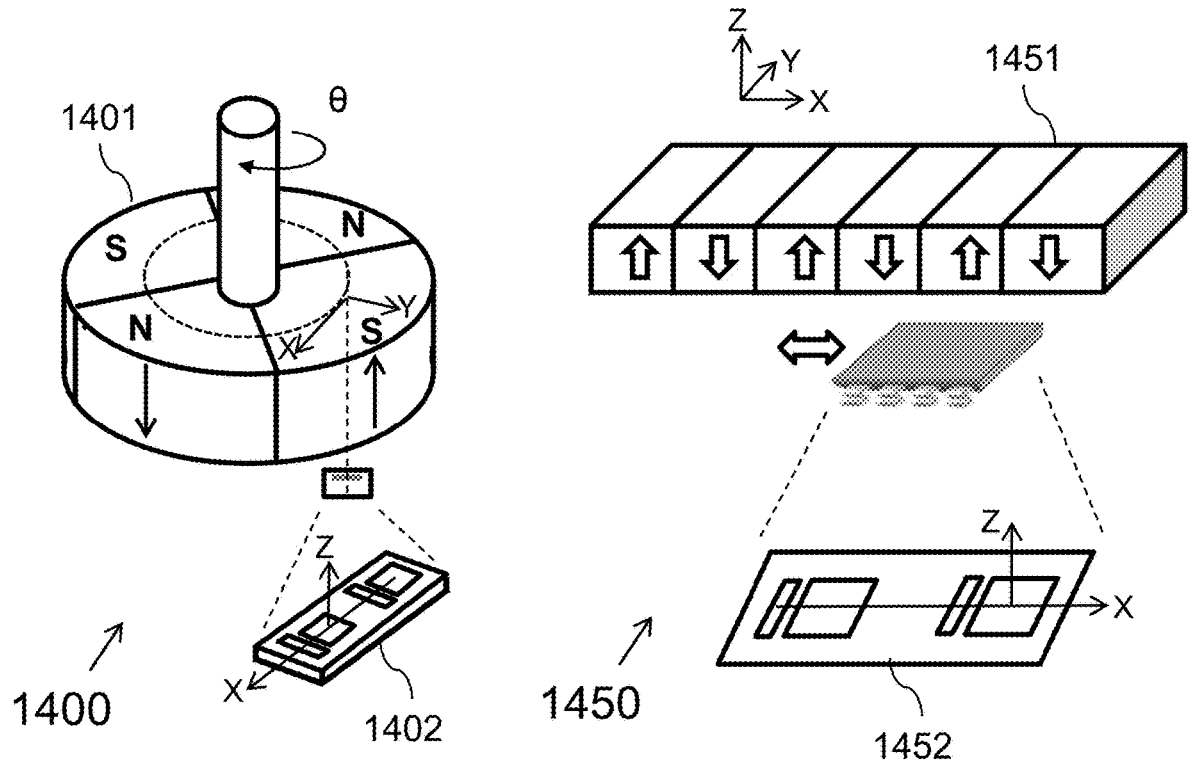
FIG. 14(b)
FIG. 14(c)

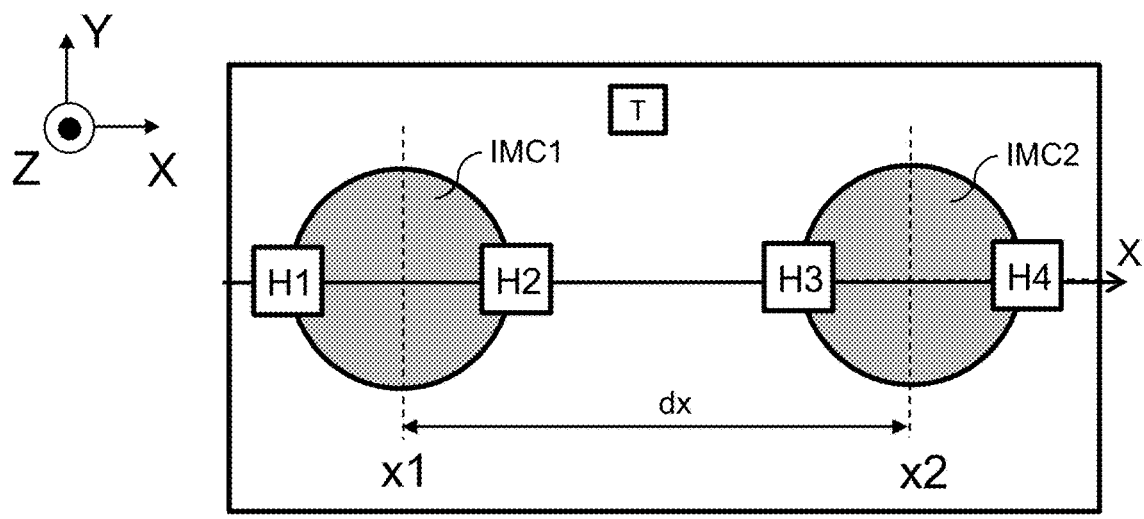
FIG. 16(a)
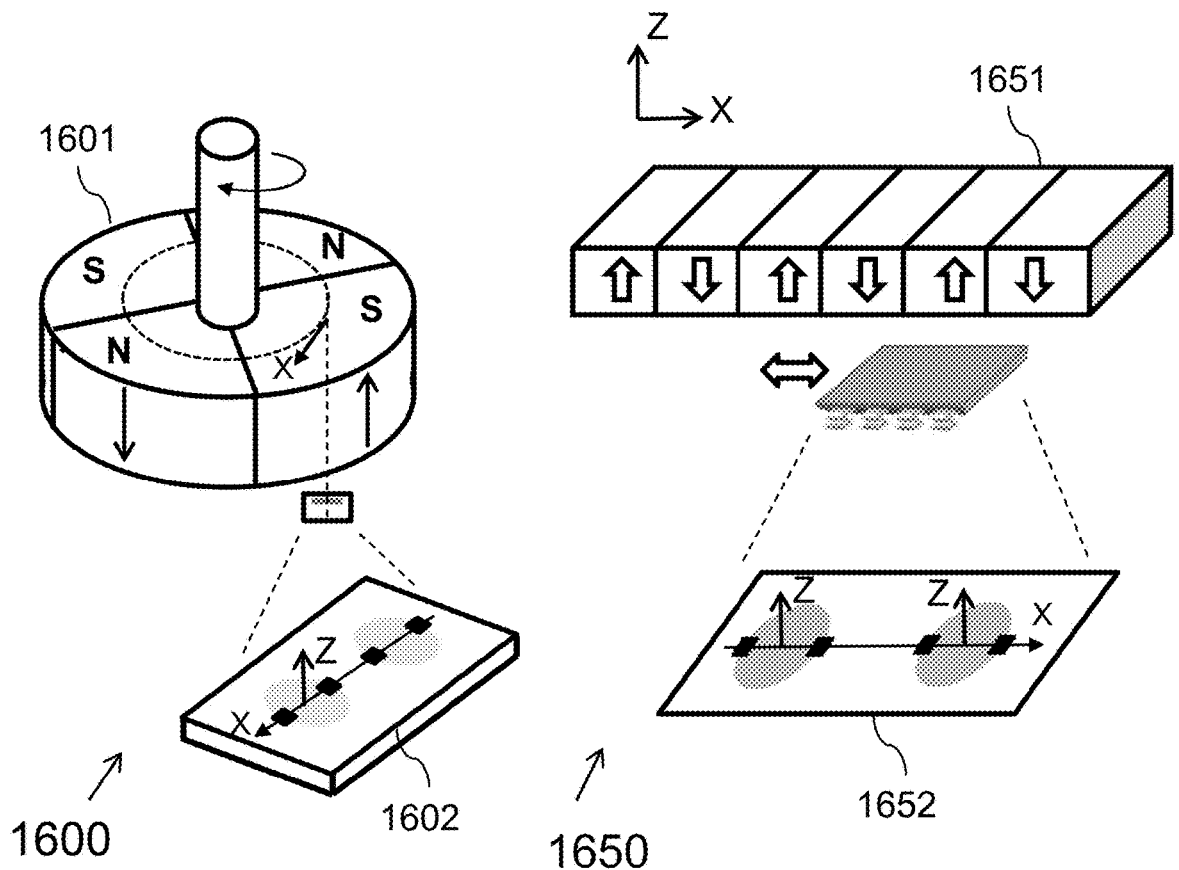
FIG. 16(b)  FIG. 16(c)

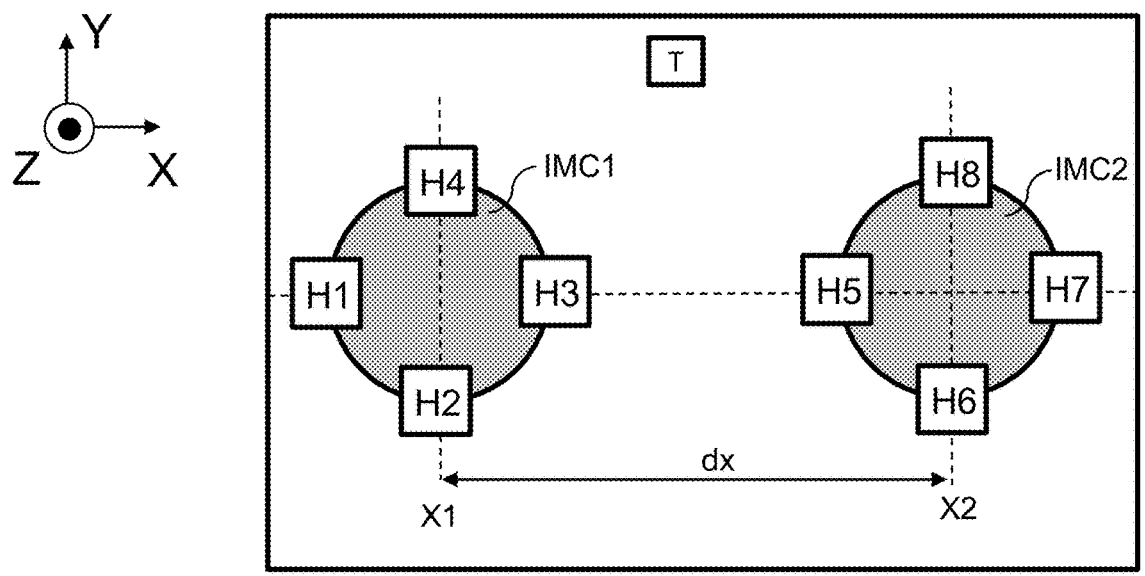
FIG. 18(a)
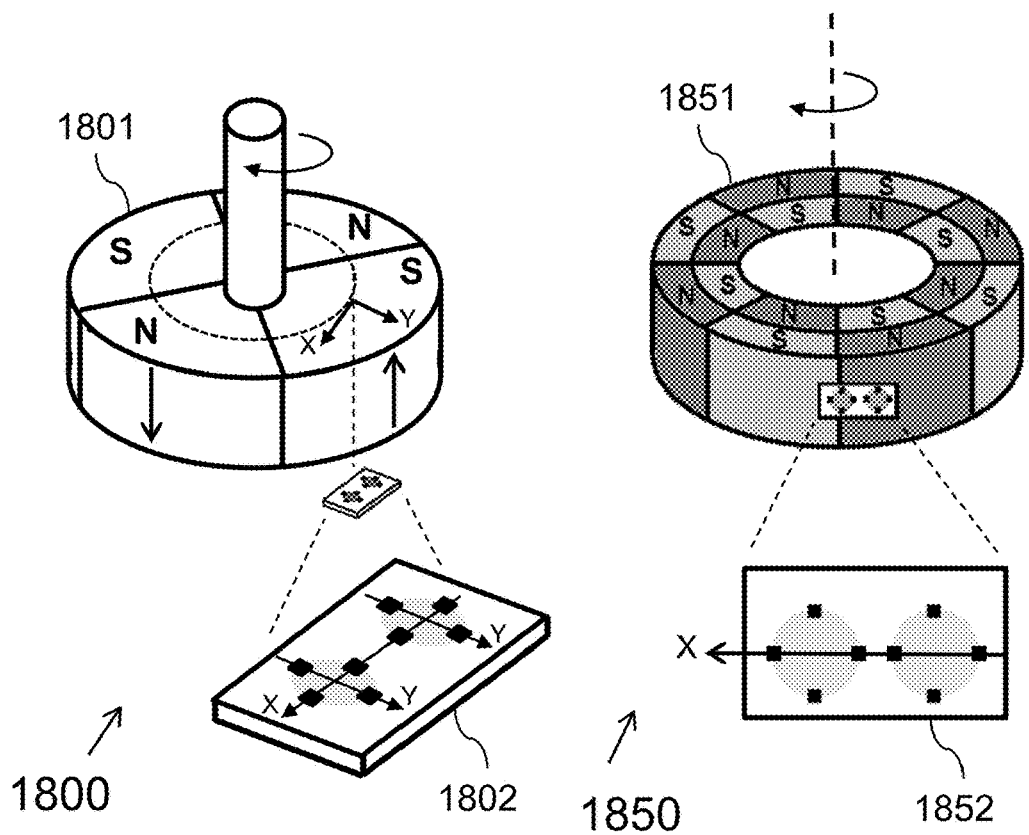
FIG. 18(b)  FIG. 18(c)

POSITION SENSOR DEVICES, METHODS AND SYSTEMS BASED ON MAGNETIC FIELD GRADIENTS

FIELD OF THE INVENTION

The present invention relates in general to the field of magnetic sensor systems, devices and methods. The present invention relates in particular to systems, devices and methods of determining a position based on the measurement of two magnetic field gradients.

BACKGROUND OF THE INVENTION

Devices for measuring a magnetic field strength are known in the art. They often contain one or more Hall elements or magneto resistive elements. Magnetic sensors are typically used in current sensors, distance sensors, proximity sensors, proximity switches, linear or angular position sensors, etc. while magnetic sensing offers several advantages, such as non-contact measurement, less mechanical wear, accuracy of these devices is limited in the presence of an external disturbance field.

In recent years, it was found that the influence of an external disturbance field can be largely reduced by measuring a magnetic field gradient, and by calculating the current or distance or position from the magnetic field gradient signal, rather than from the magnetic field component value itself.

Magnetic position sensor systems in which a position is determined based on two orthogonal magnetic field component values, are also known in the art.

There is always room for improvements or alternatives.

SUMMARY OF THE INVENTION

It is an object of embodiments of the present invention to provide a magnetic position sensor system and/or a magnetic position sensor device and/or a method of determining a linear or angular position based on at least two magnetic field gradients.

It is an object of embodiments of the present invention to provide a magnetic position sensor system and/or a magnetic position sensor device and/or a method, wherein the gradients are measured more accurately.

It is an object of embodiments of the present invention to provide a magnetic position sensor system and/or a magnetic position sensor device and/or a method of measuring said at least two gradients with an improved signal-to-noise ratio (SNR).

It is an object of embodiments of the present invention to provide a magnetic position sensor system and/or a magnetic position sensor device and/or a method of determining a linear or angular position more accurately, despite temperature variations and or stress variations over the sensor device.

It is an object of embodiments of the present invention to provide a magnetic position sensor system and/or a magnetic position sensor device and/or a method of determining a linear or angular position more accurately, despite temperature variations and or stress variations over the sensor device, in a simple manner (e.g. without having to solve a set of equations).

It is an object of particular embodiments of the present invention to provide an angular position sensor system comprising a magnet which is rotatable about a virtual axis, and a position sensor device, wherein the position sensor device is mounted substantially on said virtual axis (also known as an "on-axis position).

It is an object of particular embodiments of the present invention to provide an angular position sensor system comprising a magnet which is rotatable about an axis, and a position sensor device, wherein the position sensor device is mounted substantially offset from said axis (also known as an "off-axis position).

It is an object of particular embodiments of the present invention to provide such a position sensor system, wherein the magnet has a shape with an outer radius about said axis, and wherein the position sensor device is mounted at a distance (Rs) from said rotation axis of at least 20% of said outer radius, or at least 30%, or at least 40%, or at least 50%, or at least 60%, or at least 70%, or at least 80%, or at least 100%, or at least 105% of said outer radius.

According to a first aspect, the present invention provides a method of determining a linear or angular position of a magnetic sensor device relative to a magnetic source, or vice versa; the magnetic sensor device comprising: a first, a second, a third and a fourth magnetic sensor element; a first, second, third and fourth biasing source for biasing said sensor elements; a first, second, third and fourth amplifier for amplifying a signal originating from said sensor elements; at least one analog-to-digital converter for digitizing signals originating from said amplifiers; one or both of a temperature sensor and a differential stress measurements circuit; a digital processing circuit connected downstream of the analog-to-digital convertor; the method comprising the steps of: obtaining one or both of a temperature value (T) and a differential stress value ($\Delta\Sigma$); a) determining a first magnetic field gradient based on signals obtained from the first and the third magnetic sensor element; b) determining a second magnetic field gradient based on signals obtained from the second and the fourth magnetic sensor element; c) calculating a ratio of the first and the second magnetic field gradient; d) determining said linear or angular position based on said ratio; wherein step a) comprises: adjusting the third biasing source and/or adjusting a signal path comprising the third amplifier using a first predefined function (e.g. f3) of temperature and/or differential stress, to match a signal path containing the third sensor element to a signal path containing the first sensor element; and wherein step b) comprises: adjusting the fourth biasing source and/or adjusting a signal path comprising the fourth amplifier using a second predefined function (e.g. f4) of temperature and/or differential stress, different from the first predefined function (f3), to match a signal path containing the fourth sensor element to a signal path containing the second sensor element; and wherein step d) further comprises: determining said linear or angular position based on said ratio, optionally taking into account a predefined factor K or a predefined function K of temperature.

It is a major advantage of this method that the gradients or differences determined in step a) and b) are determined with an improved accuracy, more in particular, by matching the signal paths of the two sensor elements involved in determining the first and second gradient, and by matching the two pairs of signal paths related to the two gradients independently. Matching the signals within each pair decreases the influence of a strayfield. Matching each pair individually, e.g. by improving or maximizing the signal-to-noise ratio (SNR) of each path individually, also increasing the accuracy of the ratio, and thus the accuracy of the resulting position. It is an insight of the present invention that the four sensor paths do not need to be matched, because that would mean that the sensitivity of each signal path would need to be decreased to the lowest sensitivity of the four sensor elements. The mismatch which is (or may be) introduced by not matching the sensor pairs to the same level, is or may be subsequently taken into account by using a factor K or a function K.

Said "adjusting the third biasing source and/or adjusting a signal path comprising the third amplifier" may comprise: adjusting the third current source, and/or adjusting a third amplifier gain in the analog domain, and/or correcting the digitized and amplified third sensor signal with a correction factor in the digital domain.

Said "adjusting the fourth biasing source and/or adjusting a signal path comprising the fourth amplifier" may comprise: adjusting the fourth current source, and/or adjusting a fourth amplifier gain in the analog domain, and/or correcting the digitized and amplified fourth sensor signal with a correction factor in the digital domain.

The position may be a linear position, or an angular position, or a position along a predefined curved trajectory which is neither linear nor circular.

Step d) may comprise determining a linear or angular position, based on an arc tangent function of said ratio. This can be implemented for example using a predefined conversion table stored in a non-volatile memory of the sensor device, optionally with linear interpolation.

The first and second predefined function (e.g. f3 and f4) may be the same function, but preferably are different functions.

In an embodiment, the position of the temperature sensor, if present, is different from the first sensor location, and is different from the second sensor location.

In an embodiment, the position of the temperature sensor, if present, is located substantially in the middle between the first and second magnetic sensor.

In an embodiment, the predefined functions f(T) are dependent on the measured temperature T, but not on differential stress. In this embodiment a differential stress sensor circuit can be omitted.

In an embodiment, the predefined functions f(ΔΣ) are dependent on differential stress, but not on the measured temperature. In this embodiment a temperature sensor may be omitted.

In an embodiment, the predefined functions f(T,ΔΣ) are dependent both on temperature and on differential stress.

In an embodiments, the predefined functions are determined during a calibration test, or are determined during the qualification or calibration procedure of a relatively large number (e.g. at least 200 or at least 500) of magnetic devices.

In an embodiment, one or more steps, e.g. the step of "adjusting", is performed by a programmable controller, e.g. a microcontroller or a DSP, comprising or connected to a non-volatile memory storing one or more coefficients or values or parameters of the predefined function (f(T); f(T, Δσ); f(Δσ)), by applying a control signal to an adjustable biasing source (e.g. a current source or a voltage source), or to an adjustable amplifier.

In an embodiment, the magnetic field gradient is determined by subtracting two magnetic field component values in an analog or digital subtraction unit, and the first predefined function (e.g. f3) is chosen such that, during operation in a predefined temperature range (e.g. from −40° C. to +160° C., or from −20° C. to +120° C.), a product of a magnetic sensitivity of the first magnetic sensor (e.g. H1) and a first overall gain of a first signal path from an output of the first magnetic sensor to said analog or digital subtraction unit is substantially equal to a product of a magnetic sensitivity of the second magnetic sensor and a second overall gain of a second signal path from an output of the second magnetic sensor to said analog or digital subtraction unit; and wherein the second predefined function (e.g. f4) is chosen such that, during operation in a predefined temperature range (e.g. from −40° C. to +160° C., or from −20° C. to +120° C.), a product of a magnetic sensitivity of the third magnetic sensor and a third overall gain of a third signal path from an output of the third magnetic sensor to said analog or digital subtraction unit is substantially equal to a product of a magnetic sensitivity of the fourth magnetic sensor and a fourth overall gain of a fourth signal path from an output of the fourth magnetic sensor to said analog or digital subtraction unit.

Or expressed mathematically, the predefined function f3 is chosen such that $S1*OG1=S2*OG2$, where S1 is the magnetic sensitivity in [Volt/Tesla] of the first magnetic sensor (when biased by the first biasing source), S2 is the magnetic sensitivity of the second magnetic sensor (when biased by the second biasing source), OG1 is the overall gain of said first signal path starting at the output of the first magnetic sensor and passing through the first amplifier, and OG2 is the overall gain of said second signal path starting at the output of the second magnetic sensor and passing through the second amplifier.

As will be explained further, the product $S1*OG1=S2*OG2$ can be made equal in different ways, for example by adjusting a biasing signal (see e.g. FIG. 3(b) and FIG. 3(c)), by adjusting an amplifier gain (see e.g. FIG. 3(d) and FIG. 3(e)), or by correcting a value in the digital domain (see e.g. FIG. 3(f)).

This can also be expressed as: $S1 \cdot A1 \cdot D1 = S2 \cdot A2 \cdot D2$ wherein A1, A2 is the amplification of the first, second signal path in the analog domain, and D1, D2 is the amplification of the first, second signal path in the digital domain.

Similarly, f4 is chosen such that $S3*OG3=S4*OG4$.

The predefined correction function f(.) can for example be stored in the form of a look-up table, or represented by a piece-wise-linear function, or by a first order polynomial in one variable (Temperature or differential stress) or two variables (Temperature and/or differential stress), or by a second order polynomial in one or two variables (Temperature and/or differential stress), or by a third order polynomial in one or two variables (Temperature and/or differential stress), or by a polynomial having an order of at least four.

The values or coefficients or parameters can for example be determined during a calibration procedure of each individual device, or by simulation, or by qualifying a number of test-samples (e.g. at least 50, or at least 100, or at least 500), e.g. as a value that needs to be applied to the DAC of the processor, such that, when a constant magnetic field is applied, the gradient being determined is substantially zero, e.g. within a certain tolerance margin of e.g. +/−1%, or +/−0.5%, or +/−1 least significant bit of the DAC).

In an embodiment, step a) comprises: determining a first magnetic field gradient (e.g. dBx/dx) of a first magnetic field component (e.g. Bx) oriented in a first direction along said first direction; and wherein step b) comprises: determining a second magnetic field gradient (e.g. dBz/dx or dBy/dx) of a second magnetic field component (e.g. Bz or By) oriented in a second direction substantially perpendicular to the first direction, along said first direction.

Or stated in simple words, this method is directed to position sensing using two orthogonal gradients along a single direction (e.g. dBx/dx and dBz/dx). FIG. 14(a) to FIG. 15(c) show examples of magnetic position sensor systems using this method.

In an embodiment, step a) comprises: determining a first magnetic field gradient (e.g. dBz/dx) of a magnetic field component (e.g. Bz) oriented in a first direction (e.g. Z) along a second direction (e.g. X) substantially perpendicular to the first direction; and wherein step b) comprises: determining a second magnetic field gradient (e.g. dBz/dy) of said magnetic field component (e.g. Bz) oriented in said first direction along a third direction (e.g. Y) substantially perpendicular to the first direction and substantially perpendicular to said second direction.

Or stated in simple words, this method is directed to position sensing using two gradients (e.g. dBz/dx and dBz/dy) of a single component (e.g. Bz) along two orthogonal directions (e.g. X, Y). FIG. 12(a) to FIG. 13(c) show examples of magnetic position sensor systems using this method.

According to a second aspect, the present invention also provides a method of determining a linear or angular position of a magnetic sensor device relative to a magnetic source, or vice versa; the magnetic sensor device comprising: a first, a second, a third and a fourth magnetic sensor element; a first, second, third and fourth biasing source for biasing said sensor elements; a first, second, third and fourth amplifier for amplifying a signal originating from said sensor elements; at least one analog-to-digital converter for digitizing signals originating from said amplifiers; one or both of a temperature sensor and a differential stress measurements circuit; a digital processing circuit connected downstream of the analog-to-digital convertor; the method comprising the steps of: obtaining one or both of a temperature value (T) and a differential stress value ($\Delta\Sigma$); a) determining a first magnetic field gradient (e.g. dBx/dx) based on a first mathematical combination (e.g. a difference of two differences) of signals obtained from said magnetic sensor elements; b) determining a second magnetic field gradient (e.g. dBz/dx) based on a second mathematical combination (e.g. a difference of two sums) of signals obtained from said magnetic sensor elements; c) calculating a ratio of the first and the second magnetic field gradient; d) determining said linear or angular position based on said ratio; wherein: step a) comprises: adjusting the biasing source and/or the signal path containing the third and the fourth amplifier using a first predefined function (f3) or a first set of control functions of temperature and/or differential stress, to match the signal paths of the magnetic sensor elements when performing the first mathematical combination (or stated in other words: such that a first mathematical combination of the signals obtained from the third and fourth sensor matches the first mathematical combination of the signals obtained from the first and second sensor); and wherein step b) comprises: adjusting the biasing source and/or the signal path containing the third and the fourth amplifier using a second predefined function (f4) or a second set of control functions of temperature and/or differential stress, to match the signal paths of the magnetic sensor elements when performing the second mathematical combination (or stated in other words: such that a second mathematical combination of the signals obtained from the third and fourth sensor matches the second mathematical combination of the signals obtained from the first and second sensor), the second predefined function (f4) or the second set of predefined functions being different from the first predefined function (f3) or the first set of predefined functions; and wherein step d) further comprises: determining said linear or angular position based on said ratio, optionally taking into account a predefined factor K or a predefined function K(T) of temperature.

In this embodiment, the matching of certain magnetic sensor elements is done depending on how the sensor signal will be used. More specifically, a sensor element may be biased differently when its signal is being used for measuring a Bx component (e.g. when this sensor signal is subtracted from another sensor signal) or when its signal is being used for measuring a Bz component (e.g. when this sensor signal is summed with another signal). Examples of this embodiment are shown in FIG. 16(a) to FIG. 17(c). This method is particularly suitable for a sensor device having two IMC structures and horizontal Hall elements, where Bx is proportional to a difference of the signals provided by two Hall elements, and Bz is proportional to the sum of the signals provided by the same two Hall elements.

In an embodiment (according to the first or second aspect), step a) comprises: determining an analog difference signal (e.g. $\Delta v$) between a first signal (e.g. A_v1) obtained by: biasing the first magnetic sensor, and amplifying the first sensor signal, and a second signal (e.g. A_v2corr) obtained by: biasing the second magnetic sensor, and amplifying the second sensor signal, the difference being taken after measuring a temperature and/or a differential stress and adjusting the second biasing source or the second amplifier using a predefined function of the measured temperature and/or differential stress; and digitizing the analog difference signal to obtain the first gradient.

A similar technique can be applied in step b) of claim 1 for the second gradient. Stated in simple terms, in this method, the second biasing source and/or amplifier is adjusted, and the amplified sensor signals are subtracted in the analog domain, which yields an improved SNR, because the entire DAC-range can be used for the amplitude of the gradient, rather than the magnetic components from which the gradient is derived. A similar technique can be applied in step b) of claim 1. Examples of this technique are shown in FIG. 3(c), FIG. 4(c), FIG. 5(c) (adjusted current source), and in FIG. 3(e), FIG. 4(e), FIG. 5(e) (adjusted amplifier gain), etc.

In an embodiment (according to the first or second aspect), step a) comprises: determining a digital difference value (e.g. $\Delta V$) between a first digital value (e.g. A_V1) obtained by: biasing the first magnetic sensor and amplifying the first sensor signal, and digitizing this amplified signal; and a second digital value (e.g. A_V2) obtained by: biasing the second magnetic sensor, and amplifying the second sensor signal, and digitizing this amplified signal, after measuring a temperature and/or a differential stress, and adjusting the second biasing source or the second amplifier using a predefined function of the measured temperature and/or differential stress.

A similar technique can be applied in step b) of claim 1 for the second gradient. Stated in simple terms, in this method, the second biasing source and/or amplifier is adjusted, and the amplified and digitized sensor signals are subtracted in the digital domain. Examples of this technique are shown in FIG. 3(b), FIG. 4(b), FIG. 5(b) (adjusted current source), and in FIG. 3(d), FIG. 4(d), FIG. 5(d) (adjusted amplifier gain), etc.

In an embodiment (according to the first or second aspect), step a) comprises: determining a digital difference value (e.g. $\Delta V$) between a first digital value (e.g. A_V1) obtained by: biasing the first magnetic sensor and amplifying the first sensor signal, and digitizing this amplified signal; and a second digital value (e.g. A_V2) obtained by: biasing the second magnetic sensor and amplifying the second sensor signal, and digitizing this amplified signal, and adjusting this digitized value by multiplication with a correction factor using a predefined function of the measured temperature and/or differential stress.

A similar technique can be applied in step b) of claim 1 for the second gradient. Examples of this technique are shown in FIG. 3(f), FIG. 4(f) and FIG. 5(f), etc.

In an embodiment (according to the first or second aspect), the predefined function for adjusting the biasing source and/or the amplifier gain and/or for correcting the second digitized value, is a function of only temperature;

In an embodiment (according to the first or second aspect), the predefined function for adjusting the biasing source and/or the amplifier gain and/or for correcting the second digitized value, is a function of temperature and differential stress.

In an embodiment (according to the first or second aspect), the predefined function for adjusting the biasing source and/or the amplifier gain and/or for correcting the second digitized value, is a function of only differential stress.

The present invention also provides a magnetic position sensor device configured for performing a method according to the first aspect or the second aspect.

According to a third aspect, the present invention provides a magnetic position sensor device comprises a semiconductor substrate comprising: at least a first magnetic sensor located at a first sensor location, and a second magnetic sensor located at a second sensor location, spaced apart from the first sensor location; at least a first biasing source for biasing the first magnetic sensor, and a second biasing source for biasing the second magnetic sensor; at least a first amplifier for amplifying a signal obtained from the first magnetic sensor, and a second amplifier for amplifying a signal obtained from the second magnetic sensor; at least a third magnetic sensor, and optionally a fourth magnetic sensor; at least a third biasing source for biasing the third magnetic sensor, and optionally a fourth biasing source for biasing the fourth magnetic sensor; at least a third amplifier for amplifying a signal obtained from the third magnetic sensor, and optionally a fourth amplifier for amplifying a signal obtained from the fourth magnetic sensor; a temperature sensor located at a predefined position on the substrate; at least one differential stress sensing circuit configured for determining at least one stress difference between two of said magnetic sensors; at least one analog-to-digital-converter connected downstream of said amplifiers; a digital processing circuit connected downstream of the analog-to-digital-converter; a non-volatile memory operatively connected to the digital processing circuit, configured for storing one or more values or parameters of said predefined function; wherein the digital processing circuit is configured for performing a method according to the first aspect or according to the second aspect.

In FIGS. 12(a) to 12(e) and FIGS. 13(a) to 13(c), the position sensor devices has four magnetic sensor elements located at four different locations, e.g. on a virtual circle. In this case, preferably two differential stresses are determined, one for the X-direction, one for the Y-direction.

In FIGS. 14(a) to 14(e) and FIGS. 17(a) to 17(c), the position sensor devices has four magnetic sensor elements located at two different locations. In this case, preferably only one differential stress is determined.

In FIGS. 18(a) to 18(g) and FIGS. 19(a) to 19(d), the position sensor devices has eight magnetic sensor elements located at two different locations. In this case, preferably only one differential stress is determined.

The magnetic position sensor device may further comprise a third magnetic sensor, and a third biasing source, and a third amplifier.

The magnetic position sensor device may further comprise a fourth magnetic sensor, and a fourth biasing source, and a fourth amplifier.

The digital processing circuit may comprise a digital processor (e.g. a μC or DSP) comprising or connected to said non-volatile memory, and a digital-to-analog convertor or a PWM-generator followed by a Low-Pass-Filter. The DAC or PWM generator may be comprised in said digital processor.

The temperature sensor, if present, may be located at any arbitrary position on said semiconductor substrate, which may be different from any of the sensor locations, for example substantially halfway between the first and second sensor location. The temperature sensor is configured for measuring a temperature of the substrate.

The differential stress measurements circuit(s), if present, may be configured for determining a differential mechanical stress between the first sensor location and the second sensor location and for providing a differential stress signal.

The at least one analog-to-digital converter may be configured for digitizing the first sensor signal or a signal derived therefrom, and/or for digitizing the second sensor signal or a signal derived therefrom, and/or for digitising said temperature signal to obtain a digital temperature value, and/or for digitizing said differential stress signal to obtain a differential stress value.

The digital processor may be configured for obtaining one or both of said temperature value and said differential stress value, and for adjusting at least one of a biasing source, an amplifier gain, and a digital value of an amplified sensor signal, based on a predefined function of the temperature value and/or the differential stress value.

In an embodiment (e.g. as illustrated in FIG. 3(b), FIG. 3(d), or derived therefrom), the digital processing circuit is configured for determining the first gradient by adjusting the second biasing signal or by adjusting the second amplifier gain using a predefined correction function of the measured temperature; and by digitizing the first amplified signal to obtain a first digital value and by digitizing the second amplified signal to obtain a second digital value; and by calculating a difference (in the digital domain) between the second digital value and the first digital value. The second gradient can be determined in a similar manner.

In an embodiment (e.g. as illustrated in FIG. 3(b), FIG. 3(d), or derived therefrom), the digital processing circuit is configured for determining the gradient by adjusting the second biasing signal or by adjusting the second amplifier gain using a predefined correction function of the measured temperature; and by generating a difference signal (in the analog domain) between the first amplified sensor signal and the second amplified sensor signal; and by digitizing the difference signal thereby obtaining the first gradient. The second gradient can be determined in a similar manner.

In an embodiment (e.g. as illustrated in FIG. 3(b), FIG. 3(d), or derived therefrom), the digital processing circuit is configured for determining the first gradient by amplifying and digitizing the first sensor signal to obtain a first digital value, and amplifying and digitizing the second sensor signal to obtain a second digital value, and multiplying the second digital value using a predefined correction function of the measured temperature thereby obtaining a corrected second digital value, and calculating a difference (in the digital domain) between the first digital value and the corrected second digital value thereby obtaining the first gradient. The second gradient can be determined in a similar manner.

In an embodiment (e.g. as illustrated in FIG. 3(b), or based on FIG. 3(b)), the first biasing source is a first current source configured for providing a first predefined current signal, and the second biasing source is an adjustable current source configured for providing an adjustable second current signal; and the first amplifier is configured for amplifying with a first predefined gain, and the second amplifier is configured for amplifying with a second predefined gain; and the first digital value is obtained by biasing the first magnetic sensor with the first current signal, and by amplifying the first sensor signal with the first predefined gain, and by digitizing this amplified signal; and the second digital value is obtained by biasing the second magnetic sensor with the second current signal, and by amplifying the second sensor signal with the second predefined gain, and by digitizing this amplified signal; and the first gradient is calculated by subtracting the first digital value and the second digital value; and the second current signal is adjusted using said predefined correction function. The sensor device may have similar provisions for determining the second gradient. The second amplifier gain may be substantially equal to the first amplifier gain, or may be unintentionally slightly different from the first gain. It is an advantage that the adjusted current can also compensate for any gain mismatch of the amplifiers. The gradient may be optionally multiplied by a predefined factor.

In an embodiment, the second current signal is adjusted by applying a voltage defined by said predefined correction function, to the gate of a transistor of the second current source. This offers the advantage that the correction function can be easily determined by performing a calibration measurement during production, and that the device can use the same function during actual use.

In an embodiment (e.g. as illustrated in FIG. 3(c), or based on FIG. 3(c)), the first biasing source is a first current source configured for providing a first predefined current signal, and the second biasing source is an adjustable current source configured for providing an adjustable second current signal; and the first amplifier is configured for amplifying the first sensor signal with a first predefined gain to obtain a first amplified sensor signal, and the second amplifier is configured for amplifying the second sensor signal with a second predefined gain to obtain a second amplified sensor signal; and the magnetic sensor device further comprises an analog subtraction circuit configured for subtracting the first amplified signal and the second amplified sensor signal to obtain an analog difference signal; and the at least one analog-to-digital converter is configured for digitizing said analog difference signal, which is equal to or proportional to the gradient; and the second current signal is adjusted using said predefined correction function. The sensor device may have similar provisions for determining the second gradient. The second amplifier gain may be substantially equal to the first amplifier gain, or may be unintentionally slightly different from the first gain. It is an advantage that the adjusted current can also compensate for any gain mismatch of the amplifiers. The digitized difference value may be optionally multiplied by a predefined factor. It is an advantage of this embodiment that the difference is calculated in the analog domain (typically half the quantization noise). It is a major advantage of this embodiment that the range of the ADC can be completely used for digitizing the gradient signal, in contrast to e.g. the sensor device of FIG. 3(b), where the gradient is only a fraction of the total digital signal. In this way the signal-to-noise ratio (SNR) can be significantly improved.

In an embodiment (e.g. as illustrated in FIG. 3(e), or based on FIG. 3(e)), the first biasing source is a first current source configured for providing a first predefined current signal, and the second biasing source is a second current source configured for providing a second predefined current signal; and the first amplifier is configured for amplifying with a first predefined gain, and the second amplifier is configured for amplifying with an adjustable gain; and the magnetic sensor device further comprises an analog subtraction circuit configured for subtracting the first amplified signal and the second amplified sensor signal to obtain an analog difference signal; and the at least one analog-to-digital converter is configured for digitizing said analog difference signal, which is equal to or proportional to the gradient; and the second gain is adjusted using said predefined correction function. The sensor device may have similar provisions for determining the second gradient. The second current may be substantially equal to the first current, or may be unintentionally slightly different from the first current. It is an advantage that the adjusted gain of the second amplifier can also compensate for any current mismatch of the current sources. The digitized difference value may be optionally multiplied by a predefined factor. It is an advantage of this embodiment that the difference is calculated in the analog domain (typically half the quantization noise). It is a major advantage of this embodiment that the range of the ADC can be completely used for digitizing the gradient signal, in contrast to e.g. the sensor device of FIG. 3(b), where the gradient is only a fraction of the total digital signal. In this way the signal-to-noise ratio (SNR) can be significantly improved.

In an embodiment (e.g. as illustrated in FIG. 3(d), or based on FIG. 3(d)), the first biasing source is a first current source configured for providing a first predefined current signal, and the second biasing source is a second current source configured for providing a second predefined current signal; and the first amplifier is configured for amplifying with a first predefined gain, and the second amplifier is configured for amplifying with an adjustable gain; and the first digital value is obtained by biasing the first magnetic sensor with the first current signal, and by amplifying the first sensor signal with the first predefined gain, and by digitizing this amplified signal; and the second digital value is obtained by biasing the second magnetic sensor with the second current signal, and by amplifying the second sensor signal with the second gain, and by digitizing this amplified signal; and the second gain is adjusted using said predefined correction function. The sensor device may have similar provisions for determining the second gradient. The second current may be substantially equal to the first current, or may be unintentionally be slightly different from the first current. It is an advantage that the adjusted gain of the second amplifier can also compensate for any current mismatch of the current sources.

In an embodiment (e.g. as illustrated in FIG. 3(f), or based on FIG. 3(f)), the first biasing source is a first current source configured for providing a first predefined current signal, and the second biasing source is a second current source configured for providing a second predefined current signal; and the first amplifier is configured for amplifying with a first predefined gain, and the second amplifier is configured for amplifying with a second predefined gain; and the at least one digital-to-analog converter is configured for digitizing the first amplified sensor signal to provide a first digital value, and for digitizing the second amplified sensor signal to provide a second digital value; and the digital processing circuit is configured for multiplying the second digital value with a digital correction factor using said predefined correction function to provide a corrected second digital signal; and the digital processing circuit is further configured for determining a difference between the corrected second digital signal and the first digital value to obtain the gradient. The sensor device may have similar provisions for determining the second gradient. The second predefined current may be substantially equal to the first predefined current, but that is not absolutely required. Likewise, the second amplifier gain may be substantially equal to the first amplifier gain, but that is not absolutely required.

The magnetic position sensor device is preferably a packaged integrated semiconductor device, commonly known as "chip".

In an embodiment, the magnetic position sensor device comprises four horizontal Hall elements (without IMC), arranged on an imaginary circle, and angularly spaced by 90°, e.g. as shown in FIG. 12(a) or FIG. 13(a).

In an embodiment, the magnetic position sensor device comprises two magnetic sensors spaced apart along an axis, each magnetic sensor comprising a horizontal Hall element and a vertical Hall element. The vertical Hall elements are oriented in a single direction, e.g. as shown in FIG. 14(a) or FIG. 15(a).

In an embodiment, the magnetic position sensor device comprises two magnetic sensors spaced apart along an axis, each magnetic sensor comprising an integrated magnetic concentrator (IMC) and two horizontal Hall elements located on opposite sides of the IMC. The four horizontal Hall elements are located on said axis, e.g. as shown in FIG. 16(a) or FIG. 17(a).

In an embodiment, the magnetic position sensor device comprises two magnetic sensors spaced apart along an axis, each magnetic sensor comprising an integrated magnetic concentrator (IMC) and four horizontal Hall elements located at a periphery of the IMC. Four horizontal Hall elements are located on said axis, e.g. as shown in FIG. 18(a) or FIG. 19(a).

According to a fourth aspect, the present invention provides a magnetic position sensor system comprising a magnet or a magnet structure, and a magnetic position sensor device movable relative to the magnet or magnetic structure, and configured for performing a method according to the first or the second aspect.

In an embodiment, the magnetic position sensor system comprises: a two-pole ring or disk magnet rotatable about an axis; and a magnetic position sensor device movably arranged relative to said said magnet, and comprising four horizontal Hall elements arranged on an imaginary circle, and angularly spaced apart by 90°, and four biasing sources, and four amplifiers; and wherein the the magnetic sensor device further comprises: at least one analog-to-digital convertor, and a temperature sensor and two differential stress sensors; and a digital processing circuit comprising a non-volatile memory; and wherein the magnetic sensor device is configured for performing a method according to the first or second aspect.

In a variant, the system comprises a multi-pole ring or disk magnet having at least four poles, and the four horizontal Hall elements are angularly spaced by an angle smaller than 90°, for example by 9072=45° for a four-pole magnet, or by 90°/3=30° for a six-pole magnet, etc.

In an embodiment, the magnetic position sensor system comprises: a magnetic structure having at least four poles; and a magnetic position sensor device movably arranged at a distance from said magnetic structure, and comprising two magnetic sensors spaced apart from each other, wherein each magnetic sensor comprises a horizontal Hall element and a vertical Hall element, and four biasing sources, and four amplifiers; and wherein the magnetic sensor device further comprises: at least one analog-to-digital convertor, and a temperature sensor and two differential stress sensors; and a digital processing circuit comprising a non-volatile memory; and wherein the magnetic sensor device is configured for performing a method according to the first or second aspect.

The magnetic structure may be a four-pole ring magnet, or a four-pole disk magnet, or a ring or disk magnet having more than four poles, or a linear magnetic structure having a plurality of alternating poles.

In an embodiment, the magnetic position sensor system comprises: a magnetic structure having at least four poles; and a magnetic position sensor device movably arranged arranged relative to said magnetic structure, and comprising two magnetic sensors spaced apart from each other; wherein each magnetic sensor comprises an integrated magnetic concentrator and two horizontal Hall elements located on opposite sides of the corresponding integrated magnetic concentrator, and two biasing sources, and two amplifiers; and wherein the magnetic sensor device further comprises: at least one analog-to-digital convertor, and a temperature sensor and two differential stress sensors, and a digital processing circuit comprising a non-volatile memory; and wherein the magnetic sensor device is configured for performing a method according to the first or second aspect.

In an embodiment, the magnetic position sensor system comprises: a magnetic structure having at least four poles; and a magnetic position sensor device movably arranged relative to said magnetic structure, and comprising two magnetic sensors spaced apart from each other; wherein each magnetic sensor comprises an integrated magnetic concentrator and four horizontal Hall elements arranged at a periphery of the integrated magnetic concentrator, and four biasing sources, and four amplifiers; and wherein the magnetic sensor further comprises: at least one analog-to-digital convertor, and a temperature sensor and two differential stress sensors, and a digital processing circuit comprising a non-volatile memory; and wherein the magnetic sensor device is configured for performing a method according to the first or second aspect.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

BRIEF DESCRIPTION OF THE DRAWINGS

FIG. 10 shows a flow-chart illustrating a method of determining a position (e.g. linear position or angular position) relative to a magnetic source, e.g. relative to a permanent magnet, based on two magnetic field gradients or two magnetic field differences, according to embodiments of the present invention.

FIG. 11(a) shows a flow-chart of another method of determining a position (e.g. linear position or angular position) relative to a magnetic source, e.g. relative to a permanent magnet, based on two magnetic field gradients or two magnetic field differences, according to embodiments of the present invention.

FIG. 11(b) shows a more detailed version of the method of FIG. 11(a), for the case where the position is determined using gradients of two orthogonal magnetic field components (e.g. Bx, Bz), along a single direction (e.g. along X).

FIG. 11(c) shows a more detailed version of the method of FIG. 11(b), for the case where the position is determined using gradients of a single magnetic field component (e.g. Bz), along two orthogonal directions (e.g. along X and Y).

FIG. 12(a) shows a variant of the sensor arrangement of FIG. 3(a) comprising four sensors located at four different sensor locations, which are sensitive in the same direction (here: Z), for measuring two magnetic field gradients (here: dBz/dx and dBz/dy) of a magnetic field component (here: Bz) along two orthogonal directions (here: X,Y).

FIG. 12(b) shows an angular position sensor system comprising a two-pole magnet and a sensor device having a sensor arrangement as shown in FIG. 12(a).

As shown in FIG. 12(c), the four sensors forming two pairs, and each pair is individually matched to increase, e.g. maximize the SNR of each pair.

FIG. 13(a) shows a variant of the sensor arrangement of FIG. 12(a), further comprising four stress sensors, one at or near each sensor location.

FIG. 13(b) shows a variant of the circuit of FIG. 12(c), according to an embodiment of the present invention, further comprising four stress sensors, in which two adjustable current sources are controlled as a function of a single temperature and differential stress.

FIG. 14(a) shows a variant of the sensor arrangement of FIG. 3(a) comprising four sensor elements located at two sensor locations, for measuring gradients of two orthogonal magnetic field components (here: Bx and Bz) along a single direction (here: X).

FIG. 14(b) shows an exemplary angular position sensor system comprising a four-pole magnet and a sensor device having a sensor arrangement as shown in FIG. 14(a), located offset from the rotation axis ("off-axis").

FIG. 14(c) shows an exemplary linear position sensor system comprising a linear magnetic structure with a plurality of alternating poles, and a sensor device having a sensor arrangement as shown in FIG. 14(a).

FIG. 16(a) shows a variant of the sensor arrangement of FIG. 3(a) comprising four sensor elements located at two sensor locations (X1, X2), configured for measuring gradients of two orthogonal magnetic field components (here: Bx and Bz) along a single direction (here: X).

FIG. 16(b) shows an exemplary angular position sensor system comprising a four-pole magnet and a sensor device having a sensor arrangement as shown in FIG. 16(a), located offset from the rotation axis ("off-axis").

FIG. 16(c) shows an exemplary linear position sensor system comprising a linear magnetic structure with a plurality of alternating poles, and a sensor device having a sensor arrangement as shown in FIG. 16(a).

FIG. 18(a) shows a variant of the sensor arrangement of FIG. 3(a) comprising two integrated magnetic concentrators, and four horizontal Hall elements located at the periphery of each IMC, for measuring gradients (here: dBx/dx and dBz/dx) of two orthogonal magnetic field components (here: Bx and Bz) along the X-axis.

FIG. 18(b) shows an exemplary angular position sensor system comprising an axially magnetized four-pole magnet and a sensor device having a sensor arrangement as shown in FIG. 18(a), located offset from the rotation axis ("off-axis").

FIG. 18(c) shows an exemplary angular position sensor system comprising a radially magnetized eight-pole magnet, and a sensor device having a sensor arrangement as shown in FIG. 18(a), located outside the magnet ("at or near the equator")

Figure 1A:
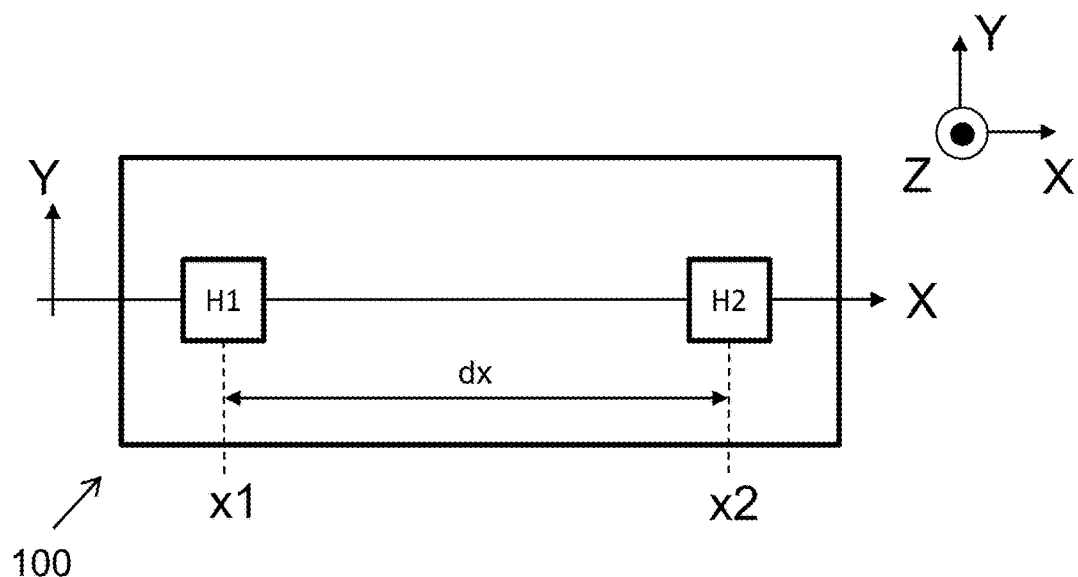
FIG. 1(a) shows an illustrative sensor arrangement for measuring a magnetic field gradient, known in the art.

The drawings are only schematic and are non-limiting. In the drawings, the size of some of the elements may be exaggerated and not drawn on scale for illustrative purposes.

Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document the reference "T" is used to indicate both a temperature sensor, as well as a temperature signal obtained therefrom. Sometimes a lowercase letter "t" is used to indicate an analog temperature signal, and an uppercase letter "T" is used to indicate a digital temperature signal, but this distinction is not always made. It shall be clear from the context which meaning is intended.

In this document the reference "$\sigma1$" is typically used to indicate the first stress signal, indicative of mechanical stress exerted upon by the first magnetic sensor. Likewise, the reference "$\sigma2$" is typically used to indicate the second stress signal, indicative of mechanical stress exerted upon the second magnetic sensor. The reference "$\Delta\sigma$" is typically used to indicate the analog difference between $\sigma1$ and $\sigma2$, and the reference "$\Delta\Sigma$" is typically used to indicate the digital value corresponding with this analog difference signal.

In this document the reference "I1" is used to indicate both a first current source, as well as a first current signal. It shall be clear from the context which meaning is intended.

In this document the reference "A1" is used to indicate both a first amplifier, as well as a first amplifier gain. It shall be clear from the context which meaning is intended.

In this document the reference "S1" is used to indicate either the first magnetic sensitivity, or the first stress sensor. It shall be clear from the context which meaning is intended.

In this document, the notation "f(.)" or "f( )" is used to indicate a function without explicitly specifying the arguments of that function. It can for example be a function f(T) of a single measured temperature value, or a function f(T,$\Delta\Sigma$) of a single temperature and of differential stress, or a function f($\Delta\Sigma$) of differential stress, where T is a measured temperature, $\Delta\Sigma$ is differential stress.

Where in the present invention reference is made to a "current source", what is meant is a component or circuit capable of providing a current to a node, substantially independent on the voltage of that node. Typically a current source has a relatively large output impedance, e.g. at least 1 K Ohm, or at least 10 K Ohm.

In this document, the expressions "stress difference signal" and "differential stress signal" are used as synonyms.

In this document, the term arctan function or atan 2 function refer to an arctangent function. The reader not familiar with the atan 2 function (or "2-argument arctangent" function) may for example refer to https://en.wikipedia.org/wiki/Atan 2 for more information. In the context of the present invention, the formulas arctan(x/y), atan 2(x,y), arccot(y/x) are considered to be equivalent.

In this document, the term "magnetic sensor device" or "sensor device" refers to a device comprising a substrate, preferably a semiconductor substrate, comprising at least two "magnetic sensor elements". The sensor device may be comprised in a package, also called "chip", although that is not absolutely required.

The term "magnetic sensor" or "magnetic sensor structure" or "magnetic sensor arrangement" as used herein may refer to one or more sensor elements capable of measuring one or more magnetic effects, such as the Hall effect, or magneto-resistive (MR) effects. Non-limiting examples for magneto-resistive effects include GMR (giant magnetoresistance), CMR (colossal magnetoresistance), AMR (anisotropic magnetoresistance) or TMR (tunneling magnetoresistance). Depending on the context, the term "magnetic sensor" may refer to a single magnetic sensitive element (e.g. a Horizontal Hall element or a Vertical Hall element), or to a group of magnetic elements (e.g. arranged in a Wheatstone bridge, or arranged adjacent an integrated magnetic concentrator (IMC)), a sub-circuit further comprising one or more of: a biasing circuit, a readout circuit, an amplifier, an Analog-to-Digital converter, etc.

In the present invention, the expression "magnetic sensitivity" refers to the value "S" as used for example in the formula: v=S*B, where v=voltage signal, S=magnetic sensitivity, B=magnetic field strength. The magnetic sensitivity can be expressed in [Volts/Tesla].

In the present invention, the expression "current related magnetic sensitivity" refers to the value "s" as used for example in the formula: v=s*I*B, where v=voltage signal, s=current related magnetic sensitivity, I=current, B=magnetic field strength. The current related magnetic sensitivity can be expressed in [Volts/(Ampere*Tesla)].

Unless mentioned otherwise or clear from the context otherwise, in the present invention, a virtual orthogonal coordinate system with three axes X,Y,Z is attached to the sensor device, where X and Y are parallel to the semiconductor substrate, and the Z-axis is perpendicular to the semiconductor substrate. Furthermore, the X-axis is preferably oriented tangential to the direction of relative movement of the sensor device and the magnetic source. As a consequence, Bx and By are parallel to the substrate, and Bz is perpendicular to the substrate.

In this document, the "functions" f3, f4, etc. may be referred to as "control functions" or as "correction functions". In the present invention, these functions are typically used to adjust a current of an adjustable current source, or to adjust the gain of an adjustable amplifier, or to scale a value in the digital domain.

The present invention relates to systems, devices and methods of determining a position (e.g. a linear position or an angular position) based on two magnetic field differences or gradients (see e.g. FIG. 13(a) to FIG. 19(d)).

FIG. 1(a) shows a sensor arrangement 100 for measuring a magnetic field gradient, known in the art. This sensor arrangement comprises two horizontal Hall elements H1, H2, which are spaced apart over a distance dx along a predefined axis X. The first Hall element H1 is located at position X1 and measures a magnetic field component Bz1 oriented in a direction Z perpendicular to the substrate. The second Hall element H2 is located at position X2 and measures a magnetic field component Bz2 also oriented in the direction Z perpendicular to the substrate.

Figure 1B:
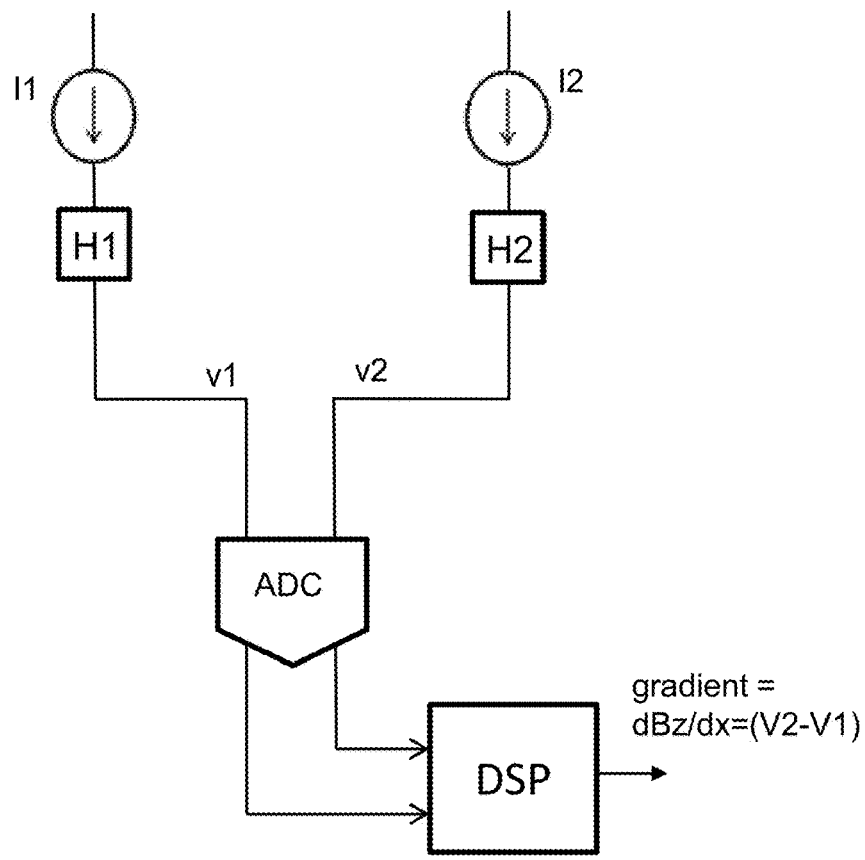
FIG. 1(b) shows a schematic block diagram of a circuit for biasing and read-out of the sensor arrangement of FIG. 1(a), known in the art.

FIG. 1(b) shows a schematic representation of a classical biasing circuit with two current sources, and a readout circuit comprising a digitiser, and a processing circuit.

A magnetic field gradient dBz/dx of the magnetic field component Bz oriented in the Z direction (perpendicular to the semiconductor substrate), along the X direction (parallel to the semiconductor substrate) can be determined as:

$$dBz/dx \sim \Delta Bz=(Bz2-Bz1) \qquad [1]$$

where the symbol ~ means "is proportional to".

One of the main reasons of using a gradient signal instead of individual magnetic field component values is that the gradient signal is highly insensitive to a homogeneous external disturbance field. This advantage is described in other patent documents (e.g. WO98/54547 or WO2014/029885A1), and is being used more and more in the field of magnetic position sensors for industrial or automotive applications, often in combination with a multi-pole (e.g. four-pole or six-pole) ring or disk magnet.

In fact, using a gradient often also helps to reduce the influence of positioning errors, because typically, if one signal increases, the other signal decreases, hence the gradient remains substantially the same. And the same applies to sensitivity mismatch of the sensors: it suffices that the sensitivities of the sensors are more or less the same, because sensitivity mismatch is largely compensated for by calculating a gradient signal. Moreover, in many of these applications, even the absolute value of the gradient is not important, but the value of a ratio of two gradients. This is for example the case in angular or linear position sensors, where the angular position is calculated as an arctangent function of a ratio of two gradients. These sensors are also highly robust against demagnetisation of the magnet, and/or temperature effects.

Over the years, these developments have led those skilled in the niche of gradiometric magnetic sensors to believe that, by measuring a quantity based on a gradient measurement, the result is more accurate because the gradient is insensitive to an external magnetic field, and the developers do not have to worry so much about imperfections of the magnetic source, positioning errors, sensitivity mismatch, temperature variations, etc., because these are intrinsically taken care of by the gradient, and/or by a ratio of two gradients.

The inventors of the present invention have discovered, however, that this reasoning is incorrect if the gradient signal itself is relatively small compared to the stray field. In embodiments of the present invention, strayfield is a field portion common to both the first and the second sensor.

Figure 2:
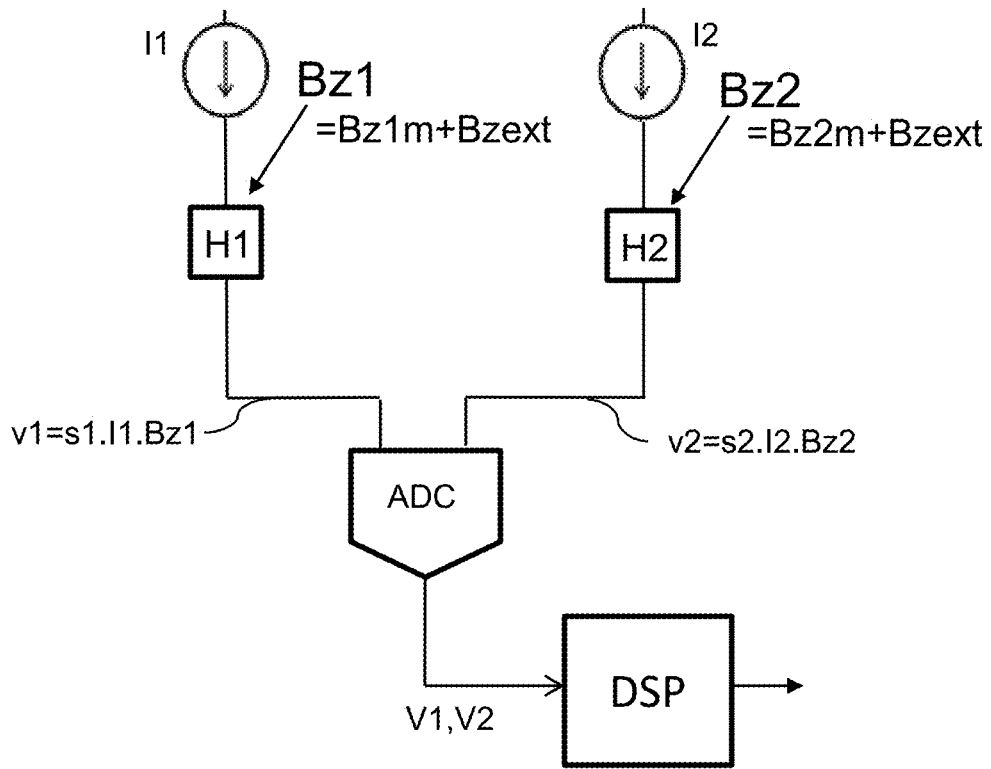
FIG. 2 illustrates a technical problem underlying the present invention.

FIG. 2 illustrates how two Bz field components, Bz1 measured at location X1, and Bz2 measured at location X2 spaced from X1 by a distance Δx, are processed conventionally, in the schematic block diagram of FIG. 1(b). Assume that the signal Bz1 is the sum of a signal Bz1m (e.g. induced by a magnet) plus a strayfield component Bzext, thus Bz1=Bz1m+Bzext, and likewise, Bz2=Bz2m+Bzext. Assume further that the first Hall element H1 is biased with a first biasing current I1, and that the first Hall element H1 provides voltage signal v1 proportional to the product of the biasing current I1 and the applied magnetic field component Bz1 according to the following formula:

$$v1=s1 \cdot I1 \cdot Bz1 \qquad [4]$$

where s1 represents the "current related magnetic sensitivity" of the first Hall element (expressed in [Volt/(Tesla*Ampère)]), and that the second Hall element H2 is biased with a second biasing current I2, and that the second Hall element H2 provides a voltage signal v2 proportional to the biasing current I2, and that the second Hall element H2 provides a voltage signal v2 proportional to the product of the biasing current I2 and the applied magnetic field component Bz2 according to the following formula:

$$v2 = s2 \cdot I2 \cdot Bz2 \quad [5]$$

where s2 represents the "current related magnetic sensitivity" of the second Hall element (expressed in [Volt/(Tesla*Ampère)]).

Assuming that the analogue to digital converter (ADC) converts these signals respectively in a first digital value V1, and a second digital value V2, then the processing circuit (e.g. DSP) will calculate the gradient as the difference between V2 and V1, which can be expressed as follows:

$$\text{gradient} = V2 - V1 \quad [6]$$

$$\text{gradient} = s2 \cdot I2 \cdot (Bz1m + Bzext) - s1 \cdot I1 \cdot (Bz2m + Bzext) \quad [7]$$

Assuming now that the first biasing current I1 is approximately equal to the second biasing current I2, and that s1·I1 is approximately equal to s2·I2, then expression [7] can be approximated by:

$$\text{gradient} \approx (s2-s1) \cdot I1 \cdot Bzext + (s1 \cdot I1) \cdot (\Delta Bzm) \quad [8]$$

where ≈ means "is approximately equal to".

It can be seen from this expression [8] that the second term is the real gradient term, which is indeed proportional to the applied biasing current I1 and the magnetic field difference ΔBz, but surprisingly the calculated gradient value also has an unexpected error term which is proportional to the strayfield Bzext at the sensor locations, multiplied by the sensitivity mismatch (s2−s1).

As suggested above, in case the strayfield value is substantially equal to zero, the error term is negligible, but in systems where the strayfield value of Bzext is larger than the value of ΔBzm, which is indeed the case in some applications, the error term becomes significant.

In order to reduce or minimize the error term for a system using a single gradient, the present invention proposes to dynamically adjust the second biasing source and/or the second amplifier and/or the second digital value relative to the first biasing source and/or the first amplifier and/or the first digital value, using a predefined function, before subtracting it from the first analog signal or the first digital value.

More in particular, the present invention proposes a magnetic sensor device having the features of the independent device claim and proposes a method of measuring a magnetic field gradient having the features of the independent method claim. In order to fully understand and appreciate the proposed solutions, the following additional insights are disclosed.

The inventors of the present invention came to a further insight that, in order to reduce the error term of equation [8], it is not required to adjust both sensitivities to a predefined absolute value, but it suffices to adjust only one sensitivity to become substantially equal to the other sensitivity. This further insight allowed them to find a simpler solution than for example the one proposed in EP3109658, where each magnetic sensor is provided with a temperature sensor and a mechanical stress sensor, and where the absolute value of the magnetic field is calculated by solving a set of mathematical equations.

Figure 6A:
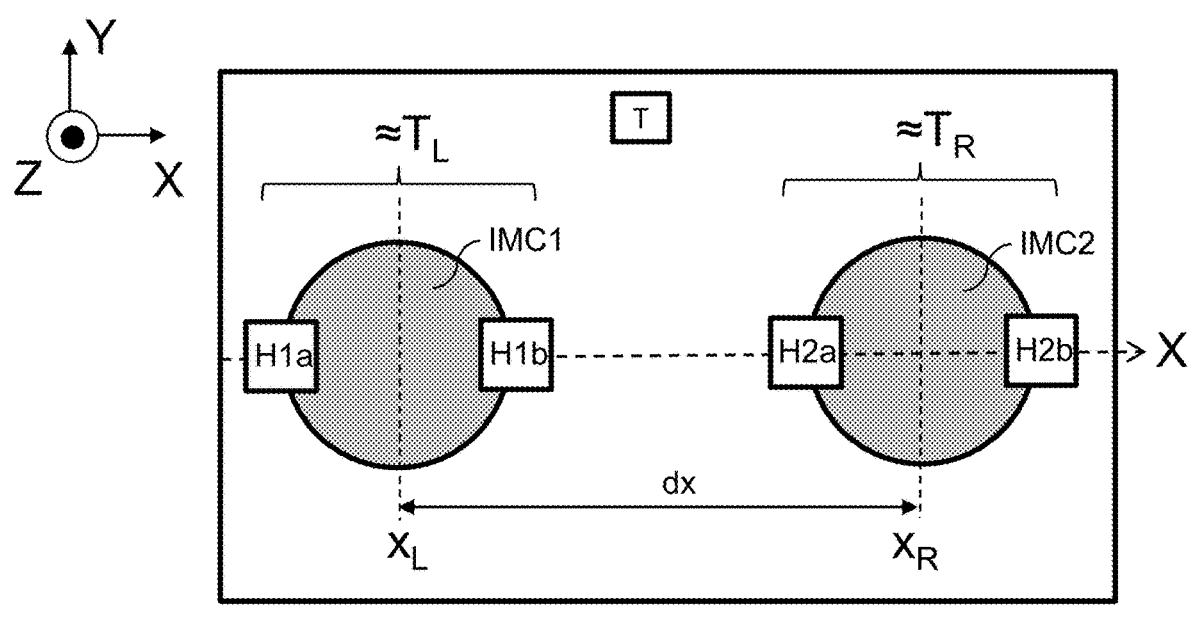
FIG. 6(a) shows a sensor arrangement having two magnetic sensors, each magnetic sensor comprising two horizontal Hall elements arranged on opposite sides of an integrated magnetic concentrator (IMC), according to another embodiment of the present invention.
Figure 6B:
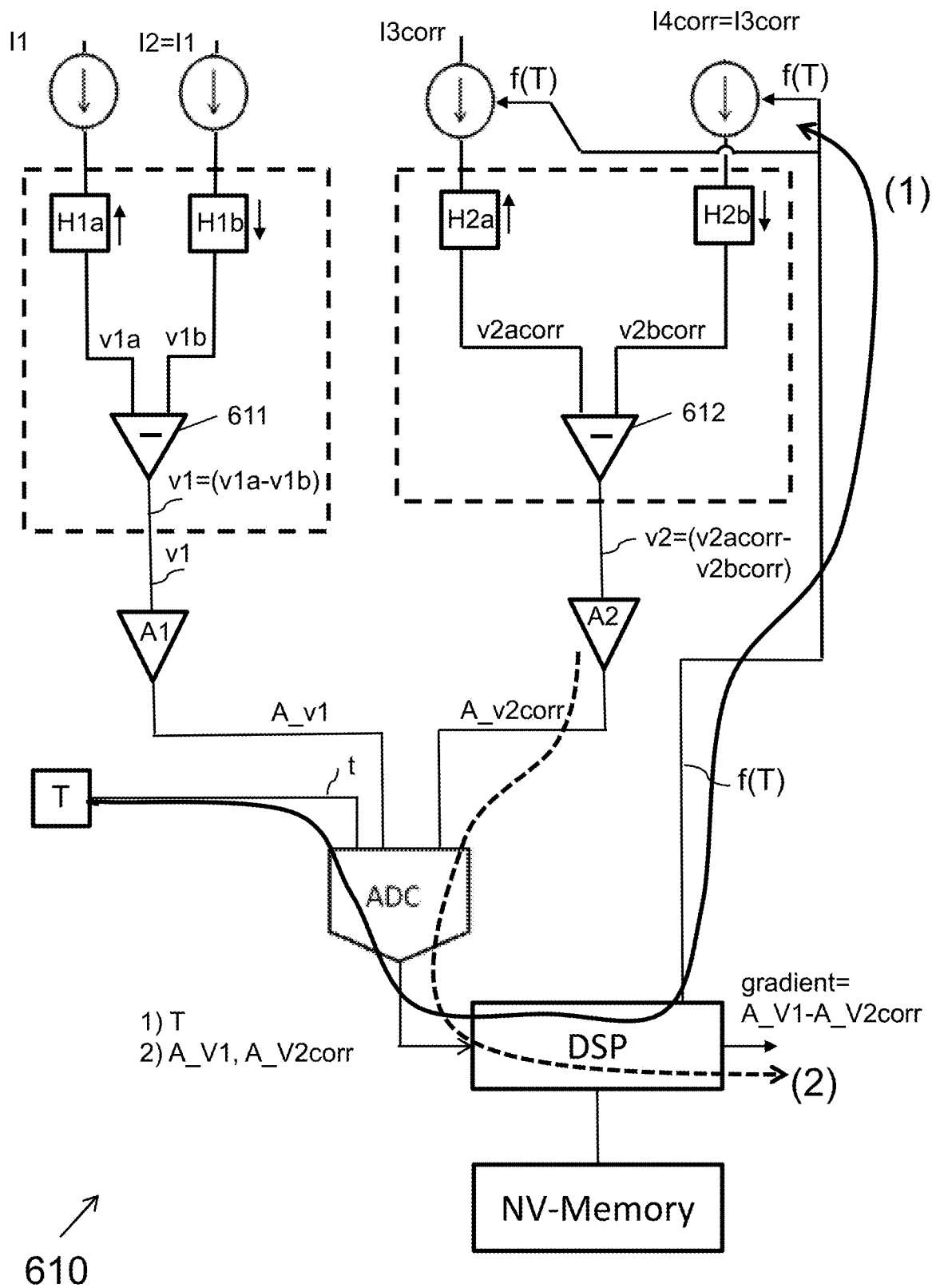
FIG. 6(b) shows a variant of the circuit of FIG. 3(b), according to an embodiment of the present invention, also using a temperature sensor and an adjustable current source, and digital subtraction.
Figure 6C:
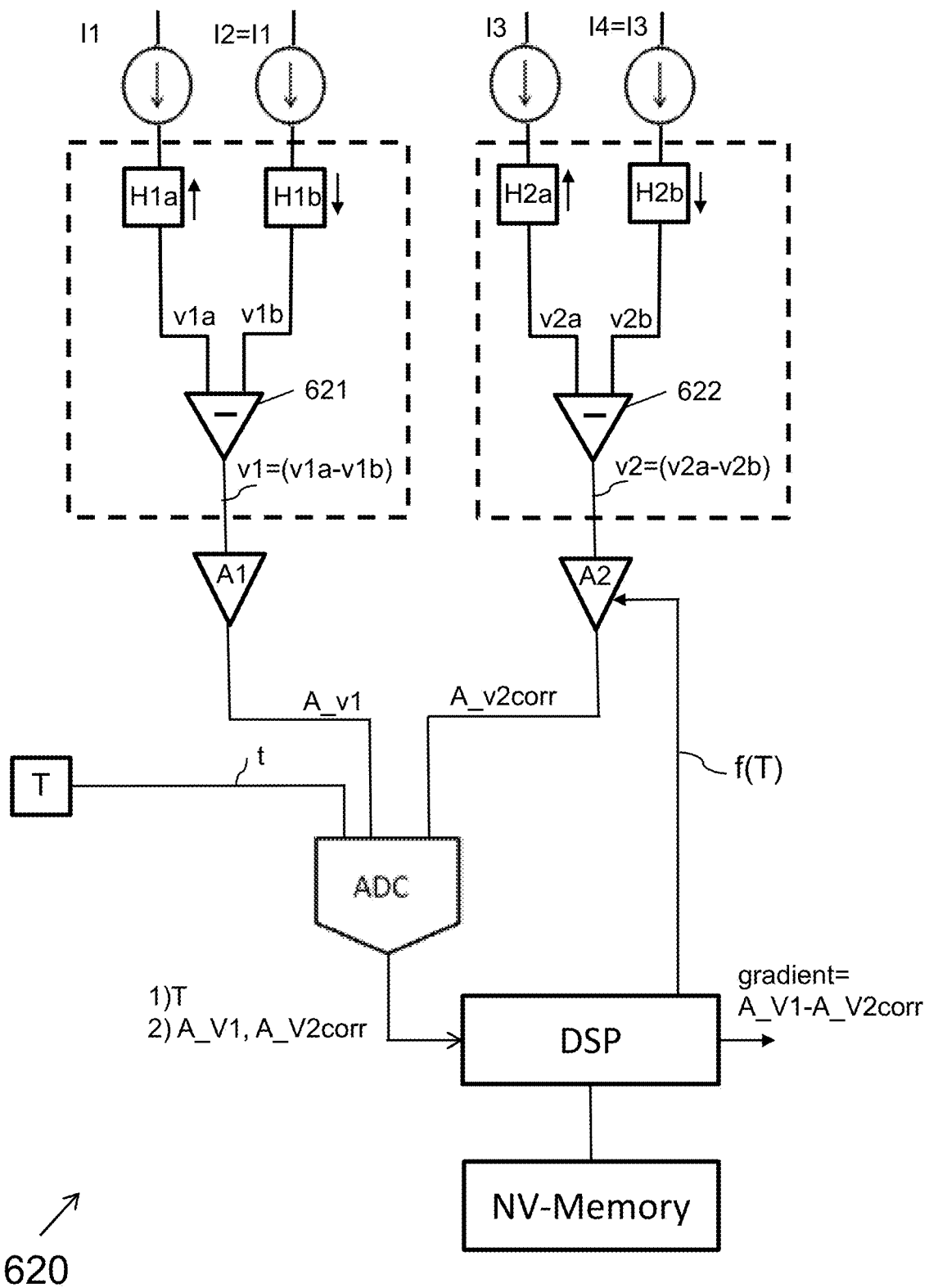
FIG. 6(c) shows a variant of the circuit of FIG. 3(c), according to an embodiment of the present invention, also using a temperature sensor and an adjustable amplifier gain, and digital subtraction.
Figure 7A:
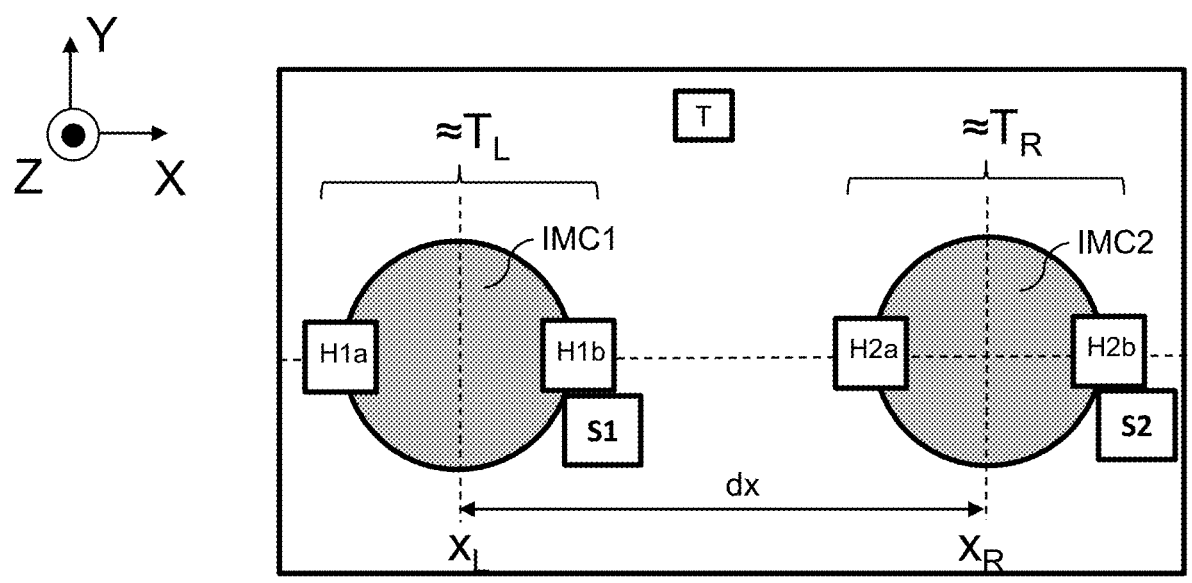
FIG. 7(a) shows a variant of the sensor arrangement of FIG. 6(a) with a differential stress sensor, according to an embodiment of the present invention.
Figure 7B:
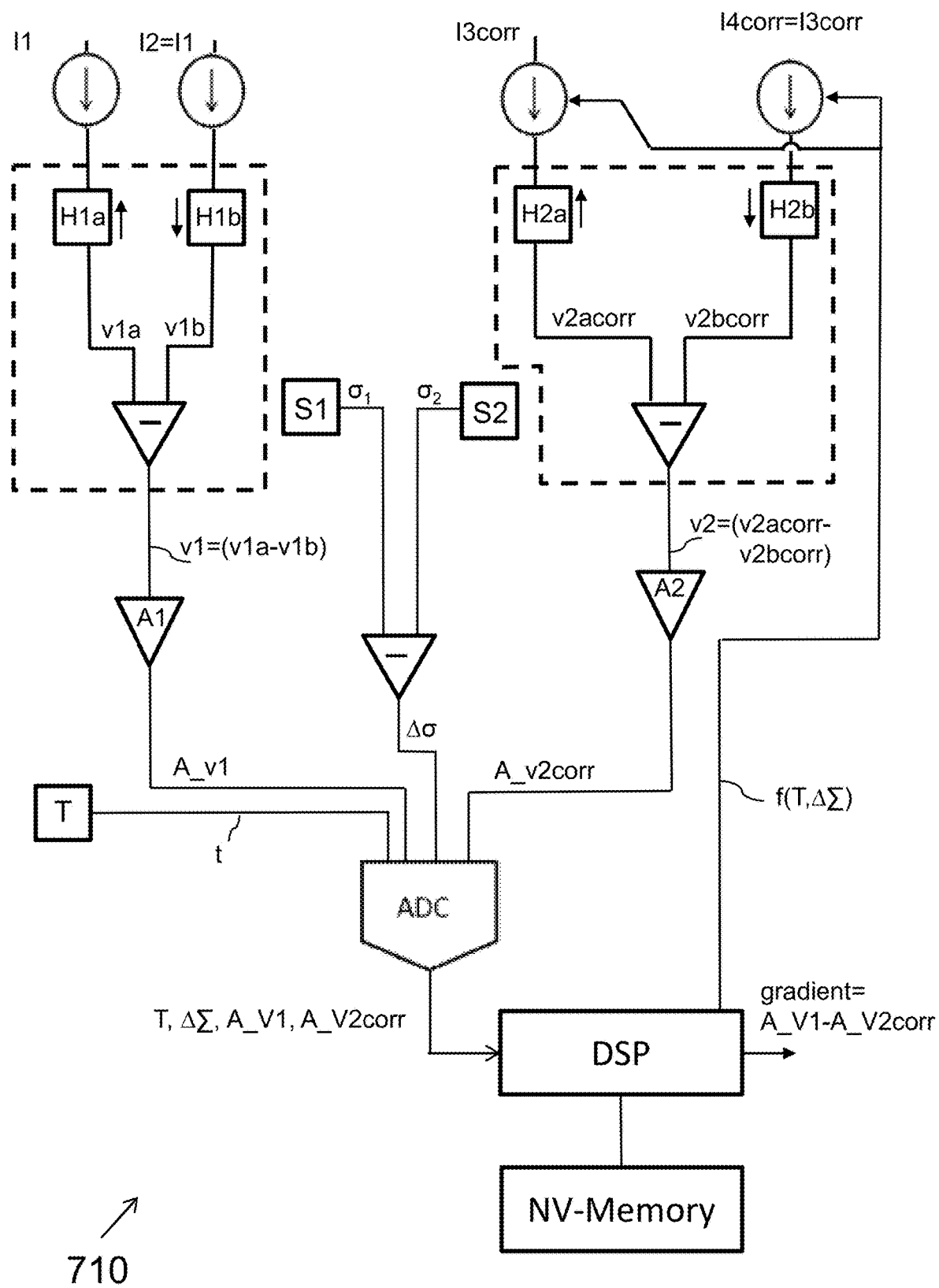
FIG. 7(b) and FIG. 7(c) show variants of the circuits of FIG. 6(b) and FIG. 6(c), furthermore using the differential stress signal, according to embodiments of the present invention.
Figure 7C:
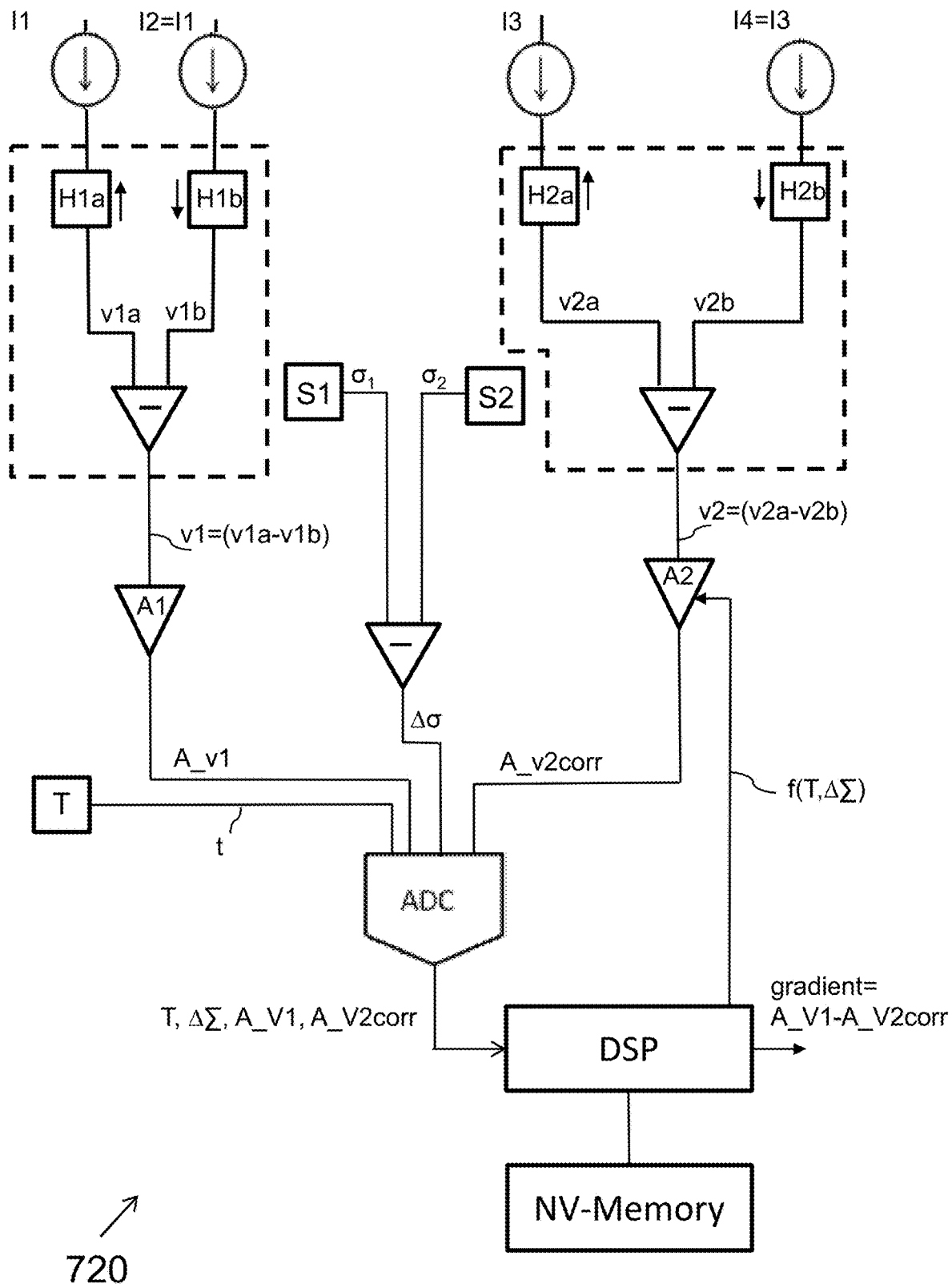
Figure 8A:
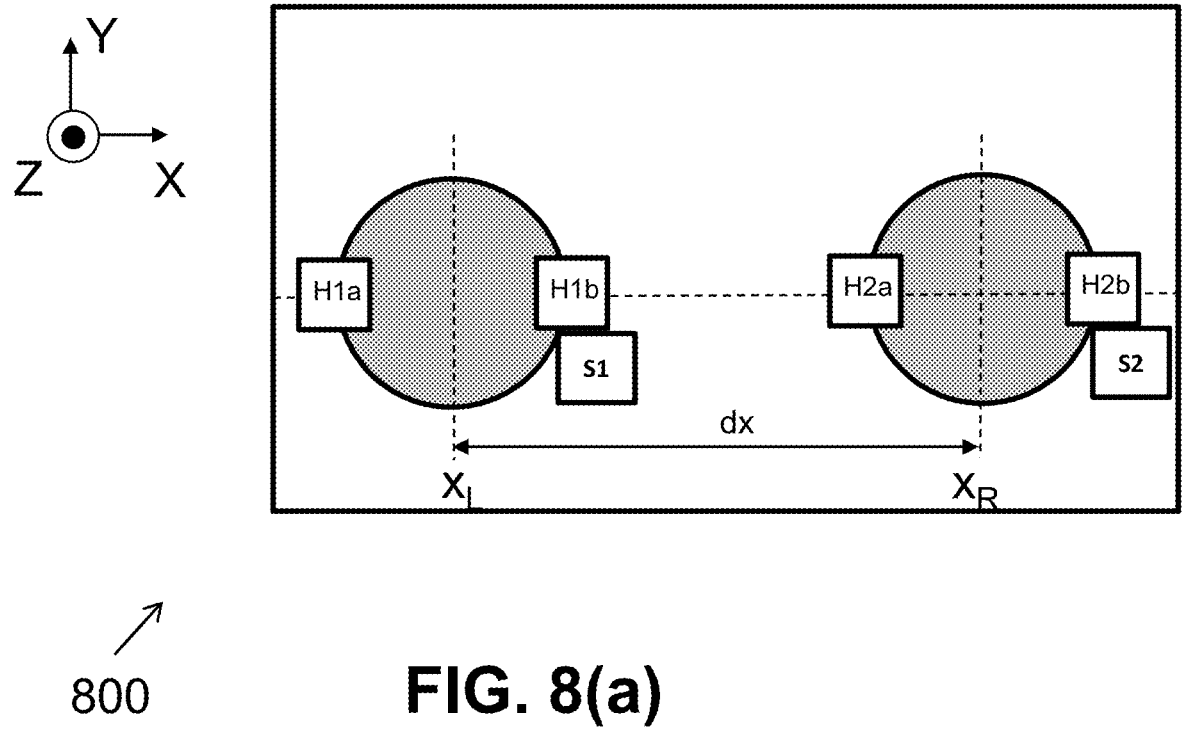
FIG. 8(a) shows a variant of the sensor arrangement of FIG. 7(a) without the temperature sensor, according to an embodiment of the present invention.
Figure 8B:
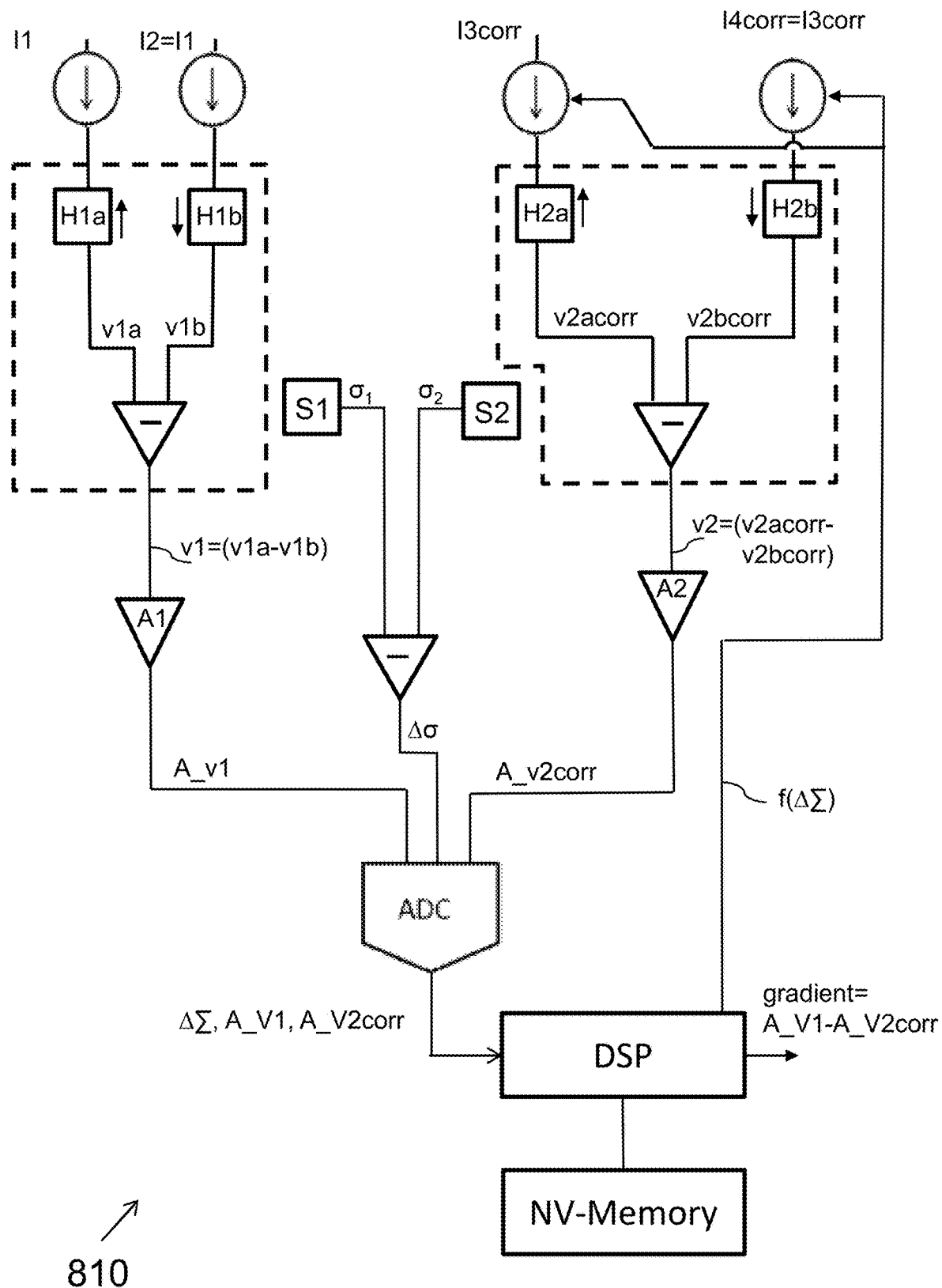
FIG. 8(b) and FIG. 8(c) show variants of the circuits of FIG. 7(b) and FIG. 7(c) without the temperature sensor, according to embodiments of the present invention.
Figure 8C:
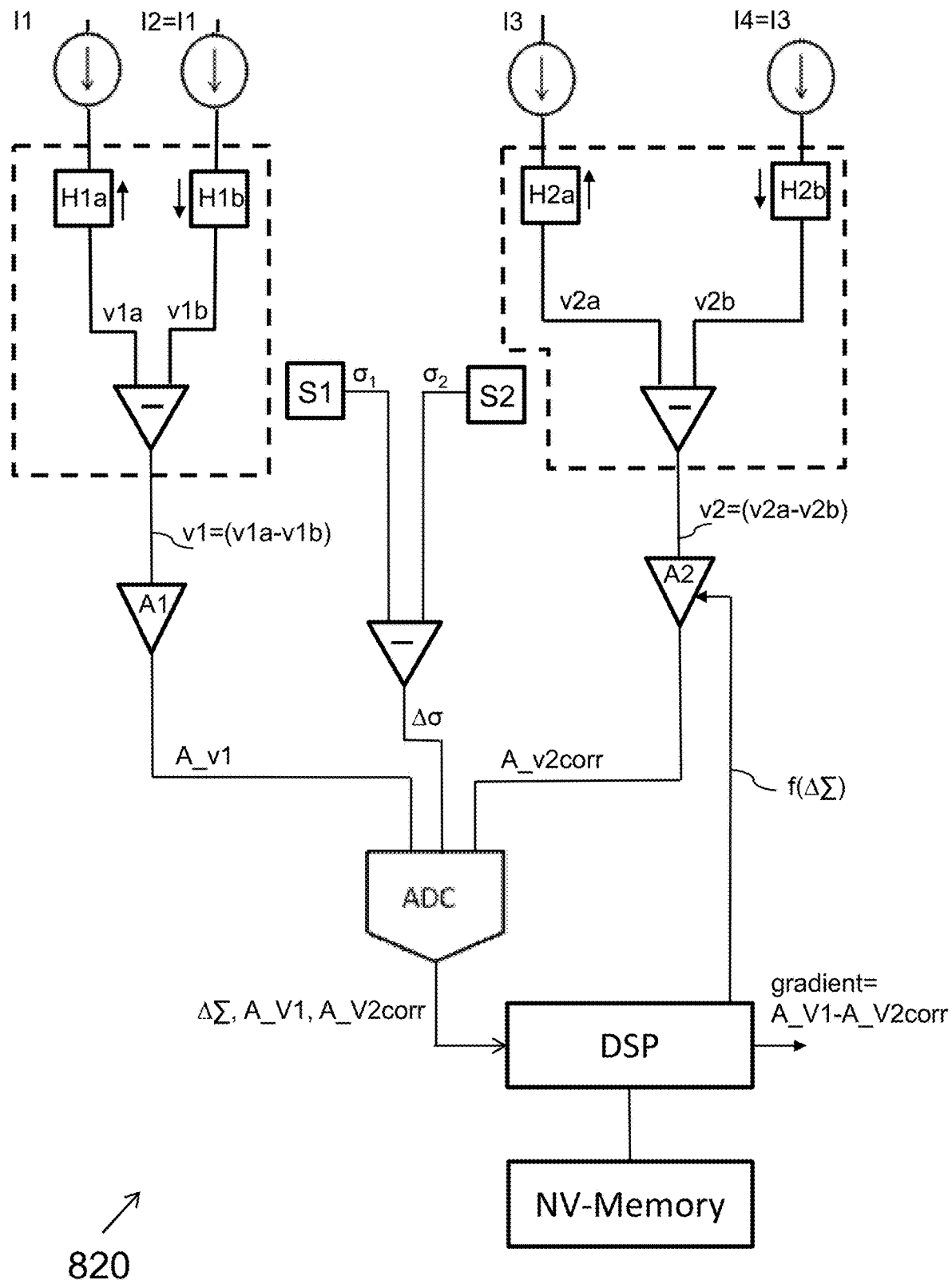

In the present invention, basically three solutions are proposed:

i) solutions where a single temperature T is measured, but no mechanical stress is measured, and where the second biasing source and/or the second signal path is adjusted as a function f(T) of the measured temperature (see e.g. FIG. 3(a) to FIG. 3(g), and see e.g. FIG. 6(a) to FIG. 6(c) for a sensor structure referred to herein as "dual disk structure");

ii) solutions where a differential stress is measured, but no temperature, and where the second biasing source and/or the second signal path is adjusted as a function f(ΔΣ) of the measured stress difference (see e.g. FIG. 5(a) to FIG. 5(f) for a sensor structure with two horizontal Hall elements, and see e.g. FIG. 8(a) to FIG. 8(c) for a sensor structure referred to herein as "dual disk structure");

iii) solutions where a single temperature T is measured, and also a differential stress is measured, and where the second biasing source and/or the second signal path is adjusted as a function f(T,ΔΣ) of both the temperature and the measured stress difference (see e.g. FIG. 4(a) to FIG. 4(f), and see e.g. FIG. 7(a) to FIG. 7(C) for a sensor structure referred to herein as "dual disk structure"), but of course, the present invention is not limited to these particular sensor structures, and the proposed principles can also be applied to other sensor structures, for example sensor structures with two vertical Hall elements oriented in the same direction, or sensor structures having magneto resistive elements, etc.

It is noted that this problem also occurs when the magnetic sensors are not biased with a current source, but are biased for example using a "voltage source" (having a relatively low output impedance, e.g. smaller than 10 Ohm, or smaller than 1 Ohm).

In what follows, the present invention will be explained referring to current sources as biasing sources, for easy of explanation, but the present invention is not limited thereto. Likewise, even though the drawings are shown with a DSP as the digital processing circuit, the present invention is not limited thereto, and other digital processing circuits may also be used, e.g. programmable digital logic, a microcontroller, etc.

Figure 3A:
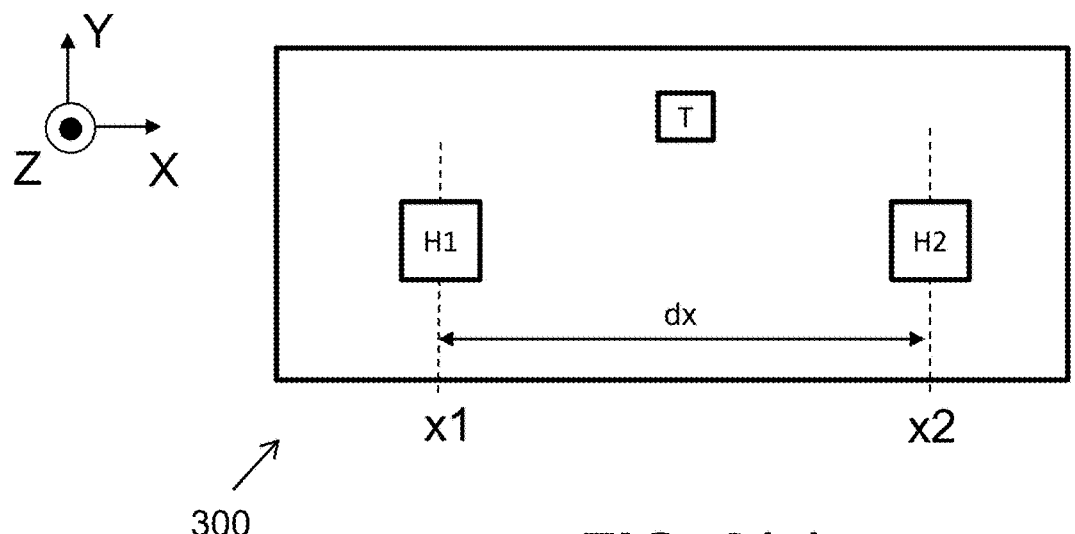
FIG. 3(a) shows a variant of the sensor arrangement of FIG. 1(a) with a temperature sensor.

FIG. 3(a) shows a sensor arrangement 300 similar to FIG. 1(a), with a temperature sensor, more in particular, with a single temperature sensor.

The main purpose of this figure is to illustrate that the two magnetic sensors (in this example represented by a single horizontal Hall element H1, H2) are spaced apart along the X-axis by a predefined distance dx, but the biasing circuit and readout circuit are not shown in this figure. As explained above, this sensor structure can be used to measure Bz1 at X1, Bz2 at X2, and to calculate a gradient dBz/dx based on Bz1 and Bz2. As explained above, in practice, the sensitivity of the first magnetic sensor is not always exactly the same as the sensitivity of the second magnetic sensor, even when exactly the same layout symbol is used, and even when they are biased with exactly the same current (e.g. generated by a current mirror).

Figure 3B:
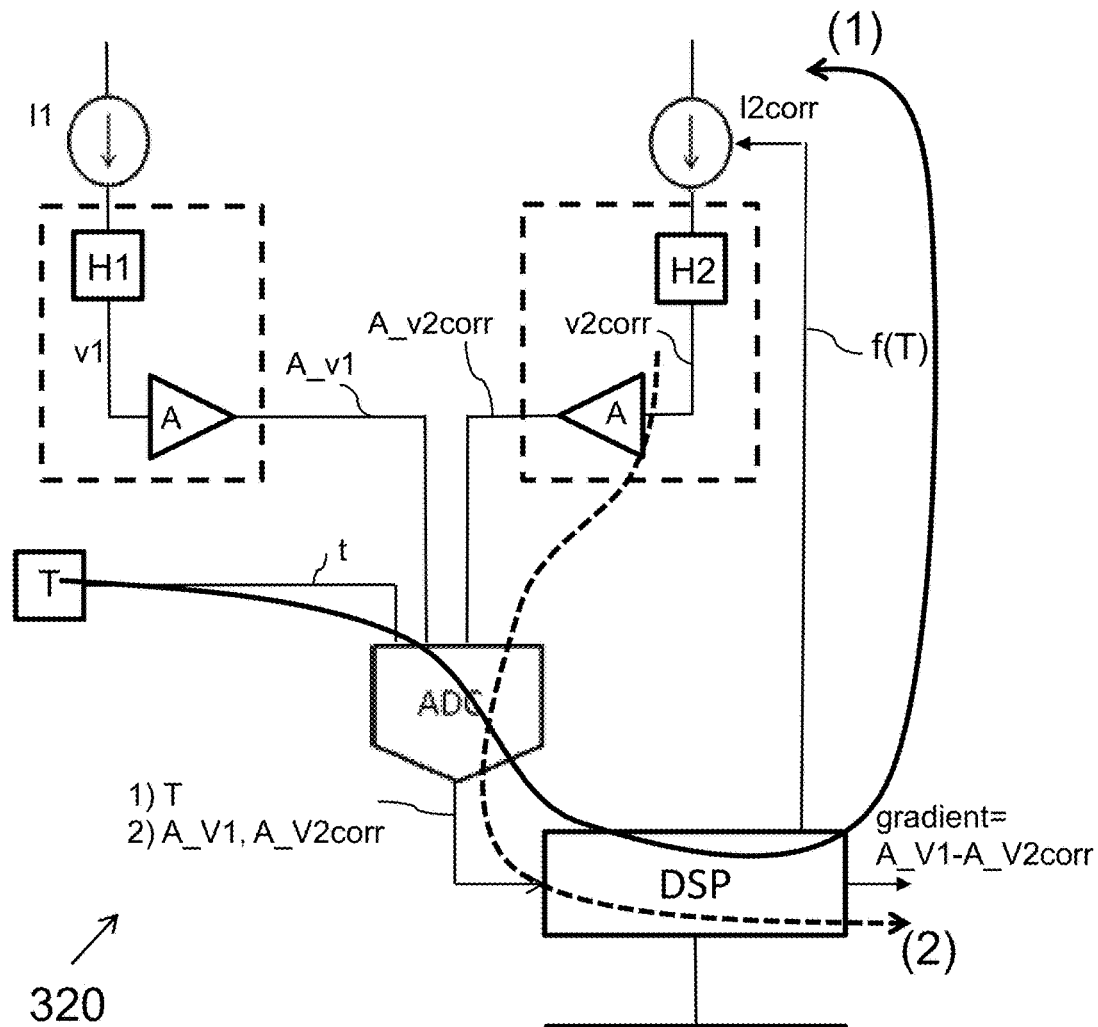
FIG. 3(b) shows a variant of the circuit of FIG. 1(b), according to an embodiment of the present invention, using a temperature sensor and an adjustable current source, and digital subtraction (or subtraction in the digital domain).

FIG. 3(b) shows a magnetic sensor device 320 comprising:
a semiconductor substrate (shown in FIG. 3(a));
a first magnetic sensor H1 located at a first sensor location X1 (see FIG. 3(a)) on said semiconductor substrate, and arranged for providing a first sensor signal (e.g. voltage signal) v1 indicative of a first magnetic field component Bz1 oriented in a first direction Z perpendicular to the substrate;
a second magnetic sensor H2 located at a second location X2 (see FIG. 3(a)) on said semiconductor substrate, spaced from the first sensor location X1, and arranged for providing a second sensor signal (e.g. voltage signal) v2corr indicative of a second magnetic field component Bz2 oriented in said first direction Z. It is noted that this signal is labelled "v2corr" because the current I2 is adjusted;

a temperature sensor, located at a third position on said semiconductor substrate, and configured for measuring a temperature (T) of the substrate and for providing a temperature signal. The third location may be near to first sensor location, or near to second sensor location, or substantially halfway between the first sensor location and the second sensor location, or may be any other location on the substrate;

a first current source arranged for biasing the first magnetic sensor H1 with a first predefined current I1. The first current is preferably a predefined current generated by a temperature-compensated current generator circuit, known per se in the art;

a second current source arranged for biasing the second magnetic sensor H2 using a second current signal I2. The second current source is an adjustable current source, having a control port or control gate, which is controlled by the processing unit, e.g. DSP, as a function f(T) of the measured temperature;

a first amplifier arranged for amplifying the first magnetic sensor signal v1 with a first predefined gain A and providing a first amplified sensor signal A_v1.

a second amplifier arranged for amplifying the second magnetic sensor signal v2corr with a second predefined gain A, and for providing a second amplified sensor signal A_v2corr. The second amplifier gain may be equal to the first amplifier gain, but that is not absolutely required.

at least one analog-to-digital converter ADC for converting the first amplified signal A_v1 and the second amplified signal A_v2corr, e.g. in a time-multiplexed manner. This is represented schematically by an ADC having multiple inputs, but it would also be possible to use an analogue multiplexer in front of the ADC. Such details are omitted from the drawings for illustrative purposes;

a digital processing circuit connected downstream of the analog-to-digital convertor ADC, wherein the magnetic sensor device is configured for adjusting the second biasing signal I2 based on a predefined function f(T) of the measured temperature, before determining a difference between the first digital value A_V1 and the second digital value A_V2corr.

Or stated in other words, the measurement of the gradient can for example be performed as follows:

a) first the temperature signal t is measured, and digitized into value T, b) the digital processing circuit, e.g. digital controller or DSP receives the digital value T, and adjusts the second current I2 using a predefined function of the value T, c) then the first and second magnetic sensor signal v1, v2corr are measured, amplified and digitised, d) then the digital processing circuit, e.g. digital controller or DSP calculates the gradient by subtracting the first digital value A_V1 and the second digital value A_V2corr.

The predefined function f(T) may be chosen such that, during operation, a product of the magnetic sensitivity S1 of the first magnetic sensor H1 and a first overall gain OG1 of a first signal path from an output of the first magnetic sensor H1 to said determining of a difference (e.g. a subtraction performed in the digital processing circuit) is substantially equal to a product of the magnetic sensitivity S2 of the second magnetic sensor H2 and a second overall gain OG2 of a second signal path from an output of the second magnetic sensor H2 to said determining of a difference (which difference may be determined in the analog or digital domain). Thus, f(T) is chosen such that S1*OG1=S2*OG2.

The reader will understand that the first magnetic sensor signal v1 may also be measured and amplified and digitised before the second current I2 is adjusted, because the first sensor value v1 is not influenced by the second current I2, but in order for this embodiment to work, it is essential that the second current I2 is adjusted before the second magnetic sensor signal v2corr is amplified and digitised and sent to the DSP.

Or stated in simple terms, for the specific circuit shown in FIG. 3(b), and assuming that the processing circuit calculates the gradient by simply subtracting the digital values A_V1 and A_V2corr without further multiplications in the digital domain, and assuming that the gain of both amplifiers is equal to A, the function f(T) is preferably chosen such that (s1·I1)·A=(s2·I2)·A for various values of the temperature T when expressed in terms of the "current related magnetic sensitivity", or in general, is preferably chosen such that S1·A1·D1=S2·A2·D2 when expressed in terms of the "magnetic sensitivity", wherein A1, A2 is the amplification of the first, second signal path in the analog domain, and D1, D2 is the amplification of the first, second signal path in the digital domain.

As an example, assuming that the second current source I2 is controlled by applying a gate voltage of a MOS transistor, and that the digital processing circuit contains a DSP (digital signal processor) with a DAC (digital-to-analog convertor), and that the gate voltage is generated by the DAC, then the function f(T) can for example be found by performing a calibration test at various temperatures. For each temperature, a constant magnetic field is applied, the value A_V1 and A_V2 are repeatedly measured, and the gate voltage for which the value A_V2 is substantially equal to the value A_V1 (within a given tolerance margin, e.g. less than 1%, or defined by the least-significant-bit LSB of the DAC) is found, and the respective gate voltage values for each temperature is added to a list, which list is stored in a non-volatile memory inside the DSP or connected to the DSP. During normal operation, the DSP can simply measure the temperature, and use the temperature as an index to find the corresponding gate voltage to be applied to the second current source. This example illustrates that correcting for the sensitivity mismatch during operation using the correction function (e.g. in the form of a list or table) can be very simple, and does not require two temperature sensors, or solving a set of mathematical equations.

The DAC may be part of a control circuit configured for adjusting the current source and/or the amplifier gain within a predefined range, e.g. around a predefined working point. Preferably the DAC has a resolution sufficient for allowing to adjust the current and/or the amplifier gain in steps smaller than 1% of the predefined working point, preferably smaller than 0.5%, or smaller than 0.4%, or smaller than 0.3%, or smaller than 0.2%. In practice, the DAC may have a resolution of at least 2 bits, or at least 4 bits, or at least 6 bits.

In summary, FIG. 3(b) shows a magnetic sensor device 320 for measuring a magnetic field gradient, by subtracting two values in the digital domain, after adjusting the second biasing signal I2 as a function of temperature.

Many variants of the circuit are possible, for example:

In a variant, the magnetic sensors are not horizontal Hall elements, but vertical Hall elements oriented in the same direction.

In a variant, there is not just one ADC, but there are multiple ADCs.

In a variant, the control signal for the second current source is not generated by a DAC, but by a PWM block followed by a low-pass filter.

In a variant, the biasing source is not an adjustable current source, but an adjustable voltage source.

In a variant, the digital processing circuit does not contain the digital signal processor (DSP), but a micro-controller.

In a variant, the temperature sensor does not provide an analogue signal "t" which is digitised by the ADC but provides a digital signal "T" directly to the processing circuit.

In the examples above, the correction function f(T) may be stored as a list of (T, V) values, where T is the temperature, and V is the voltage to be generated by a DAC and applied to the MOS transistor. But of course, the list can also be approximated by a piecewise linear combination of one or more line segments, or by a mathematical expression, for example by a first order or second order or third order polynomial of the variable T. One such example is shown in FIG. 3(g), not only showing a typical correction function f(T), but also showing the coefficients of an exemplary polynomial, obtained by measuring more than 500 samples. The coefficients may be stored in a non-volatile memory, and during normal use, the polynomial expression may be evaluated with the measured temperature value.

Figure 3C:
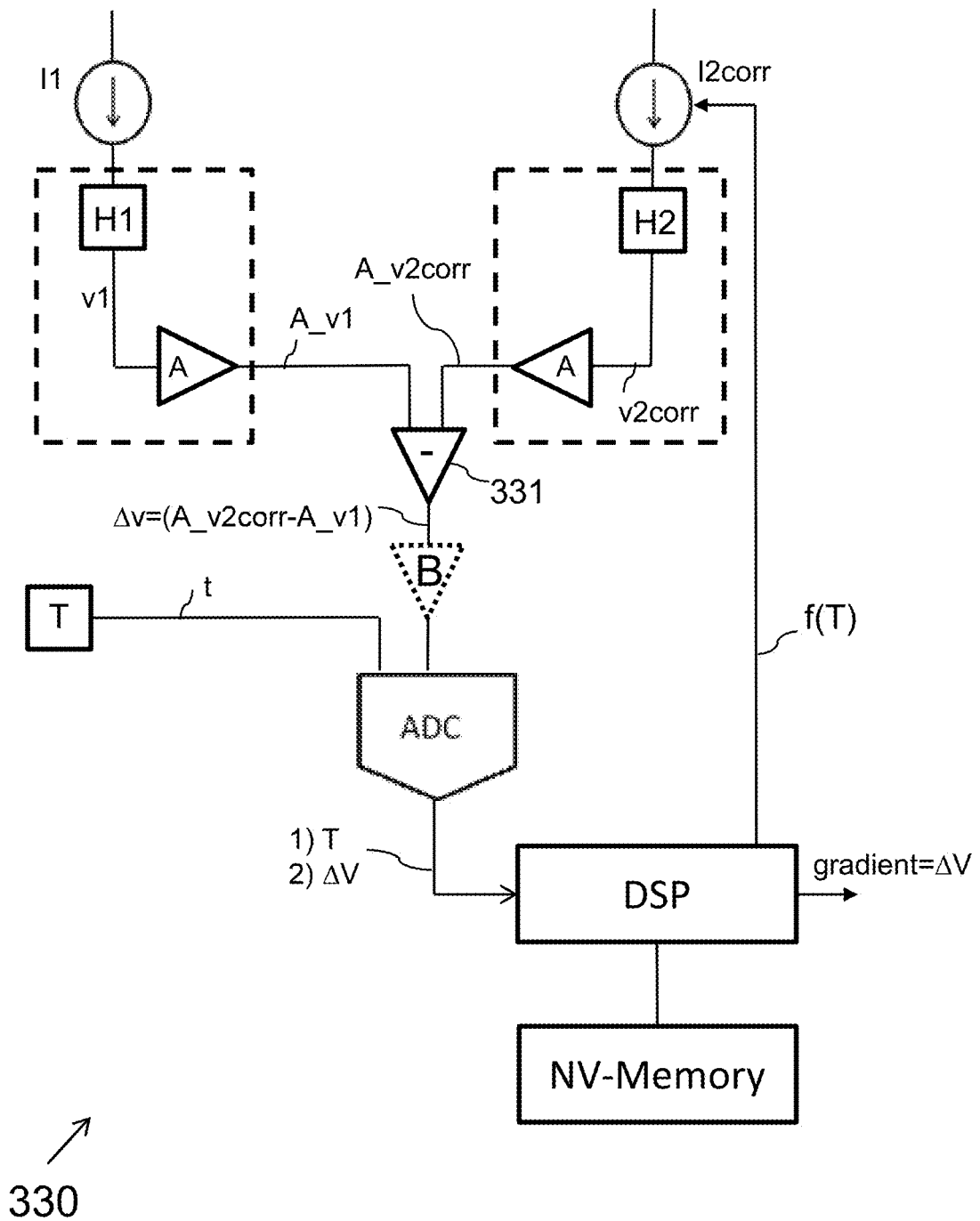
FIG. 3(c) shows a variant of the circuit of FIG. 1(b), according to an embodiment of the present invention, using a temperature sensor and an adjustable current source, and analogue subtraction (or subtraction in the analog domain).

FIG. 3(c) shows a variant of the circuit of FIG. 3(b), according to another embodiment of the present invention, using a single temperature sensor and an adjustable current source, and analogue subtraction. The main difference between the circuit of FIG. 3(c) and FIG. 3(b) is that the subtraction of the first and second magnetic sensor signal v1, v2corr is not performed in the digital domain (e.g. in software in the DSP), but is performed in the analogue domain (in block 331).

In the circuit of FIG. 3(c) the subtraction circuit 331 is configured for determining a difference Δv between the first amplified signal A_v1 and the second amplified signal A_v2corr.

The ADC is configured for digitizing the temperature T, and the difference signal Δv, for example in a time multiplexed manner.

Similar as above, the DSP is configured for obtaining the digital temperature value T and for adjusting the second current source I2 using a predefined correction function f(T). Unlike above, the DSP receives the digitized difference signal ΔV, indicative of the gradient. This value may optionally be multiplied by a predefined constant.

Or stated in other words, the measurement of the gradient using the circuit of FIG. 3(c) can for example be performed as follows:

a) first the temperature signal t is measured, and digitized to yield the value T, b) the DSP receives the digital temperature value T, and adjusts the second current I2 using a predefined function of the value T, c) then the first and second magnetic sensor signal v1, v2corr are measured and amplified, and a difference signal Δv is generated in block 331, and is digitised in the ADC, d) the DSP obtains this digitized difference signal ΔV and considers this as the gradient.

In order for this embodiment to work, it is essential that the second current I2 is adjusted before the difference signal Δv is generated (in block 331), and digitized and sent to the DSP.

Many of the advantages described above are also applicable here.

The circuit 330 of FIG. 3(c) offers an additional advantage, by performing the subtraction in the analogue domain before being digitised by the ADC. By doing so the signal to noise ratio (SNR) of the gradient can be greatly improved, because the full range of the ADC can now be used for digitising the difference signal, as opposed to FIG. 3(b) where the full range of the ADC is required to quantise the individual magnetic field components.

The subtraction circuit 331 may optionally be followed by a third amplifier (indicated in dotted line) with amplification factor B, but this is not absolutely required.

The correction function f(T) for this case can for example be obtained as follows: Assuming again that the second current source I2 is controlled by applying a gate voltage of a MOS transistor, and that the DSP contains a DAC, and that the adjustment of the second current source I2 is performed by applying the DAC signal to the gate of the MOS transistor, then the function f(T) can for example be found by performing a calibration test at various temperatures. For each temperature, a constant magnetic field is applied, the DAC voltage is varied, and the resulting value ΔV is measured, and the DAC voltage for which the difference value ΔV is minimal (in absolute value), is considered as the gate voltage to be applied to adjust the second current source in such a way that the total gain (from magnetic field strength [expressed in mT] to digital value in the DSP, is substantially the same for both signal paths. Again, the DAC voltages for the various temperatures may be stored in a list in non-volatile memory, or may be used for curve-fitting in which case the parameters of the curve, e.g. second order polynomial, are stored in said non-volatile memory.

In summary, FIG. 3(c) shows a magnetic sensor device for measuring a magnetic field gradient, by subtracting two values, where the subtraction is performed in the analog domain, and where the second current is adjusted as a function of temperature.

All variants described for FIG. 3(b) can also be applied for FIG. 3(c). For example, the magnetic sensor elements may be vertical Hall elements; there may be multiple ADCs instead of only one; the control signal may be generated by a PWM-generator-block and a Low-Pass-Filter instead of by a DAC; the biasing source may be a biasing voltage; the digital processing circuit may comprise a micro-controller; the temperature sensor may provide a digital temperature signal, the gradient may be further scaled, or combinations hereof.

Figure 3D:
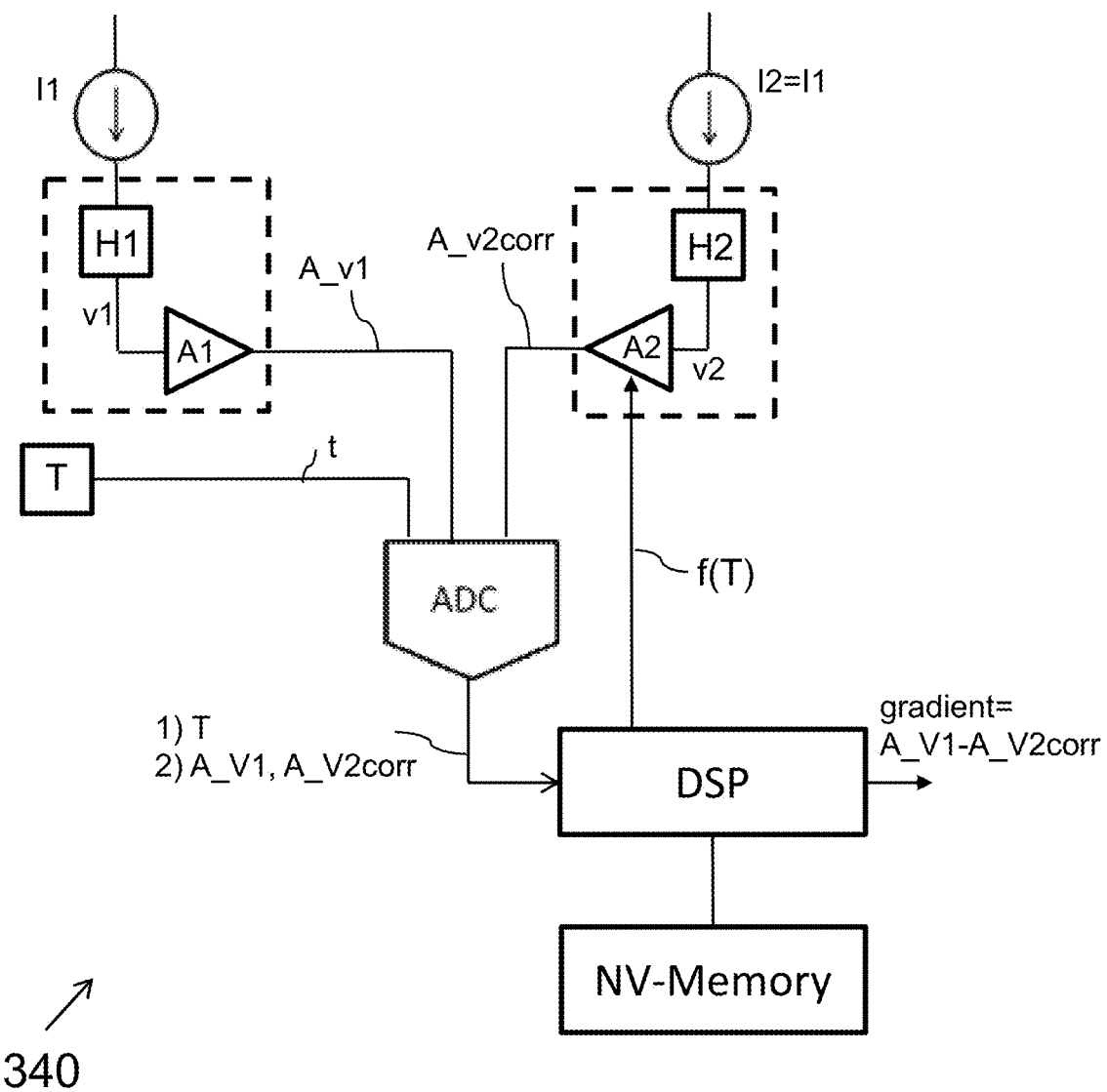
FIG. 3(d) shows a variant of the circuit of FIG. 1(b), according to an embodiment of the present invention, using a temperature sensor and an adjustable amplifier gain, and digital subtraction.

FIG. 3(d) shows a variant of the circuit of FIG. 3(b), according to another embodiment of the present invention, using a single temperature sensor and an adjustable amplifier gain, and digital subtraction. The main differences between the circuit of FIG. 3(d) and FIG. 3(b) is that the second current source is a predefined current source, (e.g. a temperature compensated current source, or a current mirror of the first current source), and that the second amplifier has an adjustable gain A2. The second current may be substantially the same as the first current, e.g. using a current-mirror, but that is not absolutely required, and a temperature compensated predefined second current source may also be used, for example.

The DSP is configured for obtaining the digital temperature value T and for adjusting the second amplifier gain using a predefined correction function f(T). The correction function f(T) for this case can be obtained in a similar manner as described in FIG. 3(b), except that in FIG. 3(d) the DAC voltage is applied to a port or node of the second amplifier.

In order for this embodiment to work, it is essential that the second gain A2 is adjusted before the sensor signal v2corr is digitized and sent to the DSP for further processing.

In summary, FIG. 3(d) shows a magnetic sensor device 340 for measuring a magnetic field gradient, by subtracting two values A_V1 and A_V2corr in the digital domain, after adjusting the gain of the second amplifier as a function of temperature.

All variations described for FIG. 3(b) can also be applied for FIG. 3(d).

Figure 3E:
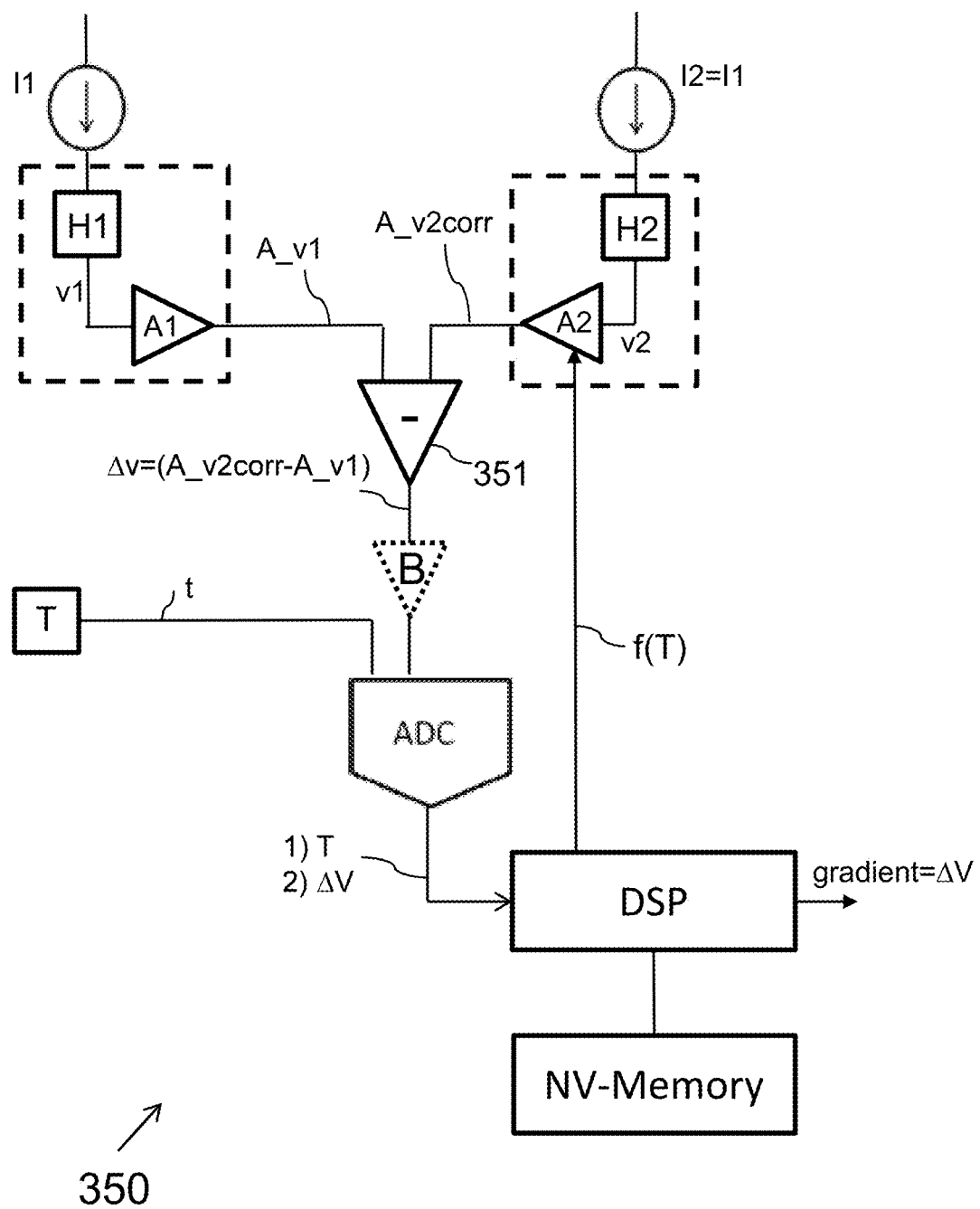
FIG. 3(e) shows a variant of the circuit of FIG. 1(b), according to an embodiment of the present invention, using a temperature sensor and an adjustable amplifier gain, and analogue subtraction.

FIG. 3(e) shows a variant of the circuit of FIG. 3(c), according to another embodiment of the present invention, using a single temperature sensor and an adjustable amplifier gain, and analog subtraction. The main differences between the circuit of FIG. 3(e) and FIG. 3(c) is that the second current source is a predefined current source, and that the second amplifier has an adjustable gain A2. The second current I2 may be substantially the same as the first current I1, but that is not absolutely required.

The DSP is configured for obtaining the digital temperature value T and for adjusting the second amplifier gain using a predefined correction function f(T). The correction function f(T) for this case can be obtained in a similar manner as described in FIG. 3(c), except that in FIG. 3(e) the DAC voltage is applied to a port or node of the second amplifier rather than to a port or node of the second current source.

In order for this embodiment to work, it is essential that the second gain A2 is adjusted before a difference Δv between the amplified sensor signals A_v1 and A_v2corr is generated in block 351, and then digitised by the ADC, and then sent to the DSP for further processing.

In summary, FIG. 3(e) shows a magnetic sensor device 350 for measuring a magnetic field gradient, by two amplified sensor signals A_v1, A_v2corr in the analog domain, after adjusting the gain of the second amplifier as a function of temperature.

All variations described for FIG. 3(b) can also be applied for FIG. 3(e).

Figure 3F:
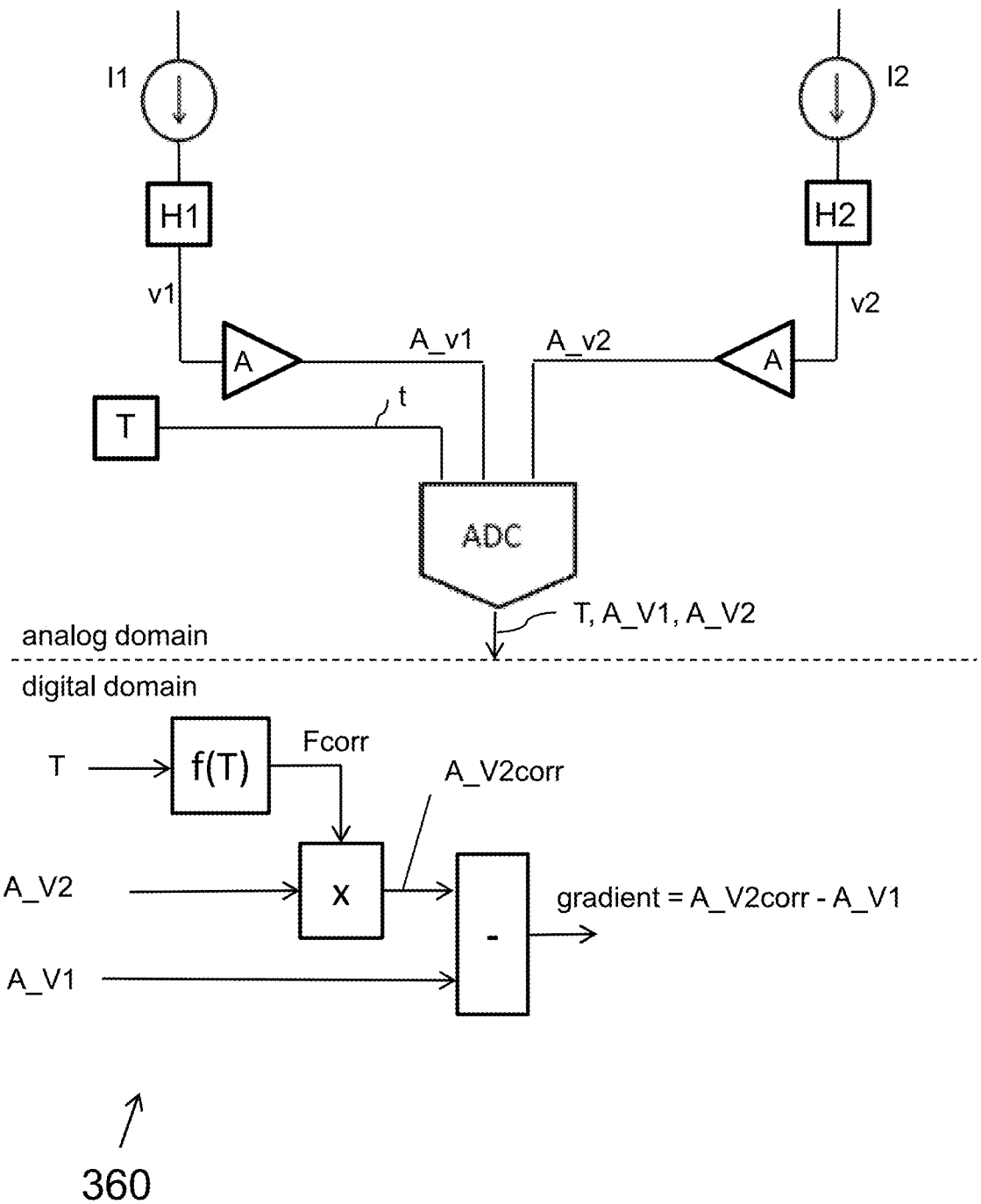
FIG. 3(f) shows a variant of the circuit of FIG. 1(b), according to an embodiment of the present invention, using a temperature sensor, and a multiplication and subtraction in the digital domain.
Figure 3G:
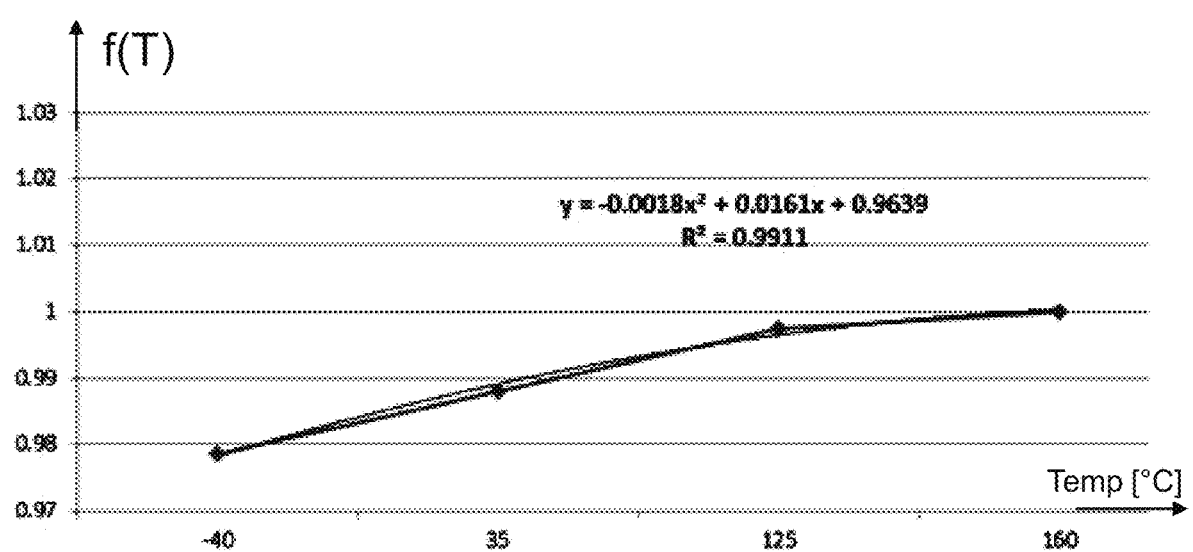
FIG. 3(g) shows an illustrative correction function as can be used in the embodiments of FIG. 3(b) to FIG. 3(f).

FIG. 3(f) shows a variant of the circuit of FIG. 3(b), according to another embodiment of the present invention, using a single temperature sensor, but without an adjustable current source, and without an adjustable amplifier gain. The main difference between the circuit of FIG. 3(f) and FIG. 3(b) is that the second current source is a predefined current source, and the second amplifier has a predefined gain. The second current I2 may be substantially the same as the first current I1, but that is not absolutely required. The second amplifier gain may be substantially equal to the first amplifier gain, but that is not absolutely required.

The DSP is configured for obtaining the digital temperature value T from the temperature sensor, and for determining a digital correction factor Fcorr as a function f(T) of the temperature.

The correction function f(T) for this case can for example be obtained by performing a calibration test at various temperatures. For each temperature, a constant magnetic field is applied, the value of ΔV1 and A_V2 is measured, and the value of the correction factor Fcorr is chosen such that the resulting gradient value is substantially equal to zero. This can be obtained by a simple calculation:

$Fcorr*A\_V2-A\_V1$ has to be=0, thus $Fcorr$ needs to be=$A\_V1/\_V2$.

During actual use of the device, the temperature is measured, a corresponding correction factor Fcorr is calculated or retrieved from the non-volatile memory, the value A_V1 and A_V2 are obtained from the ADC, the value of A_V2 is first multiplied with the correction factor Fcorr to obtain a corrected second digital value A_V2corr, and then a difference is calculated in the digital domain between A_V1 and A_V2corr to obtain the gradient.

In summary, FIG. 3(f) shows a magnetic sensor device 360 for measuring a magnetic field gradient, by subtracting two values A_V2corr, A_V1 in the digital domain, after multiplying the second digital value A_V2 with a correction factor Fcorr as a function of temperature.

All variations described for FIG. 3(b) can also be applied for FIG. 3(f).

FIG. 3(g) shows an illustrative correction function f(T) as may be used in the embodiment of FIG. 3(b), for a particular magnetic sensor device encapsulated in a particular package. It was found that a particular semiconductor die embedded in two different packages, may result in different correction functions, but the principles remain the same.

Looking back at the solutions proposed in FIG. 3(a) to FIG. 3(g) where a temperature was measured, and an adjustment of one biasing source or of one component or step in one signal path was performed (e.g. by the adjustable current source or the adjustable amplifier or in the digital domain), the skilled person will understand that it is of course also possible to adjust multiple components or steps in the second signal path, or even to adjust both signal paths, but such embodiments are more complex, and not preferred.

Figure 4A:
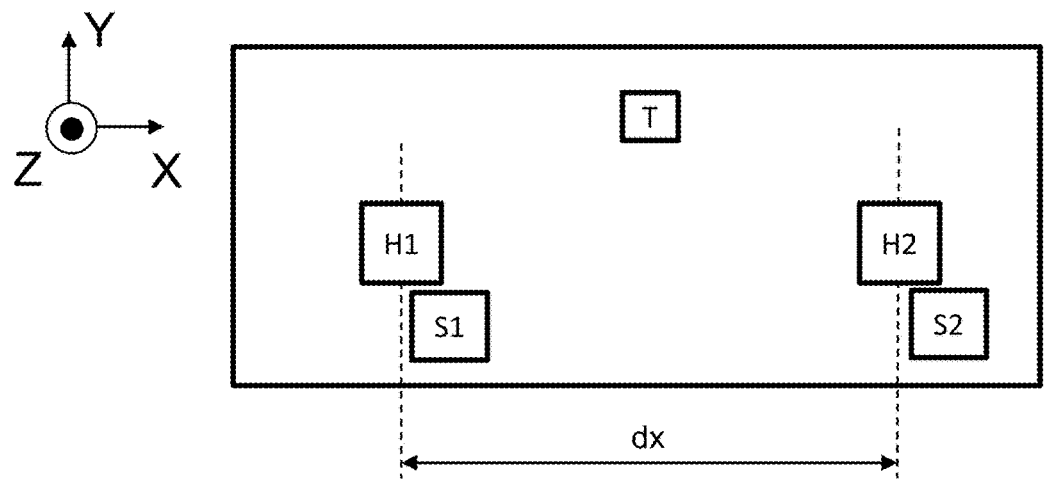
FIG. 4(a) shows a variant of the sensor arrangement of FIG. 1(a) with a temperature sensor and a differential stress sensor, which can also be seen as a variant of the sensor arrangement of FIG. 3(a) with a differential stress sensor, according to another embodiment of the present invention.
Figure 4B:
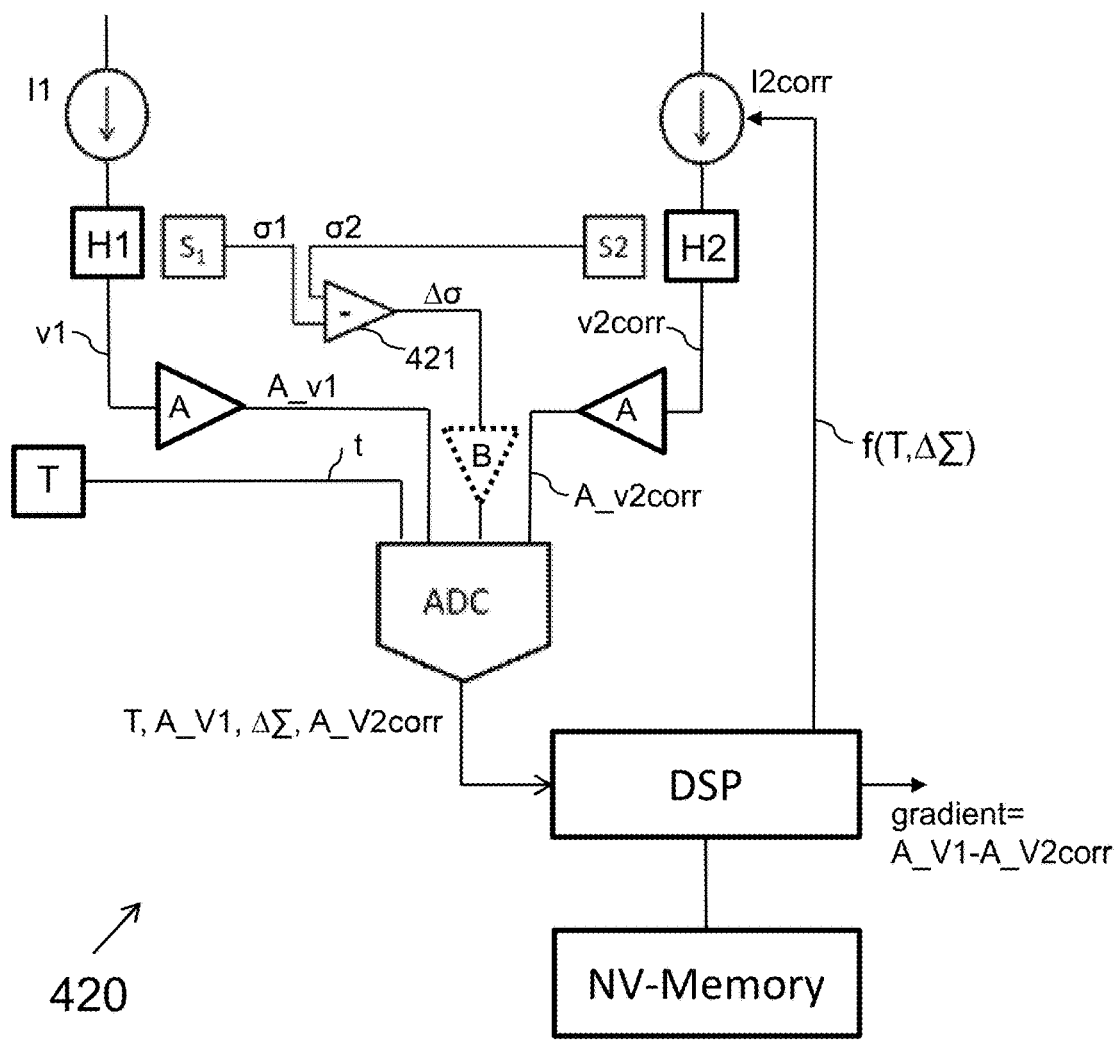
FIG. 4(b) to FIG. 4(f) show variants of the circuits of FIG. 3(b) to FIG. 3(f), furthermore using the differential stress signal, according to other embodiments of the present invention.

FIG. 4(a) and FIG. 4(b) show a variant of the sensor arrangement of FIG. 3(a) and FIG. 3(b) with the addition of a differential stress measurement circuit sensor, comprising: a first stress sensor S1 located near the first magnetic sensor H1 and configured for providing a first stress signal σ1, and a second stress sensor S2 located near the second magnetic sensor H2 and configured for providing a second stress signal σ2, and a subtraction circuit 421 for determining a difference between the first stress signal σ1 and the second stress signal σ2 to obtain said differential stress signal Δσ.

As can be seen in FIG. 4(b), the at least one analog-to-digital convertor ADC is further configured for digitizing the differential stress signal Δσ into a "differential stress value" ΔΣ (also referred to herein as "stress difference value"), optionally after amplification by a third amplifier B, and for providing this differential stress value ΔΣ to the digital processing circuit DSP.

The measurement of the gradient can for example be performed as follows:
a) first the temperature signal t and the differential stress signal Δσ are measured, optionally amplified, and digitized,
b) the DSP receives the digital values T and ΔΣ, and adjusts the second current I2 using a predefined function of these values T and ΔΣ,
c) then the first and second magnetic sensor signal v1, v2corr are measured, amplified and digitised,
d) then the DSP calculates the gradient by subtracting the first digital value A_V1 and the second digital value A_V2corr.

In order for this embodiment to work correctly, it is essential that the second current I2 is adjusted before the second magnetic sensor signal v2corr is amplified and digitized and sent to the DSP for further processing.

All variants described for FIG. 3(b) can also be applied for FIG. 4(b).

FIG. 4(c) to FIG. 4(f) show variants of the circuits of FIG. 3(c) to FIG. 3(f), furthermore comprising the differential stress sensor circuit described in FIG. 4(a) and FIG. 4(b). The principles of operation are similar to those described above, except that in the embodiments of FIG. 4(b) to FIG. 4(f), the predefined function is a function not only of temperature, but of temperature T and differential stress ΔΣ.

Figure 4C:
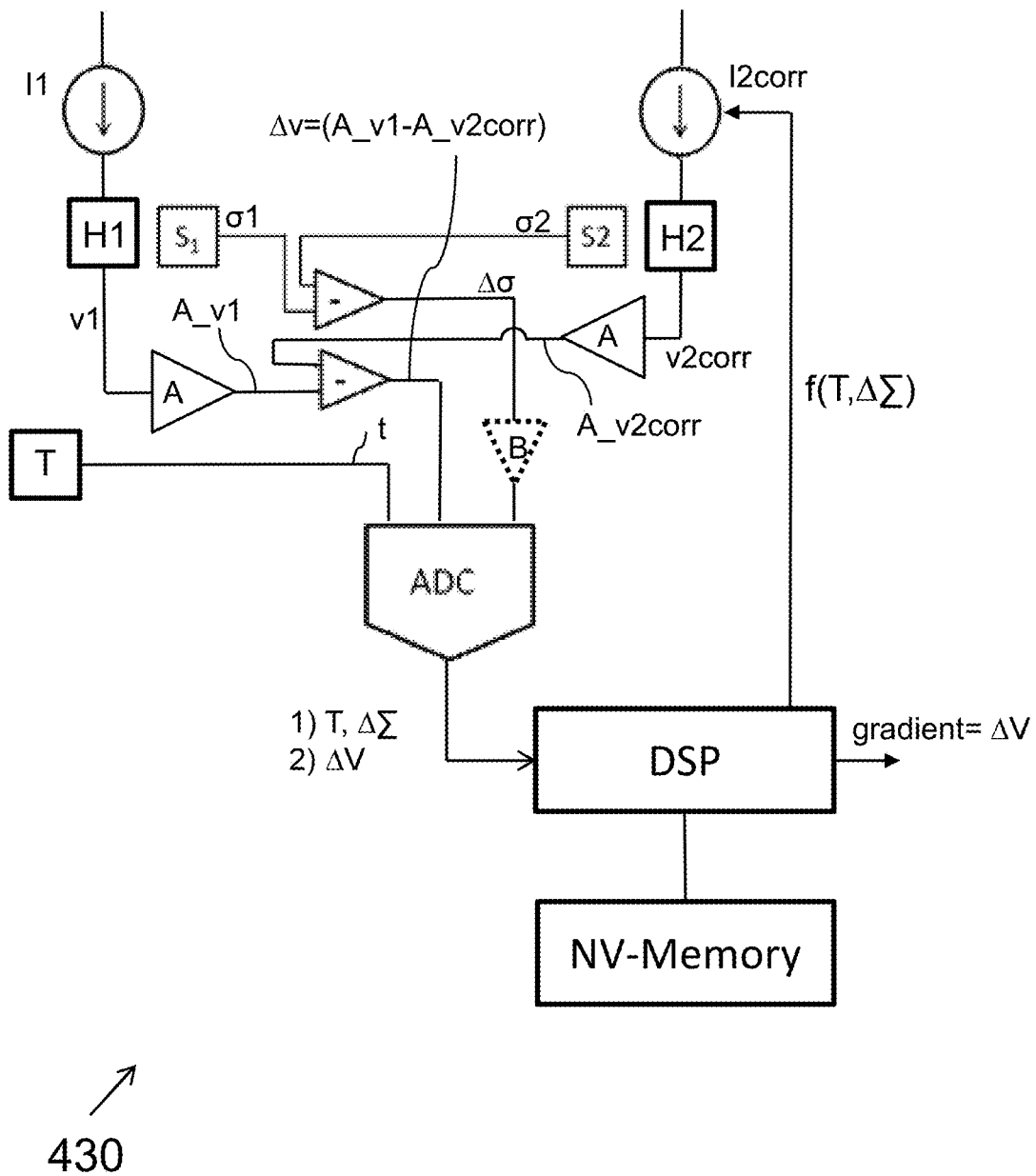

In brief, in FIG. 4(c) the temperature t and differential stress Δσ is measured and digitised T, ΔΣ and sent to the DSP, the DSP adjusts the second current source I2 using a predefined function of said temperature and differential stress f(T, ΔΣ), the first and second magnetic sensor signal v1, v2corr are amplified (yielding A_v1, A_v2corr) and subtracted in the analogue domain, and the difference signal Δv is digitised ΔV and sent to the DSP as the gradient.

Figure 4D:
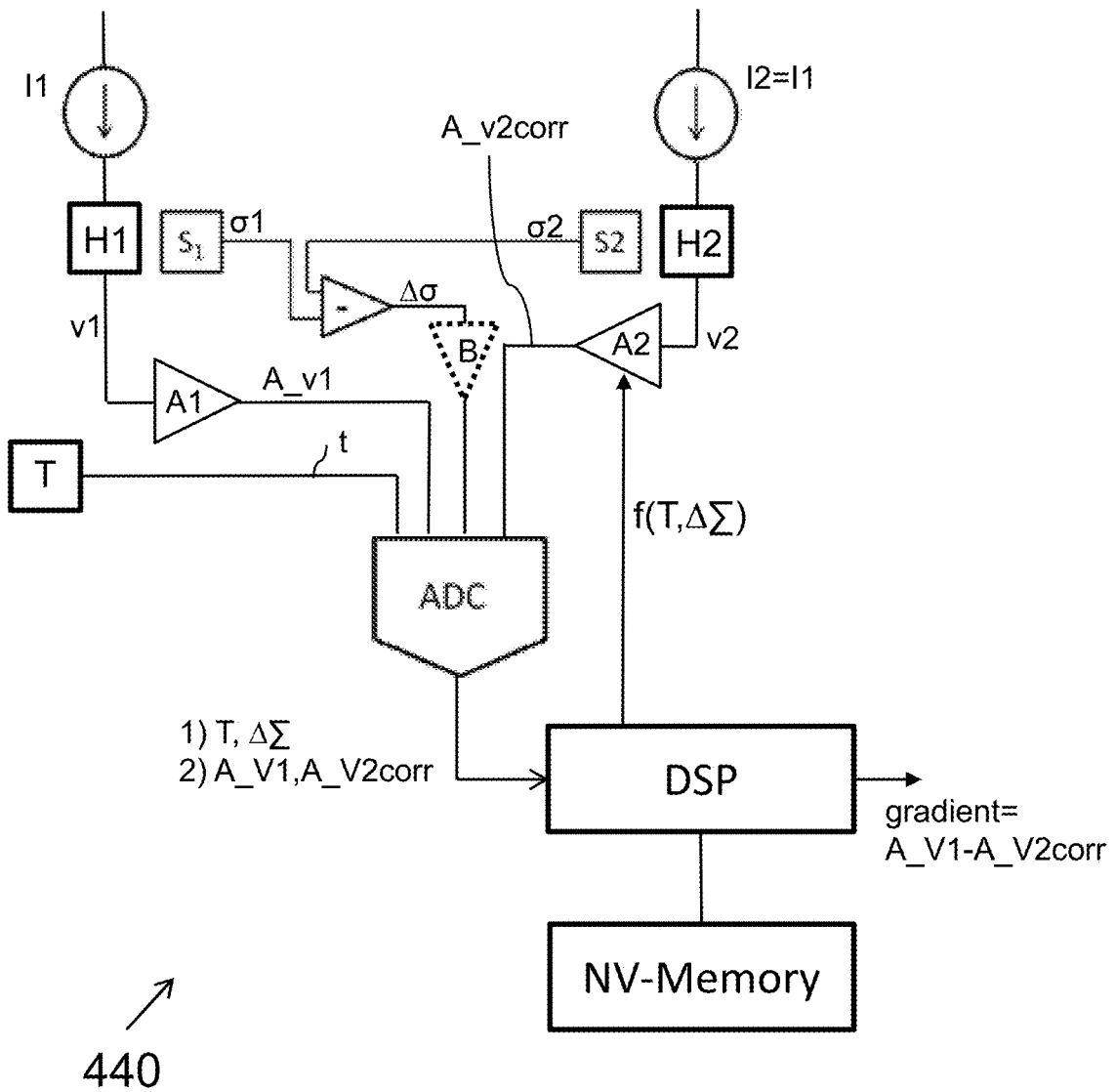

In brief, in FIG. 4(d) the temperature t and differential stress Δσ is measured and digitised T, ΔΣ and sent to the DSP, the DSP adjusts the second amplifier gain A2 using a predefined function of said temperature and differential stress f(T, ΔΣ), the first and second magnetic sensor signal v1, v2 are amplified A_v1, A_v2corr and digitized A_V1, A_V2corr, and sent to the DSP, the DSP subtracts these digital values to obtain the gradient.

Figure 4E:
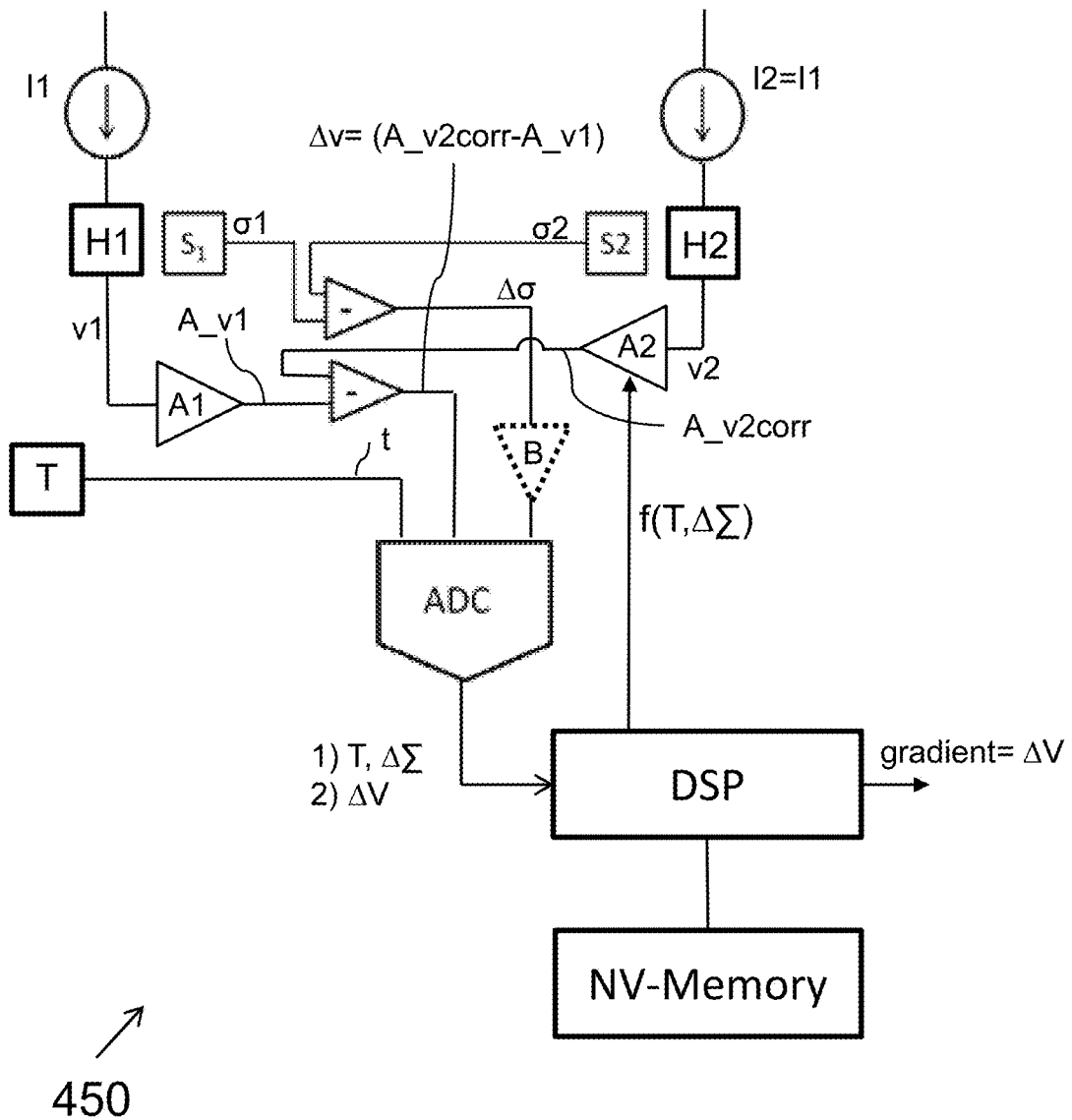

In brief, in FIG. 4(e) the temperature t and differential stress Δσ is measured and digitised T, ΔΣ and sent to the DSP, the DSP adjusts the second amplifier gain A2 using a predefined function of said temperature and differential stress f(T, ΔΣ), the first and second magnetic sensor signal v1, v2 are amplified (yielding A_v1, A_v2corr) and subtracted in the analog domain (yielding Δv), the difference signal Δv is digitised (yielding ΔV) and sent to the DSP as the gradient.

Figure 4F:
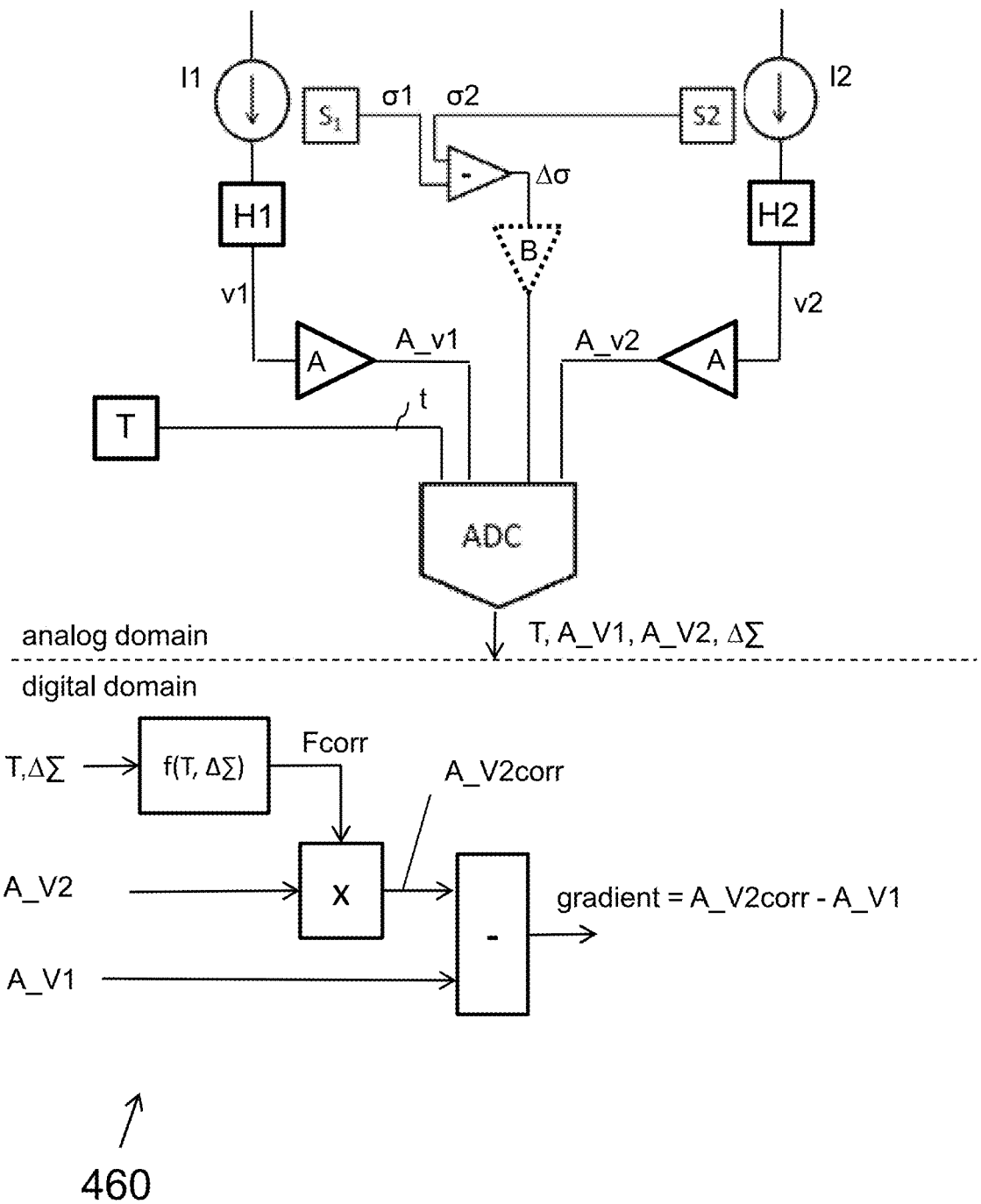

In brief, in FIG. 4(f) the temperature t and differential stress Δσ is measured and digitised T, ΔΣ and sent to the DSP, the DSP determines a correction factor Fcorr using a predefined function of said temperature and differential stress f(T, ΔΣ), the first and second magnetic sensor signal v1, v2 are amplified (yielding A_v1, A_v2) and digitized (yielding A_V1, A_V2) and sent to the DSP, the DSP multiplies the second digital signal A_V2 with the correction factor Fcorr to obtain A_V2corr, and then subtracts the first digital value A_V1 and the corrected second digital value A_V2corr in the digital domain, to obtain the gradient.

All variations described for FIG. 3(c) to FIG. 3(f) are also applicable to FIG. 4(c) to FIG. 4(f), e.g. using vertical Hall elements instead of horizontal Hall elements, using multiple ADCs, using a DSP with a DAC or PWM and LPF, biasing with a voltage source instead of a current source, using a microcontroller instead of a DSP, using a temperature sensor with digital output, etc.

Figure 5A:
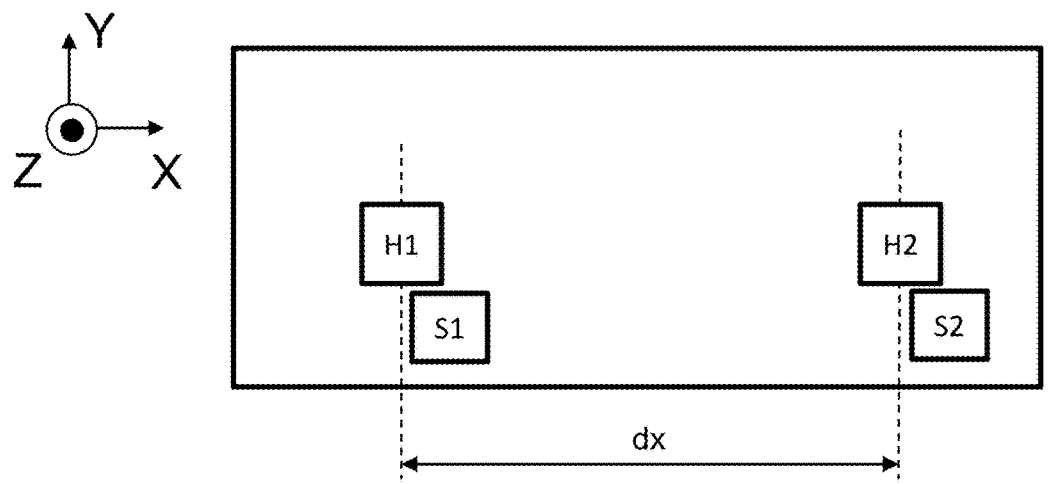
FIG. 5(a) shows a variant of the sensor arrangement of FIG. 4(a) without a temperature sensor, according to another embodiment of the present invention.
Figure 5B:
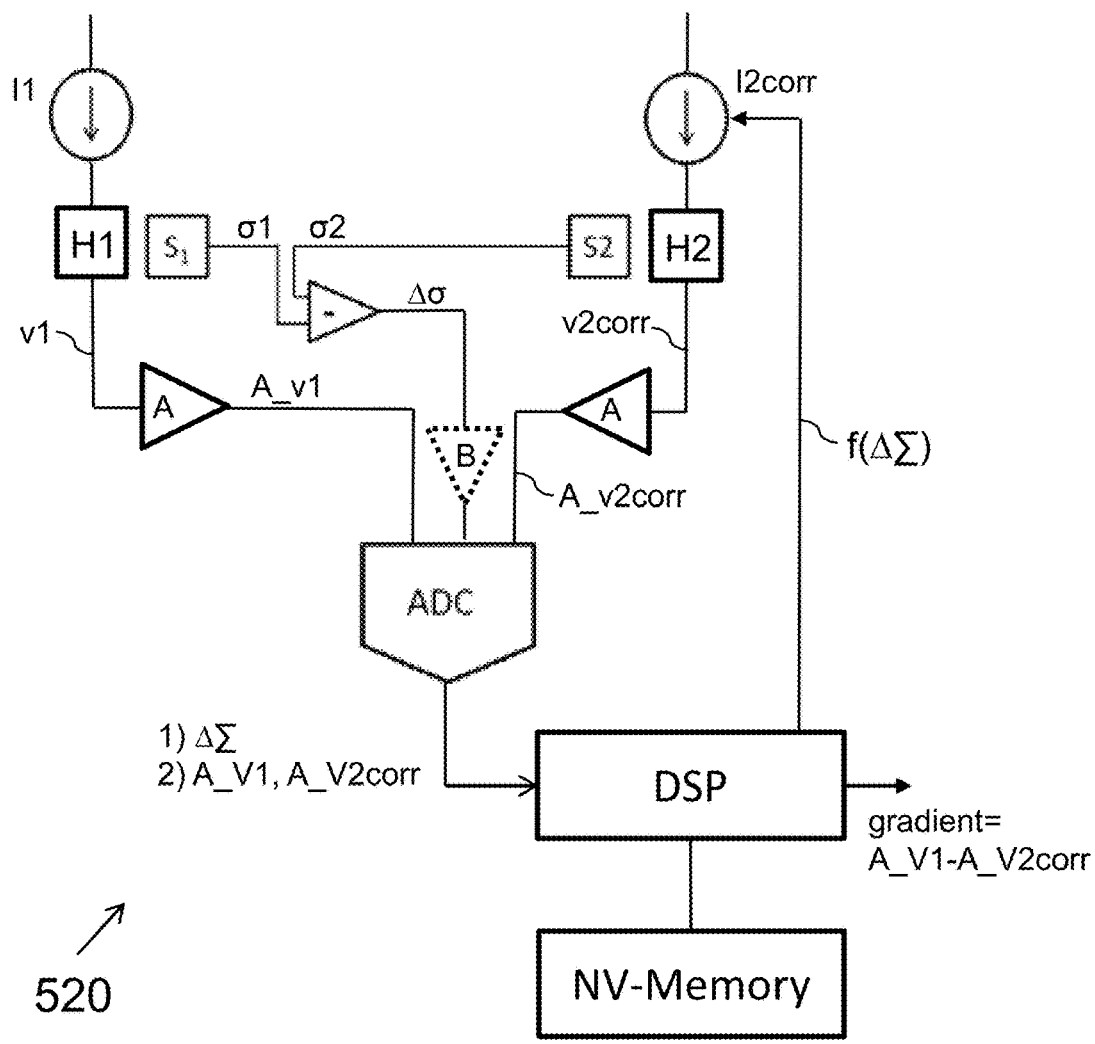
FIG. 5(b) to FIG. 5(f) show variants of the circuit of FIG. 4(b) to FIG. 4(f) without a temperature sensor. These circuit's can also be considered as variants of FIG. 3(b) to FIG. 3(f) with a differential stress sensor, according to other embodiments of the present invention.

FIG. 5(a) and FIG. 5(b) show a variant of the sensor arrangement and circuit of FIG. 4(a) and FIG. 4(b) with the differential stress measurement circuit, but without a temperature sensor, in the sense that the DSP does not explicitly use a temperature value to adjust the adjustable current source or the adjustable amplifier or in its calculation of the gradient. The working of this circuit 520 is similar to that of FIG. 4(b), except that no temperature is measured and digitised. A differential stress Δσ is measured and digitized, and the second current source I2 is adjusted using a function f(ΔΣ) of the differential stress ΔΣ but not of temperature.

FIG. 5(c) to FIG. 5(f) show variants of the circuit of FIG. 4(b) to FIG. 4(f) without a temperature sensor. These circuits can also be considered as variants of FIG. 3(b) to FIG. 3(f) with a differential stress sensor instead of a temperature sensor. The principles of operation are similar to those described above, except that the predefined function is a function of differential stress, not a function of temperature.

Figure 5C:
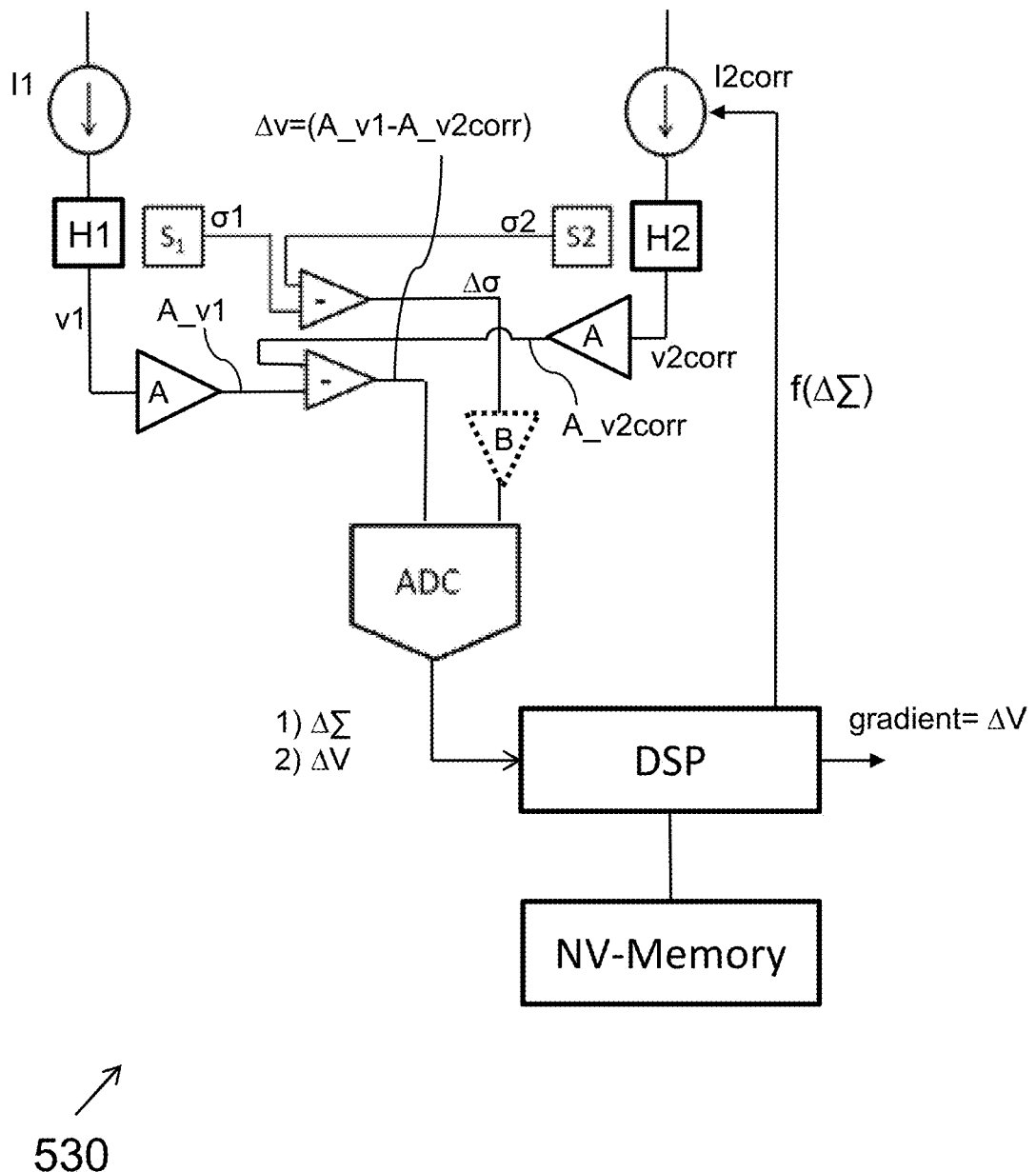

In brief, in FIG. 5(c) the differential stress Δσ is measured, optionally amplified, and digitised (yielding ΔΣ) and sent to the DSP, the DSP adjusts the second current source I2 using a predefined function f(ΔΣ) of the measured differential stress, then the first and second magnetic sensor signal v1, v2corr are amplified (yielding A_v1, A_v2corr) and subtracted (yielding Δv) in the analogue domain, and the difference signal Δv is digitised (yielding ΔV) and sent to the DSP as the gradient.

Figure 5D:
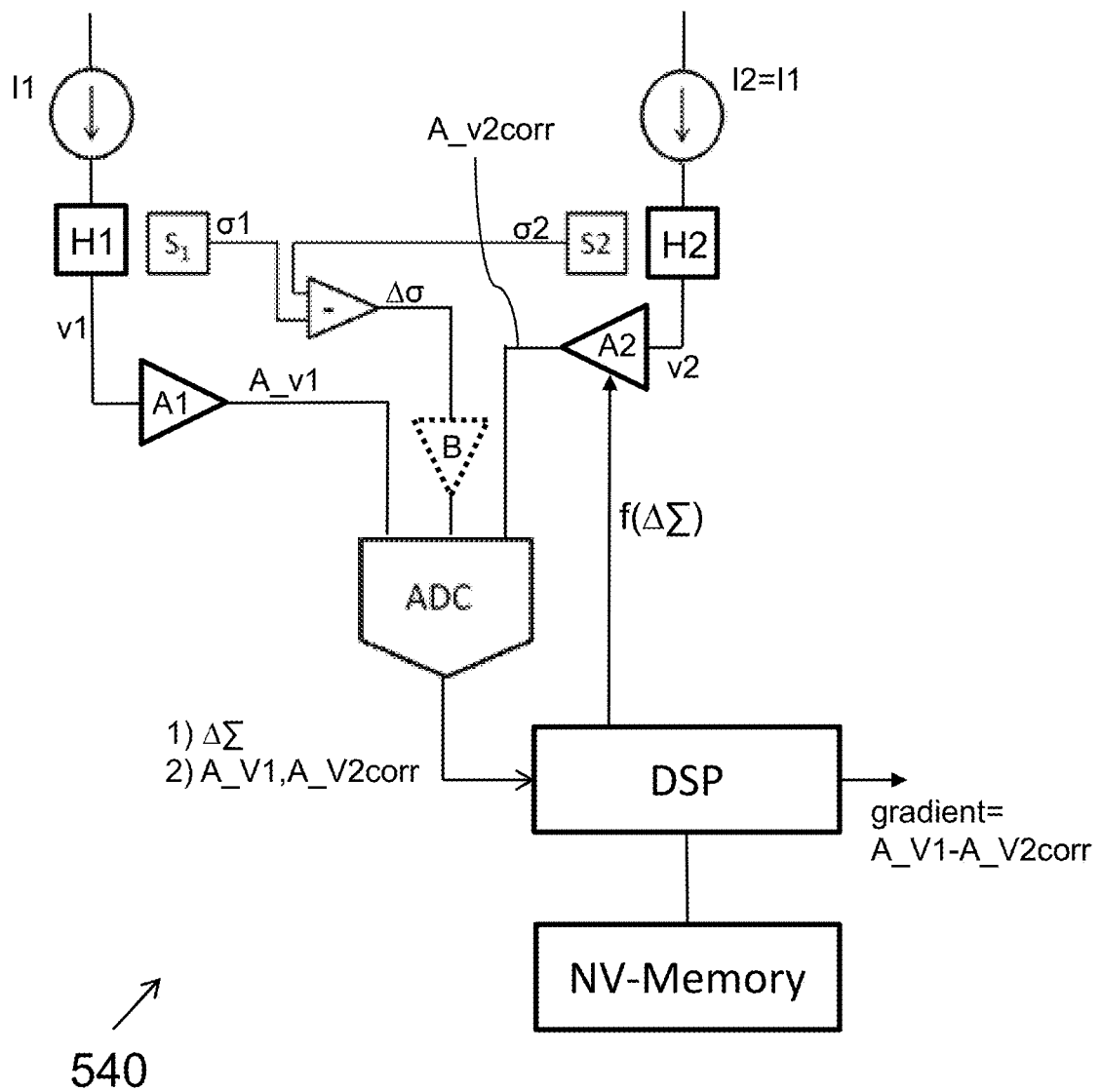

In brief, in FIG. 5(d) the differential stress Δσ is measured and digitised ΔΣ and sent to the DSP, the DSP adjusts the second amplifier gain A2 using a predefined function f(ΔΣ) of the measured differential stress, the first and second magnetic sensor signal v1, v2 are amplified (yielding A_v1, A_v2corr) and digitized (yielding A_V1, A_V2corr), and sent to the DSP, the DSP subtracts the first and second digital value A_V1, A_V2corr to obtain the gradient.

Figure 5E:
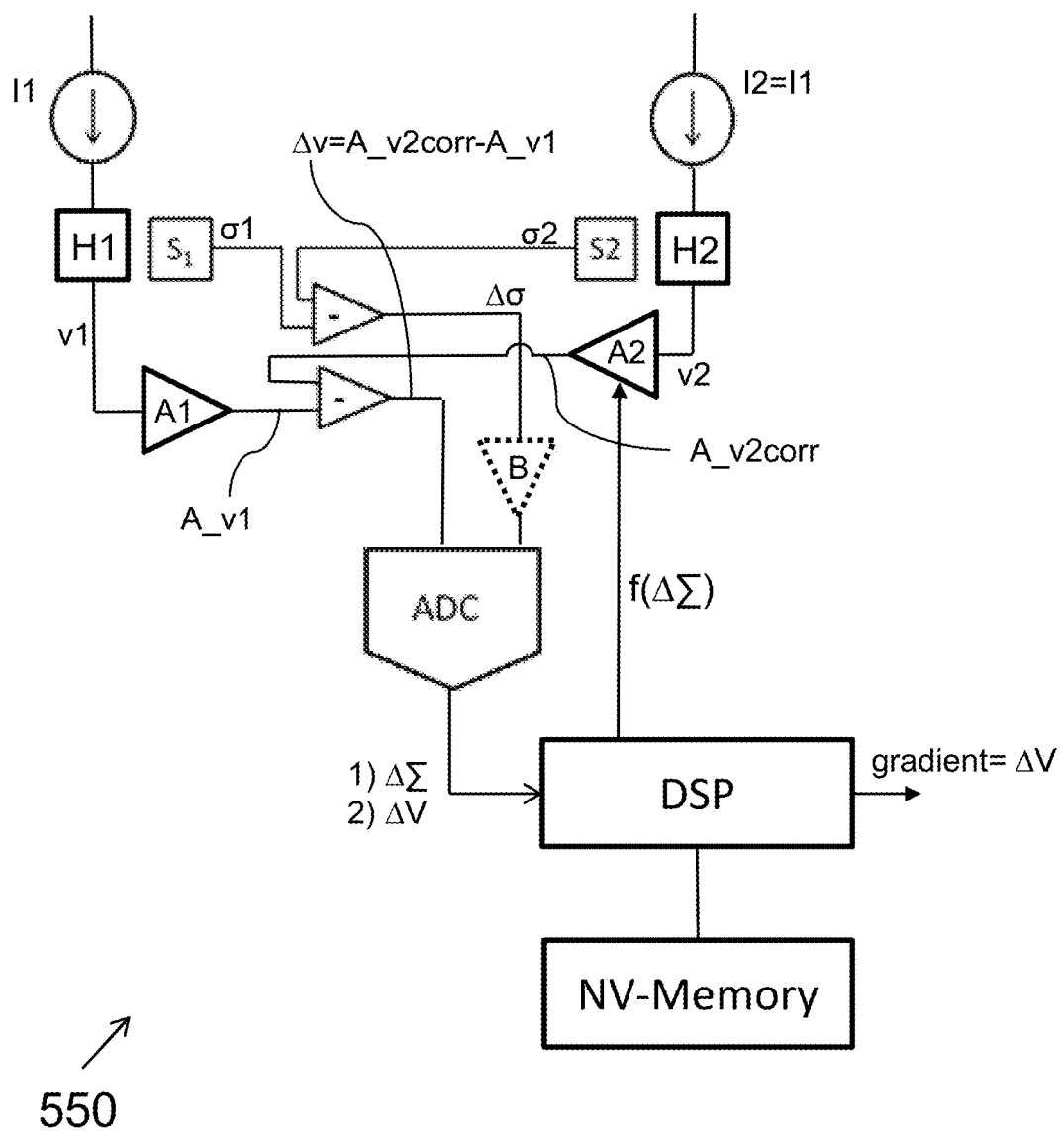

In brief, in FIG. 5(e) the differential stress Δσ is measured, optionally amplified, and digitised (yielding ΔΣ) and sent to the DSP, the DSP adjusts the second amplifier gain A2 using a predefined function f(ΔΣ) of the measured differential stress, the first and second magnetic sensor signals v1, v2 are amplified (yielding A_v1, A_v2corr) and subtracted (yielding Δv) in the analog domain, the difference signal Δv is digitised (yielding ΔV) and sent to the DSP as the gradient.

Figure 5F:
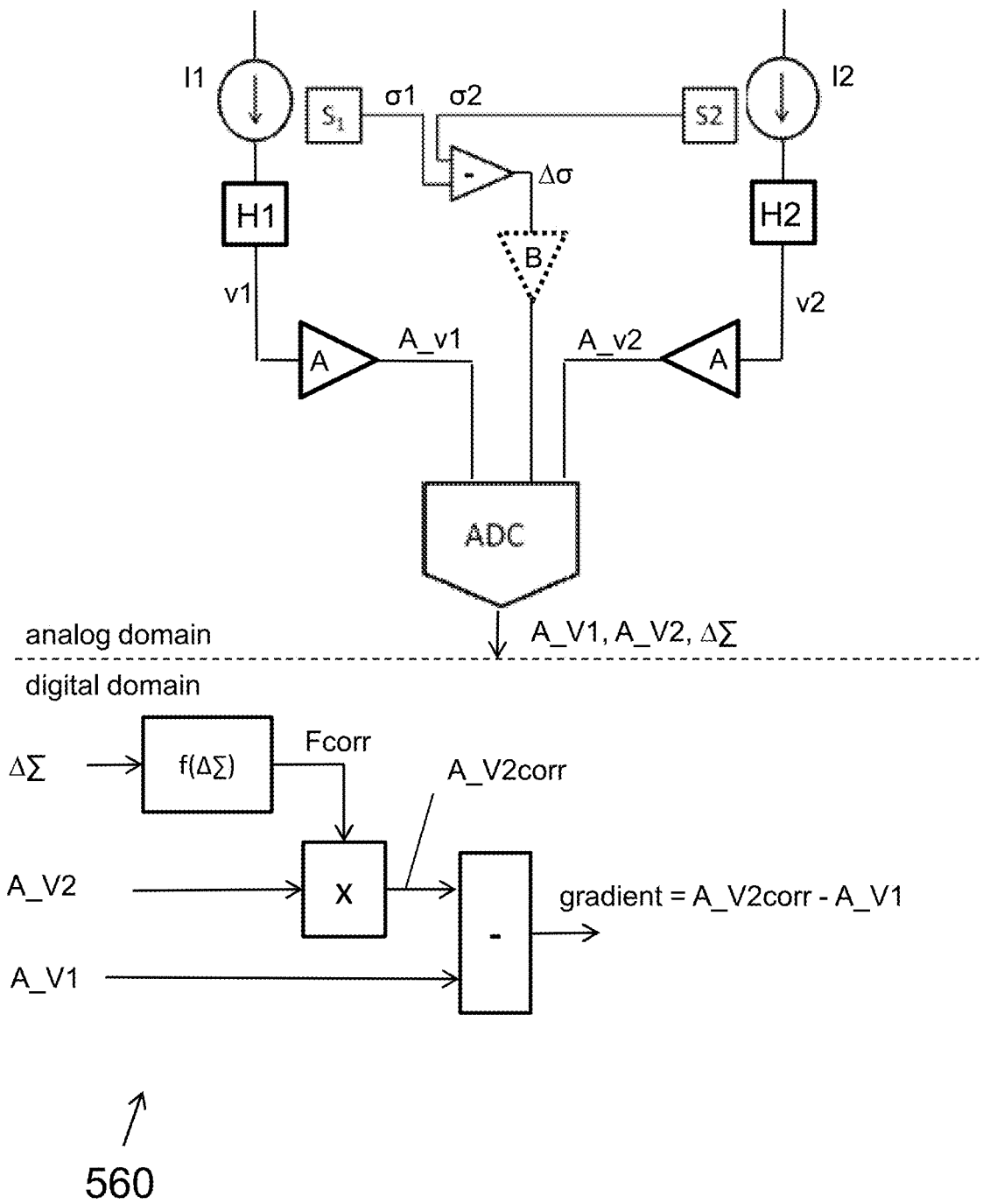

In brief, in FIG. 5(f) the differential stress Δσ is measured, optionally amplified, and digitised (yielding ΔΣ) and sent to the DSP, the DSP determines a correction factor Fcorr using a predefined function f(ΔΣ) of the measured differential stress, the first and second magnetic sensor signals v1, v2 are amplified (yielding A_v1, A_v2) and digitized (yielding A_V1, A_V2) and sent to the DSP, the DSP multiplies the second digital signal A_V2 with the correction factor Fcorr to obtain A_V2corr, and then subtracts the first digital value A_V1 and the corrected second digital value A_V2corr in the digital domain, to obtain the gradient.

All variants described for FIG. 3(b) to FIG. 3(f), except using a temperature sensor with digital output, are also applicable to FIG. 5(b) to FIG. 5(f), e.g. using vertical Hall elements instead of horizontal Hall elements, using multiple ADCs, using a DSP with a DAC or PWM and Low Pass Filter, biasing with a voltage source instead of a current source, using a microcontroller instead of a DSP, further scaling the gradient, etc.

Looking back at FIG. 3(a) to FIG. 5(f), it can be seen that the embodiments of FIGS. 3(a) to 3(g) have a temperature sensor but not the differential stress sensor, the embodiments of FIGS. 5(a) to 5(f) have a differential stress sensor but not a temperature sensor, and the embodiments of FIGS. 4(a) to 4(f) have both a differential stress sensor and a temperature sensor.

The rationale behind the embodiments of FIGS. 5(a) to 5(f) is that it may not be necessary to explicitly measure the temperature, because temperature variations will typically also cause stress variations due to thermal expansion or contraction of the materials, hence temperature variations will also (at least partially) be compensated when compensating for differential stress.

Likewise, the rationale behind the embodiments of FIGS. 3(a) to 3(g), is that stress variations caused by temperature variations will automatically be compensated for when compensating for temperature.

The embodiments of FIG. 4(a) to FIG. 4(f), having both a temperature sensor and a differential stress measurement circuit are capable of compensating for mechanical stress which is not caused by temperature variations but by other reasons, for example by mechanical bending of a printed circuit board (PCB) on which the device is mounted. The embodiments of FIG. 4(a) to FIG. 4(f) may therefore be more robust against long-term drift.

So far, only magnetic sensor structures are described wherein each magnetic sensor consists of a single horizontal Hall plate, or a single vertical Hall plate. But the present invention is not limited thereto and also works for other magnetic sensors, for example for magnetic sensors containing magneto resistive elements (not shown).

In FIG. 6(a) to FIG. 8(c) the principles of the present invention will also be described for a sensor device comprising a so-called "dual disk structure", where each magnetic sensor consists of two horizontal Hall plates arranged on opposite sides of an integrated magnetic concentrator (IMC).

The IMC disks typically have a diameter of about 200-250 micron, and are typically spaced apart over a distance from about 1.0 to about 3.0 mm, e.g. equal to about 2.0 mm, but of course the present invention is not limited hereto, and other dimensions can also be used. The principles described above can easily be applied to such a sensor device, by assuming that all elements belonging to one magnetic sensor have the same temperature and experience the same mechanical stress.

FIG. 6(a) shows a sensor arrangement 600 having two magnetic sensors, each magnetic sensor comprising two horizontal Hall elements arranged on opposite sides of an integrated magnetic concentrator IMC.

The first magnetic sensor, consisting of IMC1, H1a and H1b is located at a first sensor location xL. The second magnetic sensor, consisting of IMC2, H2a and H2b is located on a second sensor position xR. The first sensor location and the second sensor location are spaced apart by a distance dx along the X-axis. The four horizontal Hall elements are located on the X-axis.

This sensor structure is described in other patent applications, for example in US2018372475A1 and in EP19193068.4, both of which are incorporated herein by reference in their entirety, but for the purposes of the present invention it suffices to know that:

the magnetic field component BxL at the first sensor location XL and oriented in the X direction parallel to the substrate, can be calculated as (or proportional to): BxL=(v1b−v1a), where v1b is the signal provided by H1b, and v1a is the signal provided by H1a.

the magnetic field component BzL at the first sensor location XL and oriented in the Z direction perpendicular to the substrate, can be calculated as (or proportional to): BzL=(v1b+v1a), the magnetic field component BxR at the second sensor location XR and oriented in the X direction parallel to the substrate, can be calculated as (or proportional to): BxR=(v2b−v2a), where v2b is the signal provided by H2b, and v2a is the signal provided by H2a.

the magnetic field component BzR at the second sensor location XR and oriented in the Z direction perpendicular to the substrate, can be calculated as (or proportional to): BzR=(v2b+v2a), the gradient dBx/dx of the magnetic field component Bx oriented parallel to the substrate along the X axis, can be calculated as: dBx/dx~ΔBx=BxR−BxL, where the symbol ~ means "is proportional to", and the gradient dBz/dx of the magnetic field component Bz oriented perpendicular to the substrate along the X axis, can be calculated as: dBz/dx~ΔBz=BzR−BzL.

In the light of the present invention, the skilled reader having the benefit of the present disclosure, will understand that the gradient signals dBx/dx and dBz/dx calculated in this way may suffer from a strayfield error signal, as described by formula [8] or [8b] described above, in case of a sensitivity mismatch between the two sensors structures.

FIG. 6(b) illustrates how the principles described in relation to FIG. 3(b) can be applied to the sensor structure of FIG. 6(b) to reduce or substantially eliminate the strayfield error signal.

It is noted that the sensor structure of FIG. 6(a) contains a single temperature sensor for measuring a temperature of the substrate. As mentioned above, the temperature sensor can be located anywhere on the substrate, for example at an equal distance from the first magnetic sensor and the second magnetic sensor.

It is further noted that the first magnetic sensor is indicated with a dotted line surrounding the two Hall elements H1a and H1b, the outputs of which are combined, e.g. subtracted in block 611 to form a first magnetic sensor signal v1 indicative of the magnetic field component BxL.

Likewise, the second magnetic sensor is indicated with a dotted line surrounding the two Hall elements H2a and H2b, the outputs of which are combined, e.g. subtracted in block 612 to form a second magnetic sensor signal v2 indicative of the magnetic field component BxR.

For completeness it is mentioned that the sensitivities of the two Hall plates H1a and H1b are typically (statically) matched to each other in known manners (e.g. using I1 and a current mirror of I1, and/or trimming), and that the sensitivities of the two Hall plates H2a and H2b are typically also (statically) matched to each other in known manners. But in addition to the prior art, according to the principles of the present invention, the sensitivity of the first sensor as a whole is furthermore dynamically matched to the sensitivity of the second sensor as a whole as a function of temperature and/or as a function of differential stress.

By comparison of FIG. 6(b) and FIG. 3(b), the skilled reader will understand that, using the topology of FIG. 6(a) and the circuit of FIG. 6(b), the gradient dBx/dx can for example be determined as follows:

a) first the temperature signal t is measured, and digitized (into value T), b) the DSP receives the digital value T, and adjusts the biasing current of the second sensor (here: the biasing current I3 and the biasing current I4) using a predefined function of the value T, c) then the first and second magnetic sensor signal v1, v2 are measured, amplified and digitised, d) then the DSP calculates the gradient by subtracting the first digital value A_V1 and the second digital value A_V2corr.

The variants described for FIG. 3(b) to FIG. 3(f), (except using vertical Hall elements), are also applicable to FIG. 6(b), e.g. using multiple ADCs, DSP with a DAC or PWM+ Low Pass Filter, biasing with a voltage source instead of a current source, using a microcontroller instead of a DSP, further scaling the gradient, etc.

In yet another variant of FIG. 6(b), the signals v1a and v1b generated by H1a and H1b are added in block 611 (instead of being subtracted), in which case the signal v1 is indicative of BzL (instead of BxL), and the signals v2a and v2b generated by H2a and H2b are added in block 612 (instead of being subtracted), in which case the signal v2 is indicative of BzR (instead of BxL), and the gradient being measured is dBz/dx (instead of dBx/dx).

FIG. 6(c) shows a circuit 620 which can be seen as a variant of the circuit 610 of FIG. 6(b) using the same principles as explained in FIG. 3(d). Using the topology of FIG. 6(a) and the circuit of FIG. 6(c), the gradient dBx/dx can for example be calculated as follows:
a) first the temperature signal t is measured, and digitized,
b) the DSP receives the digital value T, and adjusts the gain of the second amplifier A2 using a predefined function of the value T,
c) then the first and second magnetic sensor signal v1, v2 are measured, amplified and digitised,
d) then the DSP calculates the gradient by subtracting the first digital value A_V1 and the second digital value A_V2corr.

The variants described for FIG. 6(b) are also applicable to FIG. 6(c).

In yet another or further variant of FIG. 6(b) or FIG. 6(c), the amplified signals A_v1 and A_v2corr are subtracted in the analog domain, and the difference signal Δv is amplified and digitized, and further processed by the DSP in a manner similar as described in FIG. 3(c) or FIG. 3(e). As mentioned above, this embodiment provides a higher signal to noise ratio (SNR), because the range of the ADC can be used for digitising the gradient signal rather than the component signals.

In yet another or further variant of FIG. 6(b) and FIG. 6(c) (not shown), the biasing source of the second sensor (thus: I3 and I4) are not controlled by the DSP, but use e.g. a predefined current I3 (typically generated by a temperature compensated current source) and a predefined current I4, e.g. reproduced from I3 using a current mirror, and the signals v1, v2 are amplified and digitized, and the values A_V1 and A_V2 are provided to the DSP, and the DSP first corrects the second digital value A_V2 in the digital domain with a correction factor Fcorr using a predefined function of temperature, before subtracting the first digital value A_V1 and the corrected second digital value A_V2corr, in a manner similar as described in FIG. 3(f).

FIG. 7(a) shows a variant of the sensor arrangement of FIG. 6(a) further comprising a first mechanical stress sensor S1 for measuring mechanical stress of the first sensor (comprising: IMC1, H1a, H1b) and a second mechanical stress sensor S2 for measuring mechanical stress of the second sensor (comprising: IMC2, H2a, H2b). The stress sensors S1 may be located adjacent IMC1, or under IMC1. Likewise, the stress sensor S2 may be located adjacent IMC2, or under IMC2.

FIG. 7(b) shows a circuit 710 similar to that of FIG. 6(b), with the addition of a differential stress sensor circuit, configured for providing a differential stress signal Δσ, which is digitized by the ADC and further processed by the DSP in a manner similar as described in FIG. 4(b), taking into account that "adjusting the second biasing source" in this case means adjusting the current source I3 and I4 using a predefined function f(T, ΔΣ) of temperature and differential stress.

FIG. 7(c) shows a circuit 720 similar to that of FIG. 6(c), with the addition of a differential stress sensor circuit, configured for providing a differential stress signal Δσ, which is digitized by the ADC and further processed by the DSP in a manner similar as described in FIG. 4(d), where the second amplifier gain is adjusted using a predefined function f(T, ΔΣ) of temperature T and differential stress ΔΣ.

The variants described for FIG. 6(b) and FIG. 6(c) are also applicable to FIG. 7(b) and FIG. 7(c), for example, an embodiment similar to FIG. 4(c) where the magnetic sensor signals v1 and v2 are subtracted in the analog domain, and the biasing source of the second magnetic sensor (thus I3 and I4) are adjusted using a predefined function f(T, ΔΣ) of temperature and differential stress, and for example an embodiment similar to FIG. 4(e) where the magnetic sensor signals v1 and v2 are subtracted in the analog domain, and the second amplifier gain is adjusted using a predefined function f(T, ΔΣ) of temperature and differential stress, and for example an embodiment similar to FIG. 4(f) where the biasing source of the second magnetic sensor contains predefined (not adjustable) current sources I3 and I4, and where the magnetic sensor signals v1, v2 are amplified and digitized, and the values A_V1 and A_V2 are provided to the DSP, and the DSP first corrects the second digital value A_V2 in the digital domain with a correction factor Fcorr using a predefined function f(T, ΔΣ) of temperature and differential stress, before subtracting the first digital value A_V1 and the corrected second digital value A_V2corr, in a manner similar as described in FIG. 4(f).

FIG. 8(a) shows a variant of the sensor arrangement of FIG. 7(a) without the temperature sensor, and FIG. 8(b) and FIG. 8(c) show variants of the circuits of FIG. 7(b) and FIG. 7(c) without the temperature sensor.

The variants described for FIG. 7(b) and FIG. 7(c) are also applicable to FIG. 8(b) and FIG. 8(c), for example, an embodiment similar to FIG. 4(c) where the magnetic sensor signals v1 and v2 are subtracted in the analog domain, and the biasing source of the second magnetic sensor (thus I3 and I4) are adjusted using a predefined function f(ΔΣ) of the measured differential stress, and for example an embodiment similar to FIG. 4(e) where the magnetic sensor signals v1 and v2 are subtracted in the analog domain, and the second amplifier gain is adjusted using a predefined function f(ΔΣ) of the measured differential stress, and for example an embodiment similar to FIG. 4(f) where the biasing source of the second magnetic sensor contains predefined (not adjustable) current sources I3 and I4, and where the magnetic sensor signals v1, v2 are amplified and digitized, and the values A_V1 and A_V2 are provided to the DSP, and the DSP first corrects the second digital value A_V2 in the digital domain with a correction factor Fcorr using a predefined function f(ΔΣ) of the measured differential stress, before subtracting the first digital value A_V1 and the corrected second digital value A_V2corr, in a manner similar as described in FIG. 4(f).

In FIG. 3(a) to FIG. 8(c) several sensor structures and methods have been described for determining a gradient of a magnetic field in a manner which reduces the influence of a strayfield signal, by dynamically adjusting a sensitivity or a gain of one signal path relative to the other. In what follows, exemplary systems will be described in which a (single) gradient measurement can be used.

In FIG. 9(a) to FIG. 9(d) methods will be described for determining a single magnetic field gradient.

Figure 9A:
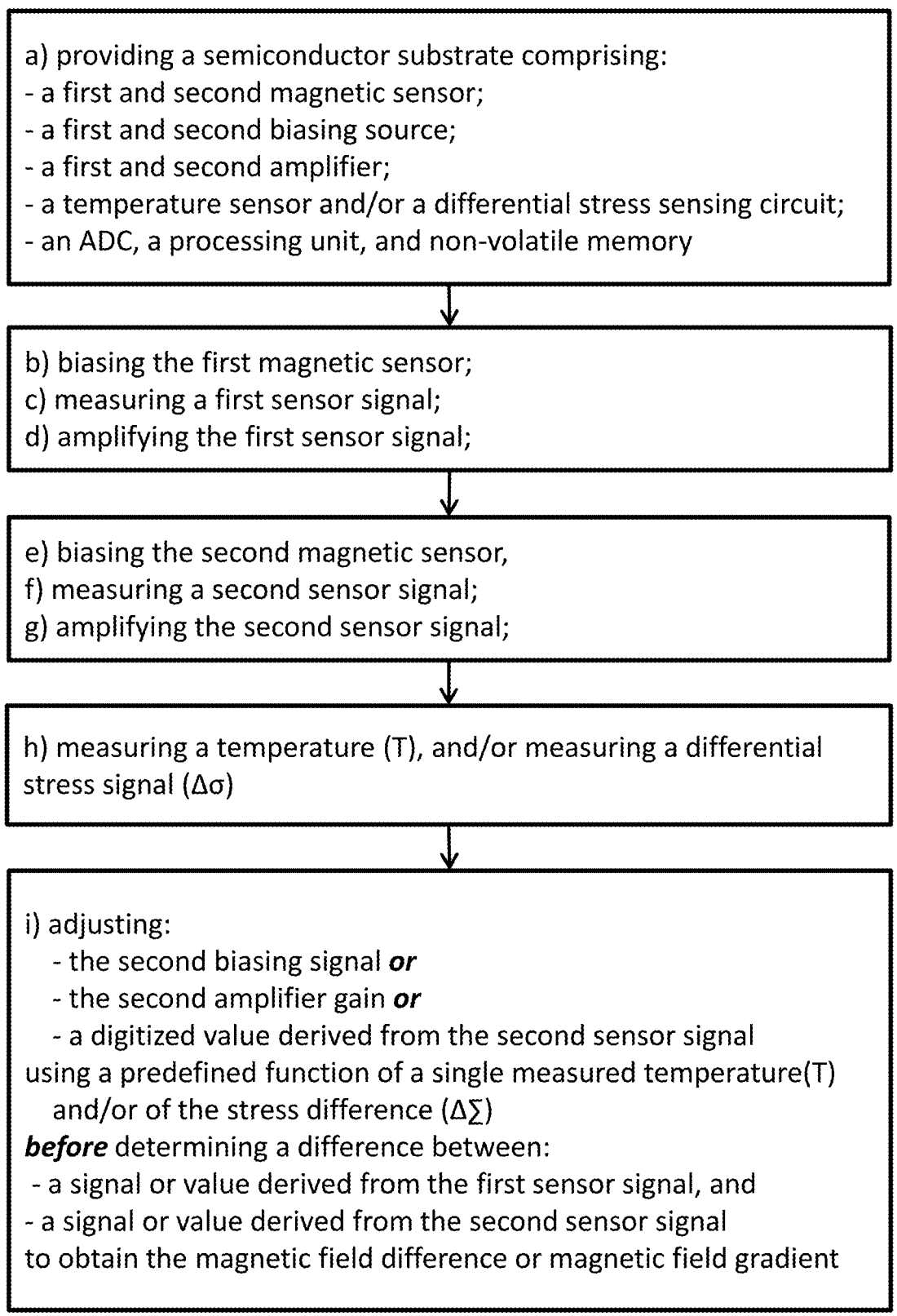
FIG. 9(a) shows a generic flow-chart illustrating methods of determining a magnetic field gradient or a magnetic difference signal, as can be used in embodiments of the present invention.

FIG. 9(a) shows a generic flow-chart illustrating methods of determining a gradient signal as can be used in embodiments of the present invention. The method 900 comprises the steps of:

a) providing a semiconductor substrate comprising:
   a first and second magnetic sensor, spaced apart along a predefined axis;
   a first and second biasing source (e.g. a first and a second current source);
   a first and second amplifier;
   a temperature sensor and/or a differential stress sensing circuit;
(e.g. a temperature sensor but no differential stress sensing circuit; or a differential stress sensing circuit but no temperature sensor; or both a temperature sensor and a differential stress sensing circuit)
   at least one ADC, a processing unit, and non-volatile memory;
b) biasing the first magnetic sensor;
c) measuring a first magnetic sensor signal;
d) amplifying the first magnetic sensor signal;
e) biasing the second magnetic sensor,
f) measuring a second magnetic sensor signal;
g) amplifying the second magnetic sensor signal;
h) measuring a temperature (T) and/or a differential stress signal ($\Delta\sigma$)
i) adjusting:
   the second biasing signal or
   the second amplifier gain or
   a digitized value derived from (e.g. derived solely from) the second sensor signal
   using a predefined function of a single measured temperature(T) and/or differential stress ($\Delta\Sigma$)
(e.g. using a predefined function f(T) of a single measured temperature T, or using a predefined function f($\Delta\Sigma$) of the differential stress, or using a predefined function f(T, $\Delta\Sigma$) of a single measured temperature and differential stress)
   before determining a difference between:
     a signal or value derived from the first magnetic sensor signal, and
     a signal or value derived from the second magnetic sensor signal
   to obtain the magnetic field difference or magnetic field gradient.

While the formulation of FIG. 9(a) is compact, the different steps are not listed in chronological order, and may therefore not be immediately recognizable. For this reason, three somewhat more detailed methods are provided in FIG. 9(b) to FIG. 9(d).

Figure 9B:
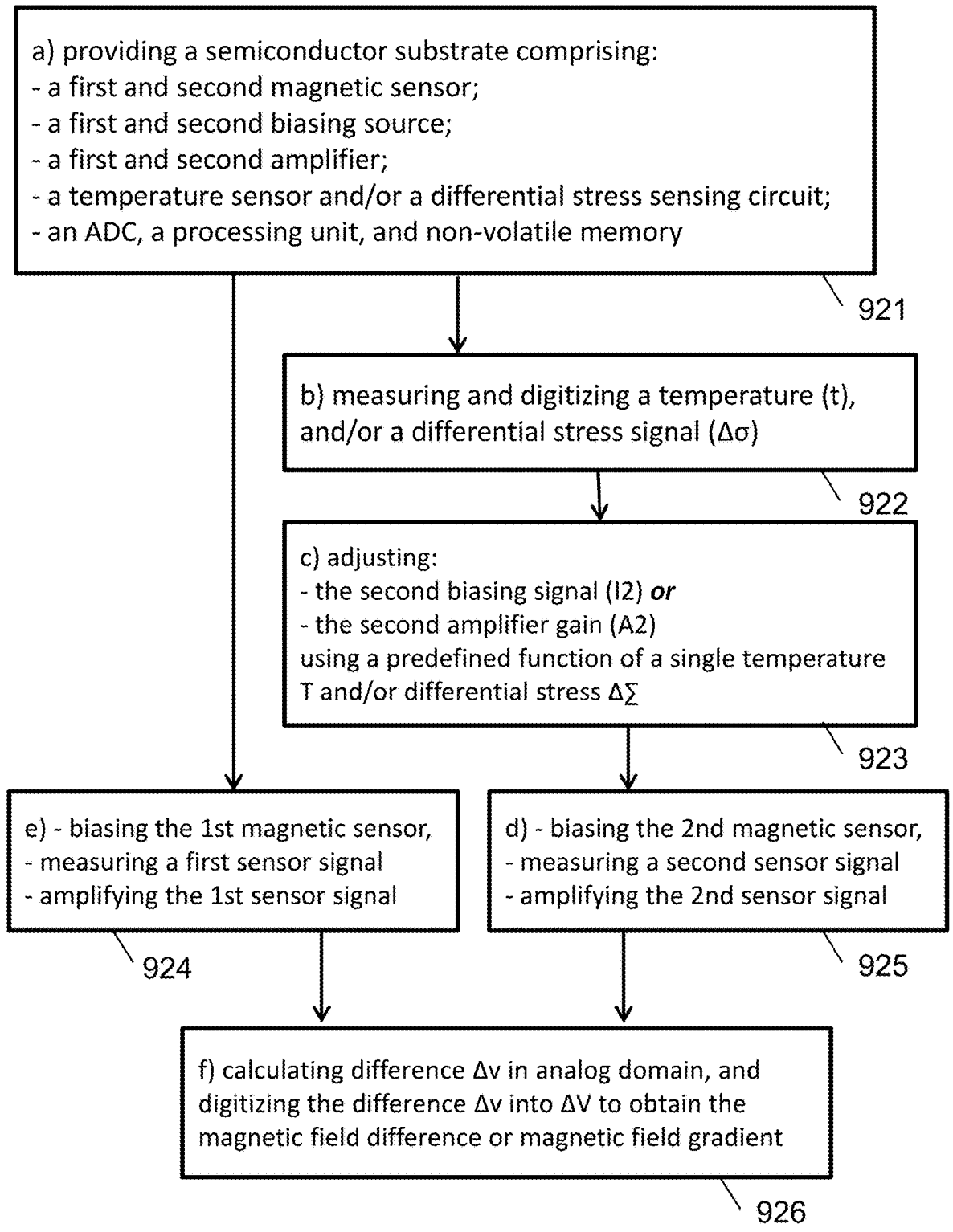
FIG. 9(b) shows a more detailed version of the method of FIG. 9(a), for the case where the second biasing source or the second amplifier gain is adjusted as a function of a single temperature and/or differential stress, and where the sensor signals are subtracted in the analog domain, and then digitized.

FIG. 9(b) shows a flow-chart illustrating methods which can be used in embodiments of the present invention, where the second biasing source or second amplifier gain is adjusted, and where a difference between the magnetic sensor signals is calculated in the analog domain, e.g. as shown in FIG. 3(c), FIG. 3(e), FIG. 4(c), FIG. 4(e), FIG. 5(c), and FIG. 5(e). The flow-chart of FIG. 9(b) may be easier to understand than that of FIG. 9(a), because the steps are listed in chronological order, albeit that some steps can be performed in parallel.

The method 920 comprises the steps of:
a) providing a semiconductor substrate comprising:
   a first and second magnetic sensor, spaced apart along a predefined axis;
   a first and second biasing source;
   a first and second amplifier;
   a temperature sensor and/or a differential stress sensing circuit;
   an ADC, a processing unit, and a non-volatile memory;
b) after step a,
   measuring and digitizing a temperature signal (t) and/or measuring and digitizing a differential stress signal ($\Delta\sigma$);
c) after step b), adjusting at least one of:
   the second biasing signal;
   the second amplifier gain;
   using a predefined function of a single temperature and/or differential stress;
(e.g. using a predefined function f(T) of a single measured temperature T, or using a predefined function f($\Delta\Sigma$) of the measured differential stress, or using a predefined function f(T, $\Delta\Sigma$) of a single measured temperature and the measured differential stress)
d) after step c)
   biasing the second magnetic sensor;
   measuring a second sensor signal;
   amplifying the second sensor signal;
e) after step a)
   biasing the first magnetic sensor;
   measuring a first magnetic sensor signal;
   amplifying the first magnetic sensor signal;
f) after step d) and step e),
   calculating a difference $\Delta v$ in the analog domain between the first and the second magnetic sensor signal, and
   digitizing the difference $\Delta v$ into $\Delta V$, yielding the magnetic field difference or gradient.

Figure 9C:
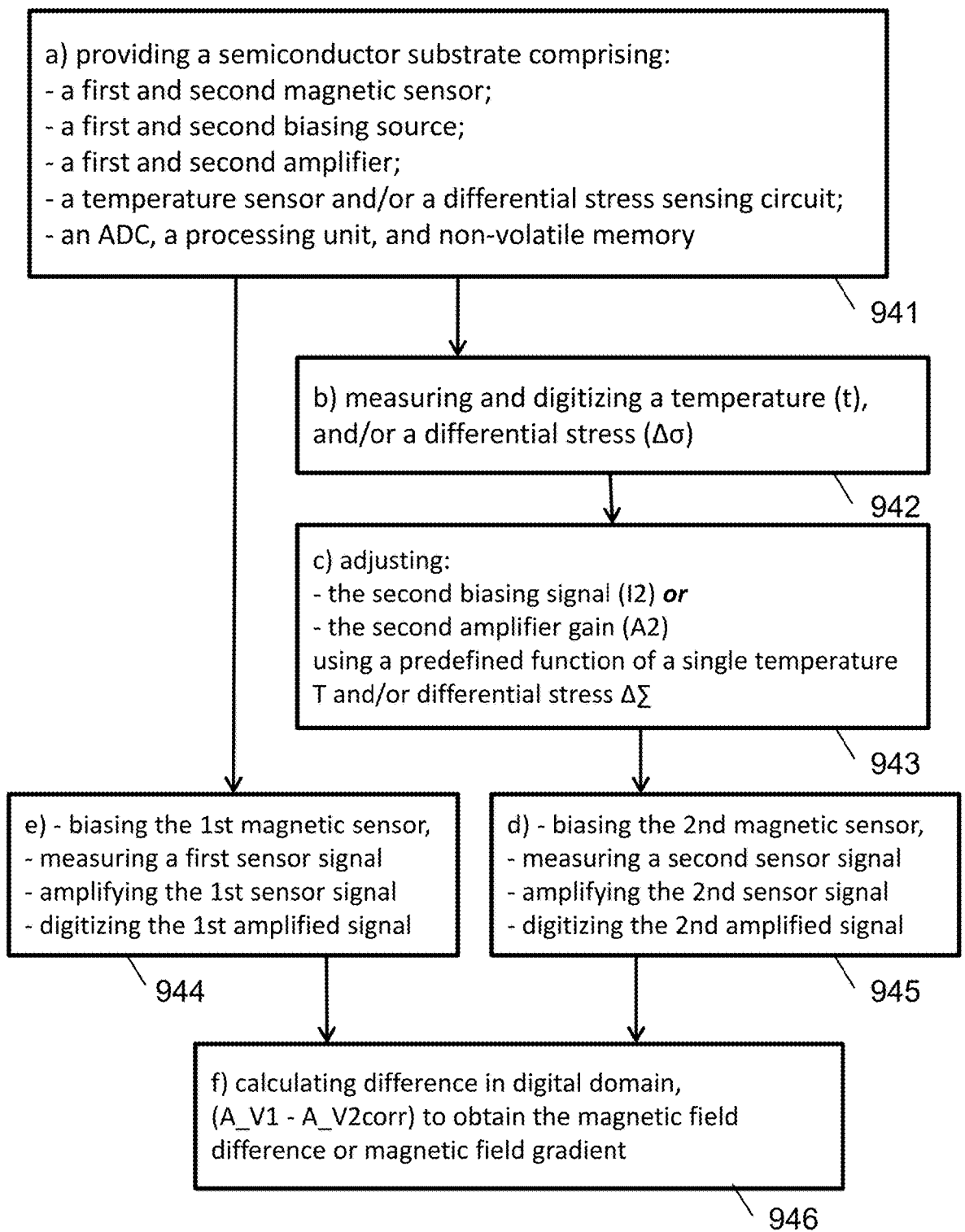
FIG. 9(c) shows a more detailed version of the method of FIG. 9(a), for the case where the second biasing source or the second amplifier gain is adjusted as a function of a single temperature and/or differential stress, and where the sensor signals are subtracted in the digital domain.

FIG. 9(c) shows a flow-chart illustrating methods which can be used in embodiments of the present invention, where the second biasing source or a second amplifier is adjusted, and where a difference between the magnetic sensor signals is calculated in the digital domain, e.g. as shown in FIG. 3(b), FIG. 3(d),FIG. 4(b), FIG. 4(d), FIG. 5(b), FIG. 5(d), FIG. 6(b), FIG. 6(c), FIG. 7(b), FIG. 7(c), FIG. 8(b), FIG. 8(c). This flow-chart may be easier to understand than that of FIG. 9(a), because the steps are listed in chronological order, albeit that some steps can be performed in parallel.

The method 940 comprises the steps of:
a) providing a semiconductor substrate comprising:
   a first and second magnetic sensor, spaced apart along a predefined axis;
   a first and second biasing source;
   a first and second amplifier;
   a temperature sensor and/or a differential stress sensing circuit;
(e.g. a temperature sensor but no differential stress sensing circuit; or a differential stress sensing circuit but no temperature sensor; or both a temperature sensor and a differential stress sensing circuit)
   an ADC, a processing unit, and a non-volatile memory;
b) after step a),
   measuring and digitizing a temperature signal (t) and/or measuring and digitizing a differential stress signal ($\Delta\sigma$);
c) after step b), adjusting at least one of:
   the second biasing signal;
   the second amplifier gain;
   using a predefined function of a single temperature and/or differential stress;
(e.g. using a predefined function f(T) of a single measured temperature T, or using a predefined function f($\Delta\Sigma$) of the measured differential stress, or using a predefined function f(T, $\Delta\Sigma$) of a single measured temperature and the measured differential stress)

d) after step c)
  biasing the second magnetic sensor;
  measuring a second magnetic sensor signal;
  amplifying the second magnetic sensor signal;
  digitizing the second amplified signal;
e) after step a)
  biasing the first magnetic sensor;
  measuring a first magnetic sensor signal;
  amplifying the first magnetic sensor signal;
  digitizing the first amplified signal;
f) after step d) and step e),
  calculating a difference between the amplified and digitized first and second value A_V1, A_V2corr in the digital domain, to obtain the magnetic field difference or magnetic field gradient.

Figure 9D:
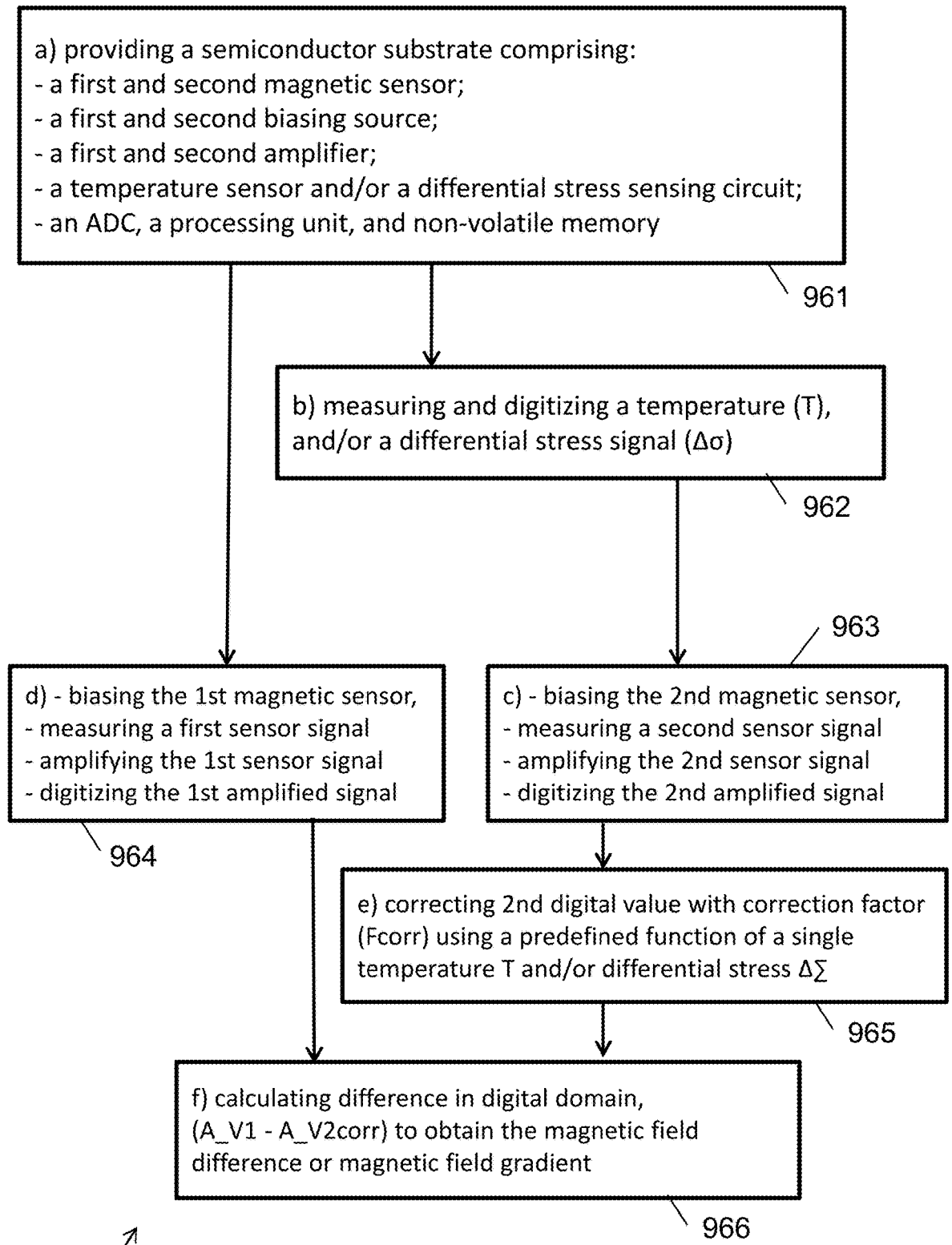
FIG. 9(d) shows a more detailed version of the method of FIG. 9(a), for the case where the two magnetic sensors are biased with a predefined biasing source, and where the signals are amplified with a predefined gain, and where the sensor signals are subtracted in the digital domain.

FIG. 9(d) shows a flow-chart illustrating methods which can be used in embodiments of the present invention, where the biasing sources and the amplifiers are not adjusted, and where one of the digital signals is corrected in the digital domain, before a difference between the signals is calculated in the digital domain, e.g. as shown in FIG. 3(f), FIG. 4(f), FIG. 5(f). The flow-chart of FIG. 9(d) may be easier to understand than that of FIG. 9(a), because the steps are listed in chronological order, albeit that some steps may be performed in parallel.

The method 960 comprises the steps of:
a) providing a semiconductor substrate comprising:
  a first and second magnetic sensor, spaced apart along a predefined axis;
  a first and second biasing source;
  a first and second amplifier;
  a temperature sensor and/or a differential stress sensing circuit;
  an ADC, a processing unit, and a non-volatile memory;
(e.g. a temperature sensor but no differential stress sensing circuit; or a differential stress sensing circuit but no temperature sensor; or both a temperature sensor and a differential stress sensing circuit)
b) after step a,
  measuring and digitizing a temperature signal (t) and/or measuring and digitizing a differential stress signal (Δσ);
c) after step b)
  biasing the second magnetic sensor;
  measuring a second magnetic sensor signal;
  amplifying the second magnetic sensor signal;
  digitizing the second amplified signal;
d) after step a)
  biasing the first magnetic sensor;
  measuring a first magnetic sensor signal;
  amplifying the first magnetic sensor signal;
  digitizing the first amplified signal;
e) after step c),
  correcting the second digital value using a predefined function of a single measured temperature and/or differential stress,
(e.g. using a predefined function f(T) of a single measured temperature T, or using a predefined function f(ΔΣ) of the measured differential stress, or using a predefined function f(T, ΔΣ) of a single measured temperature and the measured differential stress)
f) after step d) and e),
  calculating a difference between the first digital value A_V1 and the corrected second digital value A_V2corr in the digital domain, to obtain the magnetic field difference or the magnetic field gradient.

From a high-level point of view, the structures illustrated in FIG. 3(a) to FIG. 8(c) and the methods illustrated in FIG. 9(a) to FIG. 9(d) can be used to determine a magnetic field gradient or a magnetic field difference with a reduced error term related to a strayfield and sensitivity mismatch (illustrated in FIG. 2).

Various sensor structures can be used for measuring various magnetic field gradients, for example:
  the structure of FIGS. 3(a) to 3(g), FIGS. 4(a) to 4(f), FIGS. 5(a) to 5(f) with two horizontal Hall elements provides dBz/dx,
  a structure similar to that of FIGS. 3(a) to 3(g), but with two vertical Hall elements oriented with their axes of maximum sensitivity in the X-direction provides dBx/dx,
  a structure similar to that of FIGS. 3(a) to 3(g), but with two vertical Hall elements oriented with their axes of maximum sensitivity in the Y-direction provides dBy/dx,
  the structure of FIGS. 6(a) to 6(c), FIGS. 7(a) to 7(c), FIGS. 8(a) to 8(c), configured for subtracting the signals from the two Hall elements (e.g. in block 611, 612, 621, 622) associated with each IMC provides dBx/dx,
  the structure of FIGS. 6(a) to 6(c), FIGS. 7(a) to 7(c), FIGS. 8(a) to 8(c), configured for adding the signals from the two Hall elements (e.g. in block 611, 612, 621, 622) associated with each IMC provides dBz/dx.
  but the present invention is not limited hereto, and other sensor structures may also be used, e.g. based on Magneto-Resistive elements.

The skilled reader will understand that if the magnetic sensor structure shown in FIG. 3(a) to FIG. 8(c) would be spaced apart in the Y-direction rather than the X-direction, magnetic field gradients dBz/dy, dBx/dy and dBy/dy can be measured.

In the rest of this document, embodiments are described wherein two gradients are measured, along different directions, and where a ratio of these gradients is calculated, the ratio being indicative for a linear or an angular position, and where a linear or angular position is calculated based on said ratio, e.g. in accordance with the formula: arctan (K*gradient1/gradient2), where K is a predefined constant, or in accordance with the formula: arctan(K(T)*gradient1/gradient2), where K is a function of temperature.

In FIG. 10 and FIG. 11(a) to FIG. 11(c) methods of determining a linear or angular position will be described.

In FIGS. 12(a) to 12(e) and FIGS. 13(a) to 13(c), an angular position sensor system will be described, in which the angular position is based on a ratio of two magnetic field gradients (e.g. dBz/dx and dBz/dy) oriented in a single direction Z, but along two different directions (e.g. X,Y).

In FIGS. 14(a) to 14(e) and FIGS. 15(a) to 15(c), a linear and an angular position sensor system will be described, in which the position is based on a ratio of two orthogonal magnetic field gradients (e.g. dBz/dx and dBx/dx) along a single direction X, using horizontal and vertical Hall elements.

In FIGS. 16(a) to 16(i) and FIGS. 17(a) to 17(c), another linear and an angular position sensor system will be described, in which the position is based on a ratio of two orthogonal magnetic field gradients (e.g. dBz/dx and dBx/dx) along a single direction X, using a so called "dual disk" structure.

In FIGS. 18(a) to 18(g) and FIGS. 19(a) to 19(d), another angular position sensor system will be described, in which the angular position is based on a ratio of two orthogonal magnetic field gradients along a single direction X, (e.g. dBx/dx and dBy/dx), or (dBx/dx and dBz/dx), using two sensor structures, each having an IMC and four horizontal Hall elements.

But of course, the present invention is not limited to these examples, and other sensor structures, e.g. based on sensor structures having 2×2 vertical Hall elements, or based on Magneto-Resistive elements, are also possible.

Each of these position sensor systems has at least four sensors. In preferred embodiments, the sensitivity of these four sensors are not all matched to a single sensitivity value, but the sensitivities are individually matched per axis, or per orientation, or dependent on which magnetic field component is being measured (e.g. Bx or Bz). This allows to increase, e.g. maximize the signal-to-noise ratio (SNR) of each gradient value, and if a ratio of the gradient values is taken, to increase, e.g. maximize the signal-to-noise ratio (SNR) of the ratio. The position can be determined based on this ratio, for example in accordance with the formula:

$$\arctan(K*\text{gradient1}/\text{gradient2}),$$

where K is a constant value, which can be determined during a calibration test, and stored in a non-volatile memory, or in accordance with the formula:

$$\arctan(K(T)*\text{gradient1}/\text{gradient2}),$$

where K(T) is a function of temperature, which can be determined during a calibration test, and stored in a non-volatile memory, for example in the form of a table, or as a piece-wise-linear approximation, or as a set of coefficients of a polynomial, or in any other suitable manner. The value of K (or the values of K(T)) may be equal to 1.0, but generally is different from 1.0. The overall result is an increased accuracy of the position.

FIG. 10 shows a flow-chart illustrating a method 1000 of determining a position, e.g. a linear or angular position of a sensor device relative to a magnetic source (e.g. a permanent magnet), based on a ratio of two magnetic field gradients or two magnetic field differences. The method 1000 comprises the following steps:

a. determining 1001 a first magnetic field difference (e.g. ΔBx/Δx) or a first magnetic field gradient (e.g. dBx/dx) based on a first mathematical combination (e.g. pairwise differences) of signals obtained from four magnetic sensor elements, while adjusting the signal paths of at least some of the magnetic sensor elements using a first control function (f3) or using a first set of control functions, e.g. using a method as illustrated in any of FIG. 9(a) to FIG. 9(d);

b. determining 1002 a second magnetic field difference (e.g. ΔBz/Δx) or a second magnetic field gradient (e.g. dBz/dx) different from the first magnetic field difference or gradient, based on a second mathematical combination (e.g. pairwise sums) of signals obtained from said four magnetic sensor elements, the second mathematical combination being different from the first mathematical combination, while adjusting the signal paths of at least some of the magnetic sensor elements using a second control function (f4) or a second set of control functions, different from the first control function or different from the first set of control functions, e.g. using a method as illustrated in any of FIG. 9(a) to FIG. 9(d);

c. calculating 1003 a ratio of the first magnetic field gradient or difference and the second magnetic field gradient or difference;

d. determining 1004 a linear or angular position based on said ratio, optionally taking into account a factor K or a function K(T) dependent on temperature, e.g. using a look-up table with or without interpolation, or based on a mathematical formula, e.g. based on an arc tangent function or an atan 2 function, e.g. in accordance with arctan(gradient1/gradient2), or in accordance with arctan(K*gradient1/gradient2) where K is a predefined constant, or in accordance with arctan(K(T)*gradient1/gradient2) where K(T) is a predefined constant of temperature, which may be determined for example during a calibration procedure, and stored in a non-volatile memory of the sensor device.

An example of this method is illustrated in FIGS. 16(a) to 16(i) and FIGS. 17(a) to 17(c).

It is a major advantage of this method that the gradients or differences determined in step a) and b) are determined with a reduced strayfield influence, thereby increasing the accuracy of the ratio, and thus the accuracy of the position.

FIG. 11(a) shows a flow-chart illustrating a method 1100 of determining a position, e.g. a linear or angular position of a sensor device relative to a magnetic source (e.g. a permanent magnet), based on a ratio of two magnetic field gradients or two magnetic field differences. The method 1100 comprises the following steps:

a) determining 1101 a first magnetic field difference or a first magnetic field gradient based on signals obtained from a first and a second magnetic sensor element, by matching the signal path of the second sensor element to the signal path of the first sensor element, e.g. using a method of FIG. 9(a)-9(d); (or stated in other words: by considering the first sensor path as a reference sensor path and the second sensor path as an adjustable sensor path that needs to be matched, or vice versa)

b) determining 1102 a second magnetic field difference or a second magnetic field gradient based on signals obtained from a third and a fourth magnetic sensor element, different from the first and second magnetic sensor element, by matching the signal path of the fourth sensor element to the signal path of the third sensor element, e.g. using a method of FIG. 9(a)-9(d); (or stated in other words: by considering the third sensor path as a reference sensor path and the fourth sensor path as an adjustable sensor path that needs to be matched, or vice versa);

c) calculating 1103 a ratio of the first magnetic field gradient or difference and the second magnetic field gradient or difference;

d) determining 1104 a linear or angular position based on said ratio, optionally taking into account a factor K or a function K(T) dependent on temperature, e.g. using a look-up table with or without interpolation, or based on a mathematical formula, e.g. based on an arc tangent function or an atan 2 function, e.g. in accordance with arctan(gradient1/gradient2), or in accordance with arctan(K*gradient1/gradient2) where K is a predefined constant, or e.g. in accordance with arctan(K(T)*gradient1/gradient2) where K(T) is a predefined function of temperature, which may be determined for example during a calibration procedure, and stored in a non-volatile memory of the sensor device.

It is a major advantage of this method that the gradients or differences determined in step a) and b) are determined with a reduced strayfield influence, thereby increasing the accuracy of the ratio, and thus the accuracy of the position.

The method of FIG. 11(a) can be seen as a generic method covering the more specific method of FIG. 11(b) and FIG. 11(c).

FIG. 11(b) shows a more detailed version of the method of FIG. 11(a), for the case where a position (e.g. linear or angular position) is determined using gradients or differences of two orthogonal magnetic field components along a given direction, such as e.g. (dBx/dx and dBz/dx), or (dBx/dx and dBy/dx). The method 1120 of FIG. 11(b) comprises the following steps:

a) determining 1121 a first magnetic field difference (e.g. ΔBx/Δx) or gradient (e.g. dBx/dx) of a first magnetic field component (e.g. Bx) oriented in a first direction (X) along said first direction (X) based on signals obtained from a first and a second magnetic sensor element, by matching the signal path of the second sensor element to the signal path of the first sensor element, e.g. using a method of FIG. 9(a)-9(d);

b) determining 1122 a second magnetic field difference (e.g. ΔBz/Δx) or gradient (e.g. dBz/dx) of a second magnetic field component (Bz) oriented in a second direction (Z) perpendicular to the first direction (X), along said first direction (X), based on signals obtained from a third and a fourth magnetic sensor element, by matching the signal path of the fourth sensor element to the signal path of the third sensor element, e.g. using a method of FIG. 9(a)-9(d);

c) calculating 1123 a ratio of the first magnetic field gradient or difference, and the second magnetic field gradient or difference;

d) determining 1124 a linear or angular position based on said ratio, optionally taking into account a factor K or a function K(T) dependent on temperature, e.g. based on an arc tangent function or an atan 2 function, e.g. in accordance with arctan(gradient1/gradient2), or in accordance with arctan(K*gradient1/gradient2), or in accordance with arctan(K*gradient1/gradient2) where K is a predefined constant, or in accordance with arctan(K(T)*gradient1/gradient2), where K(T) is a predefined function of temperature.

Examples of magnetic position sensor systems using this method are illustrated for example in FIGS. 14(a) to 14(e) and FIGS. 15(a) to 15(c).

FIG. 11(c) shows another more detailed version of the method of FIG. 11(a), for the case where a position (e.g. linear or angular position) is determined using gradients or differences of two orthogonal magnetic field components along two orthogonal directions, such as e.g. (dBz/dx and dBz/dy). The method 1140 of FIG. 11(c) comprises the following steps:

a) determining 1141 a first magnetic field difference (e.g. ΔBz/Δx) or a first magnetic field gradient (e.g. dBz/dx) of a magnetic field component (e.g. Bz) oriented in a first direction (e.g. Z) along a second direction (e.g. X) perpendicular to the first direction (e.g. Z), based on signals obtained from a first and a second magnetic sensor element, by matching the signal path of the second sensor element to the signal path of the first sensor element, e.g. using a method of FIG. 9(a)-9(d);

b) determining 1142 a second magnetic field difference (e.g. ΔBz/Δy) or a second magnetic field gradient (e.g. dBz/dy) of said magnetic field component (e.g. Bz) oriented in said first direction (e.g. Z) along a third direction (e.g. Y) perpendicular to the first and second direction (e.g. Z, X), based on signals obtained from a third and a fourth magnetic sensor element, different from the first and second sensor element, by matching the signal path of the fourth sensor element to the signal path of the third sensor element, e.g. using a method of FIG. 9(a)-9(d);

c) calculating 1143 a ratio of the first magnetic field gradient or difference, and the second magnetic field gradient or difference;

d) determining 1144 a linear or angular position based on said ratio, optionally taking into account a factor K or a function K(T) dependent on temperature, e.g. based on an arc tangent function or an atan 2 function, e.g. in accordance with arctan(gradient1/gradient2), or in accordance with arctan(K*gradient1/gradient2) where K is a predefined constant, or in accordance with arctan(K(T)*gradient1/gradient2), where K(T) is a predefined function of temperature.

Examples of magnetic position sensor systems using this method are illustrated for example in FIGS. 12(a) to 12(e) and FIGS. 13(a) to 13(c).

FIG. 12(a) shows a variant of the sensor arrangement of FIG. 3(a) comprising four sensors H1 to H4, located at four different sensor locations, e.g. located on a virtual circle; and a temperature sensor which can be located anywhere on the substrate. The sensor device is configured for measuring two magnetic field gradients (e.g. dBz/dx and dBz/dy) of a magnetic field component (e.g. Bz) oriented perpendicular to the semiconductor substrate, along two orthogonal directions (e.g. X, Y) parallel to the semiconductor substrate.

In the specific example shown in FIG. 12(a), each of the four sensors H1-H4 consists of a single horizontal Hall element, but that is not absolutely required, and other sensor elements can also be used. What is important in this embodiment is that the four sensors are sensitive to a first direction (in the example: Z), that the sensors H1 and H3 are located on a second axis (here: X) perpendicular to the first axis (here: Z), and that the sensors H2 and H4 are located on a third axis (here: Y) perpendicular to the first and second axis (here: Z, X).

FIG. 12(b) shows an angular position sensor system 1200 comprising a two-pole magnet 1201 (e.g. a two-pole disk magnet or ring magnet) and a sensor device 1202 having a sensor arrangement as shown in FIG. 12(a). As described above, the angular position can be calculated as an arc tangent function, but the sensitivity of all the sensors does not have to be matched. It suffices that the sensitivity of the sensors H1 and H3 (involved in the first gradient) are actively matched, and that the sensitivity of the sensors H2 and H4 (involved in the second gradient) are actively matched. Any mismatch between the first magnetic sensor pair (H1, H3) and the second magnetic sensor pair (H2, H4) can be dealt with using a factor K, which may be constant, or may be a function of temperature. The angular position of the magnet 1401 relative to the sensor device (or vice versa) may for example be calculated in accordance with one of the following formulas:

$$\theta = \text{atan } 2(K \cdot dBz/dx, dBz/dy) \qquad [11]$$

where K is a predefined constant, or:

$$\theta = \text{atan } 2(K(T) \cdot dBz/dx, dBz/dy) \qquad [12]$$

where K is a factor which can be calculated as a predefined function of temperature. The value of K, or values or parameters of the predefined function K(T) can be stored in a non-volatile memory.

The value of K is typically different from 1.0 and/or the values of K(T) are typically different from 1.0 for at least five different temperature values in the range from 0° C. to 100° C., but that is not absolutely required, and the value of K or values of K(T) may coincidentally also be exactly equal to 1.0.

Figure 12C:
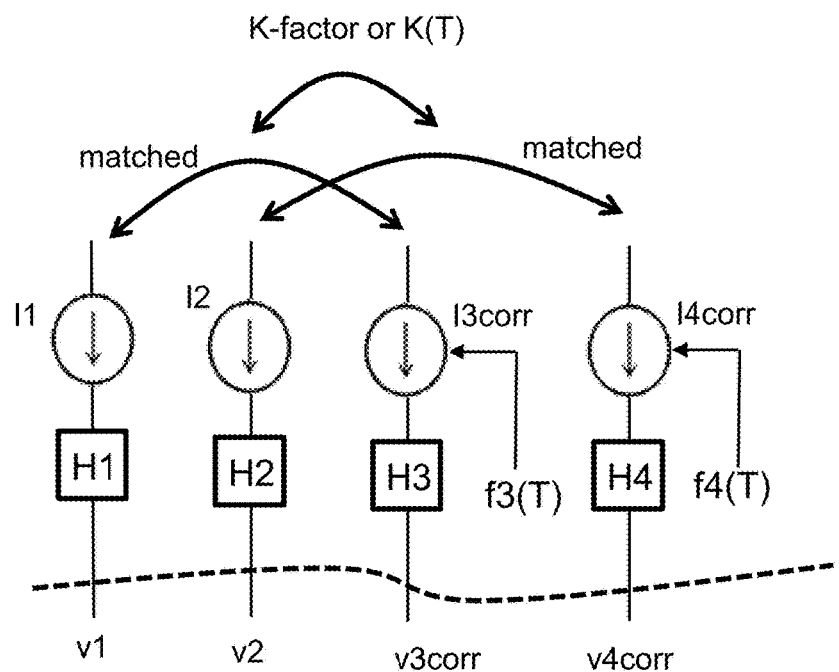
FIG. 12(c) shows a variant of the circuit of FIG. 3(c), according to an embodiment of the present invention, using a temperature sensor and two adjustable current sources.

FIG. 12(c) shows how the sensitivity of H3 can be matched to that of H1, and how the sensitivity of H4 can be matched to that of H2, using principles of the present invention.

More in particular, FIG. 12(c) is a variant of the circuit of FIG. 3(c), but only a portion of the circuit is shown. The skilled reader can easily complete the rest of the biasing and readout circuit in analogy with FIG. 3(b) or FIG. 3(c), taking into account that in this case, for each direction (e.g. X, Y) there is one independent current source (here: I1, I2) and one adjustable current source (here: I3, I4), and that the digital processing circuit (e.g. microprocessor or DSP) provides two control signals (here: f3 and f4), one control signal to adjust the third current source I3 based on a predefined function f3(T), and one control signal to adjust the fourth current source I4 based on a predefined function f4(T).

The difference between the corresponding signals (derived from H1 and H3 for the first gradient, and derived from H2 and H4 for the second gradient) can be calculated in the digital domain (e.g. as in FIG. 3(b)), or can be calculated in the analog domain (e.g. as in FIG. 3(c)). The latter provides a better Signal-to-Noise ratio (SNR).

It is preferred that the second current I2 is substantially equal to the first current I1, e.g. using a current mirror, but that is not absolutely required for the invention to work. But even if I1 is identical to I2, the overall sensitivity of the first sensor path (comprising H1) is rarely the same as the overall sensitivity of the second sensor path (comprising H2). A scaling factor K (as mentioned in [11] and [12] above) can be determined during calibration, and stored in non-volatile memory, and retrieved from said non-volatile memory during actual use of the device, and used to scale the gradient derived from the second and fourth sensor before calculating the arctangent function. The constant K or K(T) is typically different from 100%, although that is not mandatory.

In a variant, not only I3 and I4 are adjustable current sources, but also the second current source I2 is an adjustable current source, which is also controlled by the digital processing circuit, based on a predefined function f2(T) of temperature. In this case, the factor K in formula [11] and [12] is equal to one, and may be omitted. This allows for dynamic tuning of I2, but as already mentioned, is not absolutely required.

Figure 12D:
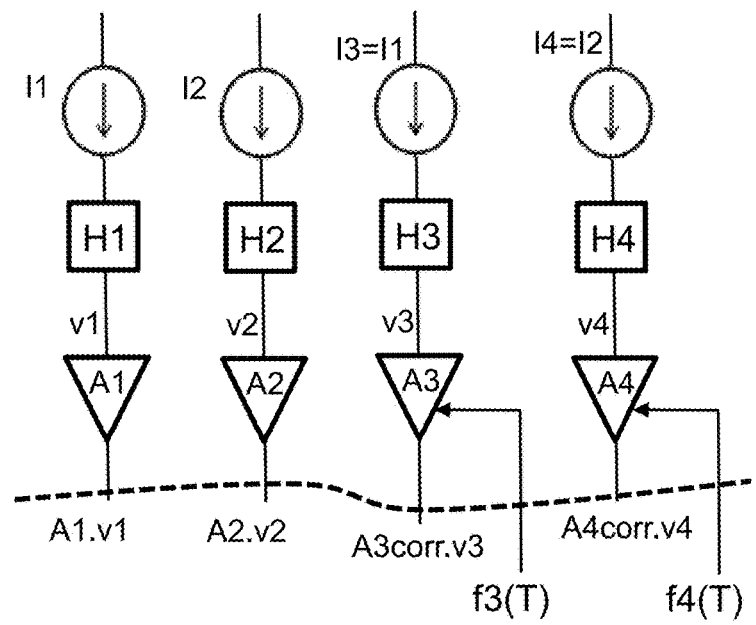
FIG. 12(d) shows a variant of the circuit of FIG. 3(e), according to an embodiment of the present invention, using a temperature sensor and two adjustable amplifiers.

FIG. 12(d) shows a variant of the circuit of FIG. 12(c), comprising adjustable amplifiers rather than adjustable current sources. Again, only a portion of the circuit is shown. The skilled reader can easily complete the rest of the biasing and readout circuit in analogy with FIG. 3(d) or FIG. 3(e), taking into account that in this case, for each direction (e.g. X, Y) there is one independent amplifier (here: A1, A2) and one adjustable amplifier (here: A3, A4), and that the digital processing circuit (e.g. microprocessor or DSP) provides two control signals, one control signal to adjust the third amplifier A3 based on a predefined function f3(T), and one control signal to adjust the fourth amplifier A4 based on a predefined function f4(T).

The difference between the corresponding signals (derived from H1 and H3 for the first gradient, and derived from H2 and H4 for the second gradient) can be calculated in the digital domain as in FIG. 3(d), or can be calculated in the analog domain as in FIG. 3(e). The latter provides a better Signal-to-Noise ratio (SNR).

It is preferred that the second amplifier gain A2 is substantially equal to the first amplifier gain A1, but that is not absolutely required for the invention to work. But even if I1 is identical to I2, and A1 is identical to A2, the overall sensitivity of the first sensor path (comprising H1) is rarely the same as the overall sensitivity of the second sensor path (comprising H2). A scaling factor K may furthermore be determined during calibration, and stored in non-volatile memory, and retrieved from said non-volatile memory during actual use of the device, and used to scale the gradient obtained from the second and fourth sensor before calculating an arctangent function.

In a variant, not only A3 and A4 are adjustable amplifiers, but also the second amplifier A2 is an adjustable amplifier, which is controlled by the digital processing circuit, based on a predefined function f2(T) of temperature. The factor K in formula [11] and [12] may be equal to 1.0 in this case, and might be omitted.

Similar variants as described for FIG. 3(c) are also contemplated for the circuit of FIG. 12(c) and FIG. 12(d), using multiple ADCs (instead of only one), using a temperature sensor with digital output, using a DSP with a DAC or a PWM-generator and an Low-Pass-Filter, etc.

In yet another variant of FIG. 12(c) and FIG. 12(d), similar to FIG. 3(f), none of the current sources is adjusted, and none of the amplifier gains is adjusted, but the signal obtained from the third and fourth sensor (and optionally second sensor) are being corrected in the digital domain, using respective correction factors Fcorr3=f3(T) and Fcorr4=f4(T), and optionally also Fcorr2=f2(T) using respective predefined functions of temperature.

Figure 12E:
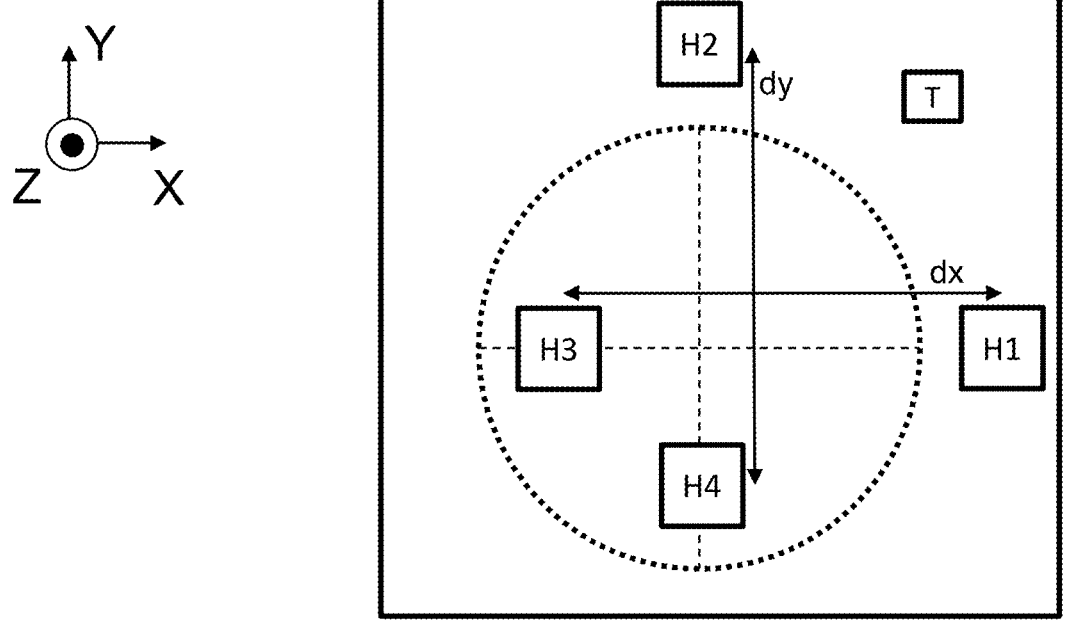
FIG. 12(e) shows a variant of the sensor arrangement of FIG. 12(a), where the four sensor elements are not located on a circle having a center located on the rotation axis, according to an embodiment of the present invention.

FIG. 12(e) is a variant of the arrangement of FIG. 12(a), illustrating that the same principles can also be used in an angular position sensor system where the position sensor device is offset from the rotation axis (as indicated by the circle in dotted line). Also in this case the influence from the strayfield can be reduced, and also in this case, the angular position can be determined based on a ratio of the two gradients.

In another variant of FIG. 12(a) (not shown), the angular position sensor system comprises only three magnetic sensor elements H1, H2, H3, wherein H1 and H2 are not located on a single axis. Preferably H1 and H2 are located on a first axis, and H2 and H3 are located on a second axis, forming an angle of 90°. A first gradient signal can be formed by subtracting H1 and H2, and a second gradient signal can be formed by subtracting H2 and H3. It is not required to match the sensitivity of all the sensor elements to the one with the lowest sensitivity, as is normally done, but the two gradient signals can be pairwise matched, such that the SNR of each gradient is optimized, in a similar manner as described above.

FIG. 13(a) shows a variant of the sensor arrangement of FIG. 12(a), further comprising four mechanical stress sensors S1, S2, S3, S4, one at or near each sensor location.

FIG. 13(b) shows a variant of the circuit of FIG. 12(c), using the sensor arrangement of FIG. 12(a). Again, only a portion of the schematic is shown. Two stress differences or two differential stress signals are determined, namely one for each axis: $\Delta\sigma_{13}$ between the first and third sensor H1, H3 which are located on the X-axis, and $\Delta\sigma_{24}$ between the second and fourth sensor H2, H4 which are located on the Y-axis. The stress differences are digitized into $\Delta\Sigma_{13}$ and $\Delta\Sigma_{24}$ and are provided to the digital processing circuit.

As can be seen, in this embodiment, the third current source I3 is adjusted using a predefined function $f3(T,\Delta\Sigma_{13})$ of temperature T and of the (digitized) differential stress $\Delta\Sigma_{13}$ between the first and third sensor location, in order to reduce the influence of a potential strayfield on the gradient along the X-axis. Likewise, the fourth current source I4 is adjusted using a function of temperature T and the (digitized) differential stress $\Delta\Sigma_{24}$ between the second and fourth sensor location, in order to reduce the influence of a potential strayfield on the gradient along the Y-axis. The formulas [11] and [12] are applicable. As mentioned above, the value of K and/or values of K(T) may coincidently be equal to 1.0, but are typically different from 1.0.

As described in FIG. 12(c), the differences between the corresponding magnetic sensor signals can be calculated in the digital domain (e.g. as in FIG. 3(b)), or in the analog domain (e.g. as in FIG. 3(c)). The latter provides a better Signal-to-Noise ratio (SNR).

In a variant of FIG. 13(b), not shown, also the stress difference $\Delta\sigma_{12}$ between the first and second sensor H1, H2 is determined, and digitized, and also the second current source I2 is dynamically adjusted as a predefined function f2(T,$\Delta\Sigma_{12}$) of temperature and differential stress. In this case the sensitivities of the sensors H2, H3, H4 are all adjusted with respect to the first sensor. The formulas [11] and [12] are still applicable, but the K-factor can be omitted in this case.

Figure 13C:
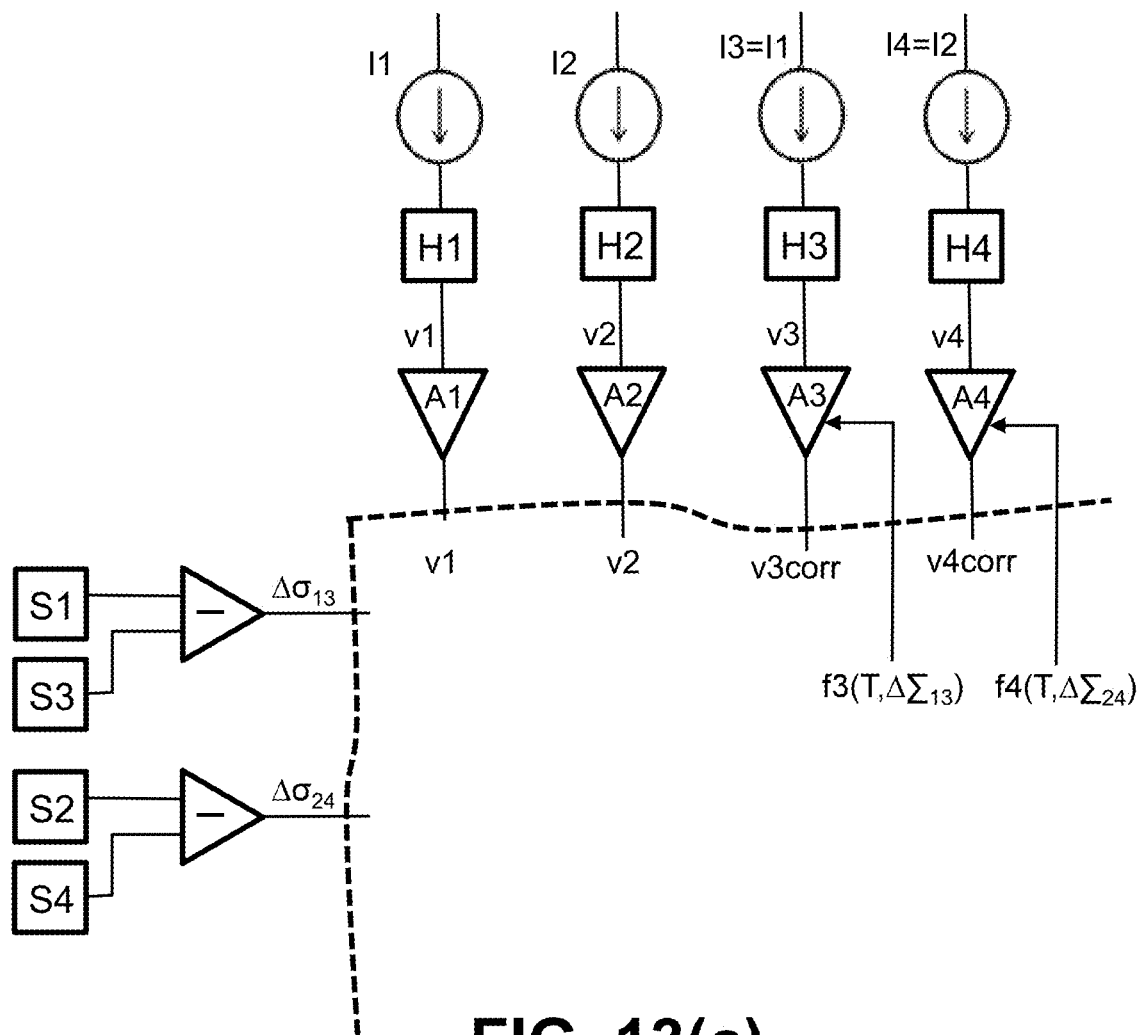
FIG. 13(c) shows a variant of the circuit of FIG. 12(d), according to an embodiment of the present invention, further comprising four stress sensors, in which two adjustable amplifiers are controlled as a function of a single temperature and differential stress.

FIG. 13(c) shows a variant of the circuit of FIG. 12(d) with the addition of four stress sensors S1 to S4. This can also be seen as a variant of the circuit of FIG. 13(b) where the amplifiers A3 and A4 are controlled rather than the current sources I3 and I4. The formula [11].

In a variant of FIG. 13(c), not shown, also the stress difference $\Delta\sigma_{12}$ between the first and second sensor H1, H2 is determined, and digitized, and also the second amplifier gain A2 is dynamically adjusted as a predefined function f2(T,$\Delta\Sigma_{12}$) of temperature and differential stress.

Other variants similar to those as described for FIGS. 4(a) to 4(f) are also contemplated for the embodiments of FIGS. 13(a) to 13(c), for example using multiple ADCs (instead of only one), using a temperature sensor with digital output, using a DSP with a DAC or a PWM-generator and an Low-Pass-Filter, etc.

In yet another variant of FIG. 13(b) and FIG. 13(c), similar to FIG. 4(f), none of the current sources is adjusted, and none of the amplifiers is adjusted, but the signal obtained from the third and fourth sensor H3, H4 are both corrected in the digital domain, using respectively a first correction factor Fcorr3 based on a first function f3(T,$\Delta\Sigma_{13}$) of temperature and differential stress, and using a second correction factor Fcorr4 based on a second function f4(T,$\Delta\Sigma_{24}$) of temperature and differential stress, before being subtracted from the corresponding amplified and digitized first, respectively second value A_V1, A_V2.

In a further variant, also the second sensor signal can be corrected in the digital domain, using a correction factor Fcorr2 which can be determined as a function f2(T,$\Delta\Sigma_{12}$) of temperature and differential stress.

In yet other variants (not shown) of FIG. 13(a) to FIG. 13(c), the third and fourth (and optionally also the second) biasing source, or the third and fourth (and optionally also the second) amplifier gain are controlled as predefined functions f3($\Delta\Sigma_{13}$), f4($\Delta\Sigma_{24}$) of mechanical stress only, similar to what was described in FIG. 5(a) to FIG. 5(f). In these embodiments, the temperature sensor may be omitted.

FIGS. 14(a) to 14(e) and FIGS. 15(a) to 15(c) show examples of an angular position sensor system 1400 and a linear position sensor system 1450 respectively, where the method of FIG. 11(a) and FIG. 11(b) can be used. The same principles described above are also applicable here, and hence are not repeated in full detail. Only the main differences will be described.

FIG. 14(a) shows a variant of the sensor arrangement of FIG. 3(a) comprising four sensor elements HH1, VH1 located at a first sensor location X1, and HH2, VH2 located at a second sensor location X2, spaced apart by distance dx from the first sensor location X1 along the X-axis, and configured for measuring two gradients (here: dBz/dx and dBx/dx) of two orthogonal magnetic field components (here: Bx and Bz) along a single direction (here: X). The first and third sensor element are horizontal Hall elements HH1, HH2 for measuring Bz1, Bz3 oriented in a direction Z perpendicular to the substrate. The second and fourth sensor element are vertical Hall elements VH1, VH2 for measuring Bx1, Bx2 oriented in the X-direction, parallel to the substrate.

FIG. 14(b) shows an exemplary angular position sensor system 1400 comprising a four-pole magnet 1401 (e.g. a ring magnet or a disk magnet) and a sensor device 1402 having a sensor arrangement as shown in FIG. 14(a), located offset from the rotation axis ("off-axis"). The angular position of the magnet can for example be calculated in accordance with one of the following formulas:

$$\theta = \mathrm{atan}\,2(K \cdot dBx/dx, dBz/dx)/2 \quad [13]$$

where K is a predefined constant, or:

$$\theta = \mathrm{atan}\,2(K(T) \cdot dBx/dx, dBz/dx)/2 \quad [14]$$

where K is a predefined function of temperature. The value of K, or values or parameters of the predefined function K(T) can be stored in a non-volatile memory.

In a variant of this system, a six-pole magnet, or an eight-pole magnet is used, in which case the arctangent function would be divided by 3 and by 4 respectively in formula [13] and [14].

FIG. 14(c) shows an exemplary linear position sensor system 1450 comprising a linear magnetic structure 1451 with a plurality of alternating poles, and a sensor device 1452 having a sensor arrangement as shown in FIG. 14(a). The linear position of the sensor device 1452 relative to the magnet 1451 (or vice versa) can be derived from an angular value $\theta$ in known manners, which angle $\theta$ can be calculated using the same formulas [13] and [14] as mentioned in FIG. 14(b).

Figure 14D:
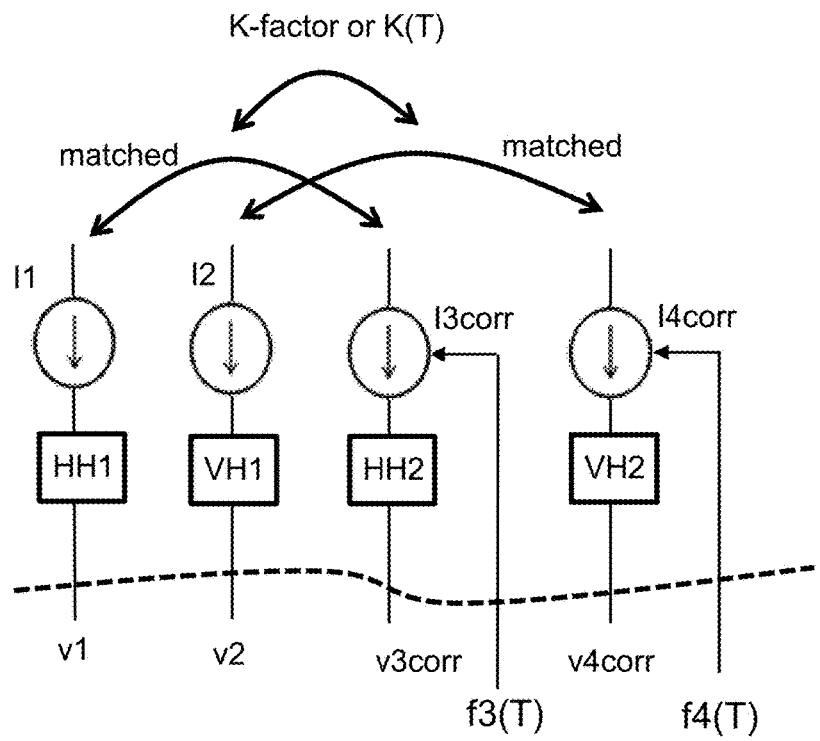
FIG. 14(d) shows a variant of the circuit of FIG. 3(c), according to an embodiment of the present invention, using a temperature sensor and two adjustable current sources.

FIG. 14(d) shows a variant of the circuit of FIG. 3(c), according to an embodiment of the present invention, having two adjustable biasing sources. In the embodiment shown, the first and second biasing source are predefined current sources, and the third and fourth biasing source are adjustable current sources I3, I4, which are controlled as a predefined function f3(T), f4(T) of temperature, respectively. A representation of these predefined functions (e.g. a table or parameters or coefficients) are stored in a non-volatile-memory, as is the K-factor, or the K-function of temperature.

In a variant of this embodiment, also the second biasing source I2 has an adjustable current, which is controlled based on a predefined function f2(T) of temperature. In this case the factor K is equal to one (100%), and may be omitted from formula [13] and [14] and from the non-volatile memory.

The variants described above (e.g. described in FIG. 3(b) and FIG. 3(c)) are also contemplated for this circuit. For example, the magnetic sensor signals can be subtracted in the analog or digital domain, the circuit may have multiple ADC's, the temperature sensor may have a digital output, etc.

Figure 14E:
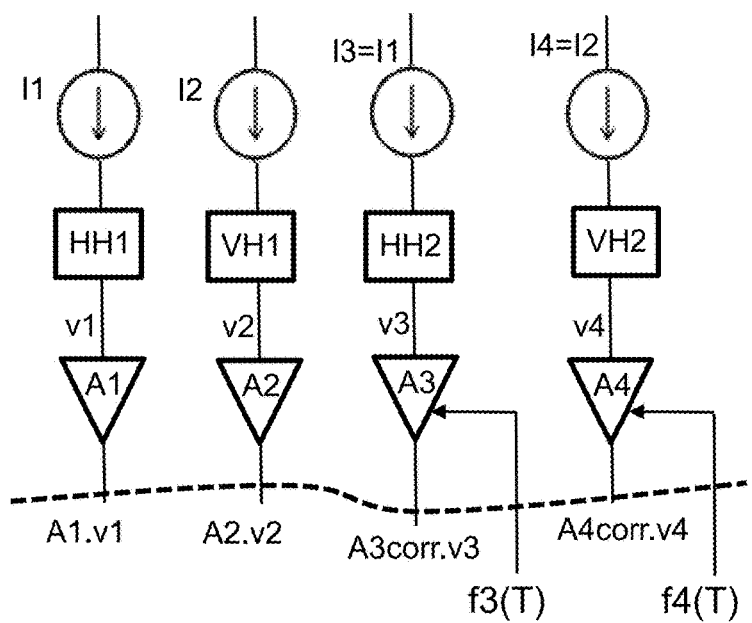
FIG. 14(e) shows a variant of the circuit of FIG. 3(d), according to an embodiment of the present invention, using a temperature sensor and two adjustable amplifiers.

FIG. 14(e) shows a variant of the circuit of FIG. 14(d), according to an embodiment of the present invention, having two adjustable amplifiers. In the embodiment shown, the first and second amplifier have a predefined gain, and the third and fourth amplifier A3, A4 have an adjustable gain, which are controlled in accordance with a predefined function f3(T), f4(T) of temperature, respectively.

In a variant of this embodiment, also the second amplifier A2 has an adjustable gain, which is dynamically controlled based on a predefined function f2(T) of temperature. In this case the factor K may be omitted from formula [13] and [14].

The variants described above, e.g. described for FIG. 3(d) and FIG. 3(e) are also contemplated for this circuit, for example, the magnetic sensor signals can be subtracted in the analog or digital domain, the circuit may have multiple ADC's, the temperature sensor may have a digital output, etc.

In yet another variant (not shown) of FIG. 14(d) and FIG. 14(e), similar to FIG. 4(f), none of the current sources is adjustable, and none of the amplifiers has an adjustable gain, but the signal(s) obtained from the third and four sensor element HH2, VH2 are both corrected in the digital domain, using respectively a first correction factor Fcorr3 using a function f3(T) of temperature, and by a second correction factor Fcorr4 using a function f4(T) of temperature, before being subtracted from the corresponding amplified and digitized sensor value. The functions f3(T) and f4(T) are determined separately, and are typically different from each other.

In a variant of FIG. 14(e), also the second amplifier A2 has an adjustable gain, which is dynamically controlled using a predefined function f2(T) of temperature.

Figure 15A:
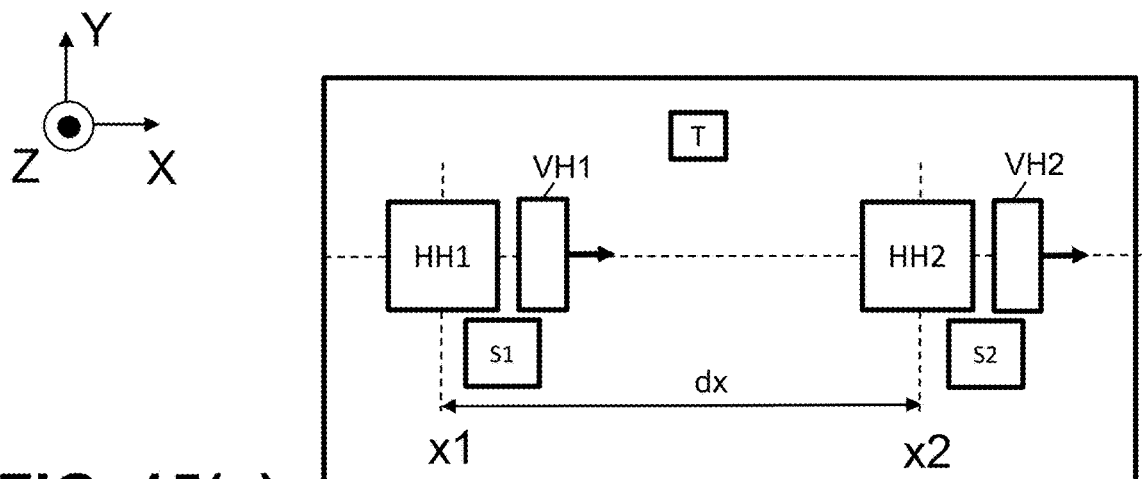
FIG. 15(a) shows a variant of the sensor arrangement of FIG. 14(a), further comprising two stress sensors, one at each sensor location.
Figure 15B:
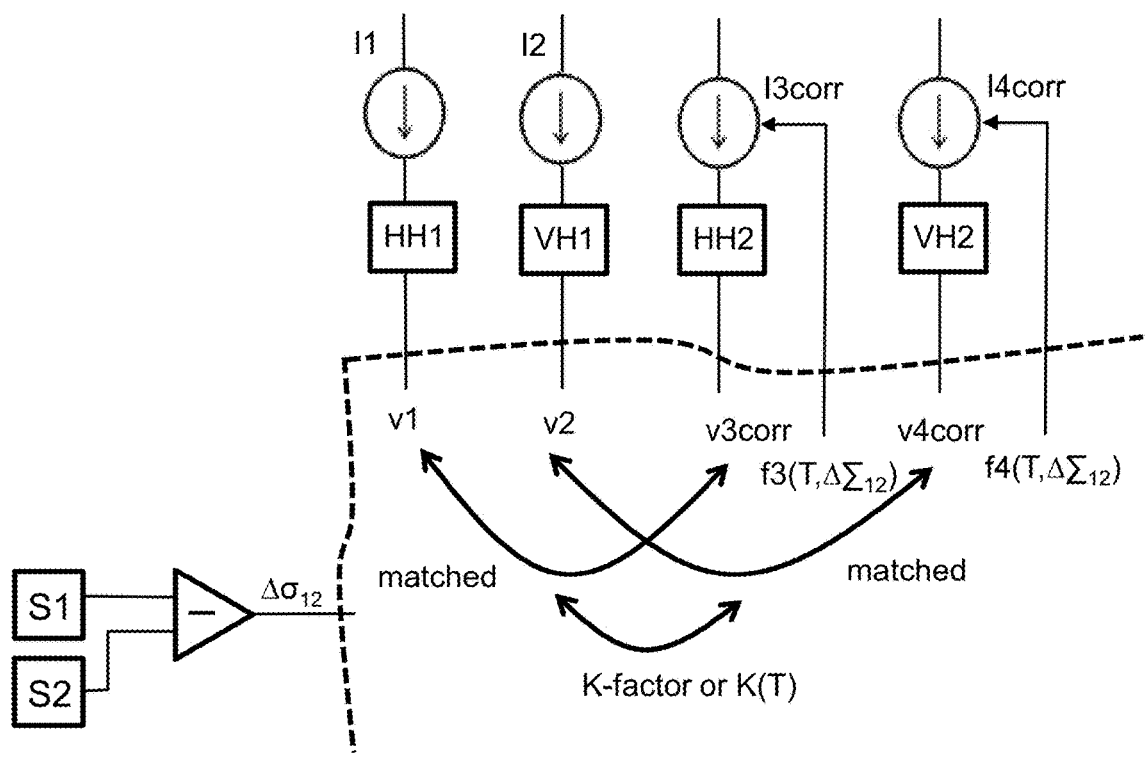
FIG. 15(b) shows a variant of the circuit of FIG. 14(d), according to an embodiment of the present invention, further comprising two stress sensors, in which two adjustable current sources are controlled as a function of a single temperature and differential stress.
Figure 15C:
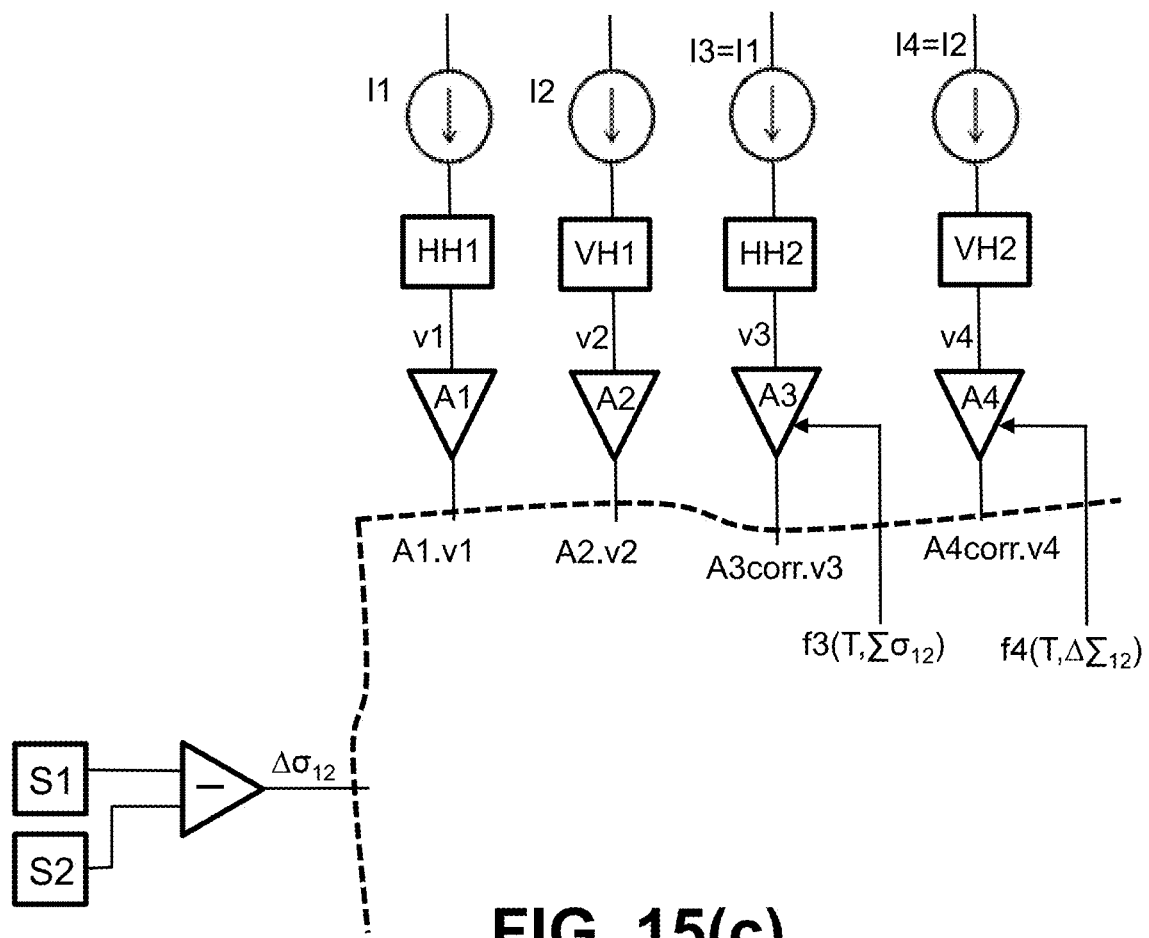
FIG. 15(c) shows a variant of the circuit of FIG. 14(e), according to an embodiment of the present invention, further comprising two stress sensors, in which two adjustable amplifiers are controlled as a function of a single temperature and differential stress.

FIG. 15(a) to FIG. 15(c) show variants of the circuits and systems shown in FIG. 14(a) to FIG. 14(e), further comprising two stress sensors S1, S2, one at each sensor location. As shown, a differential stress $\Delta\sigma 12$ is measured between the first X1 and second X2 sensor location. According to principles of the present invention, it suffices to have only one stress sensor S1 to measure mechanical stress at the first sensor location X1, and only one stress sensor S2 to measure mechanical stress at the second sensor location X2.

FIG. 15(b) shows a variant of the circuit of FIG. 14(d), further comprising said two stress sensors and an analog difference circuit. The two adjustable current sources I3, I4 are controlled as a function of temperature and differential stress, in the example by f3(T,$\Delta\Sigma_{12}$) and f4(T,$\Delta\Sigma_{12}$) respectively.

FIG. 15(c) shows a variant of the circuit of FIG. 14(e), further comprising said two stress sensors and said analog difference circuit. The two adjustable amplifiers A3, A4 are controlled as a function of temperature and differential stress, in the example by f3(T,$\Delta\Sigma_{12}$) and f4(T,$\Delta\Sigma_{12}$) respectively.

In yet another variant (not shown) of FIG. 15(b) and FIG. 15(c), similar to FIG. 4(f), none of the current sources is adjustable, and none of the amplifiers has an adjustable gain, but the signals obtained from the second and fourth sensor element HH2, VH2 are both corrected in the digital domain, using respectively a correction factor Fcorr3 based on a first function f3(T) of temperature, and using a correction factor Fcorr4 based on a second function f4(T) of temperature, before being subtracted from the corresponding amplified and digitized sensor values. The functions f3(T) and f4(T) are determined separately, and are typically different from each other.

In yet other variants (not shown) of FIGS. 14(a) to 14(e) and FIGS. 15(a) to 15(c), the predefined functions f3 and f4 (and optionally also f2) for adjusting the biasing sources, for adjusting the amplifier gains, and for calculating the correction factors in the digital domain are a function of differential stress, but not of temperature, similar to what was described in FIG. 5(a) to FIG. 5(f). In these embodiments, the temperature sensor may be omitted.

FIG. 16(a) to FIG. 16(i) show other examples of sensor systems 1600, 1650 according to the present invention, wherein the method 1000 of FIG. 10 can be used. The structure of FIG. 16(a) has two sensor structures, one located at X1, the other locationed at X2. Each sensor structure comprises an integrated magnetic concentrator disk (IMC), and two horizontal Hall elements, located on opposite sites of the IMC. The four Hall elements H1-H4 are all located on the same axis X.

Figure 16D:
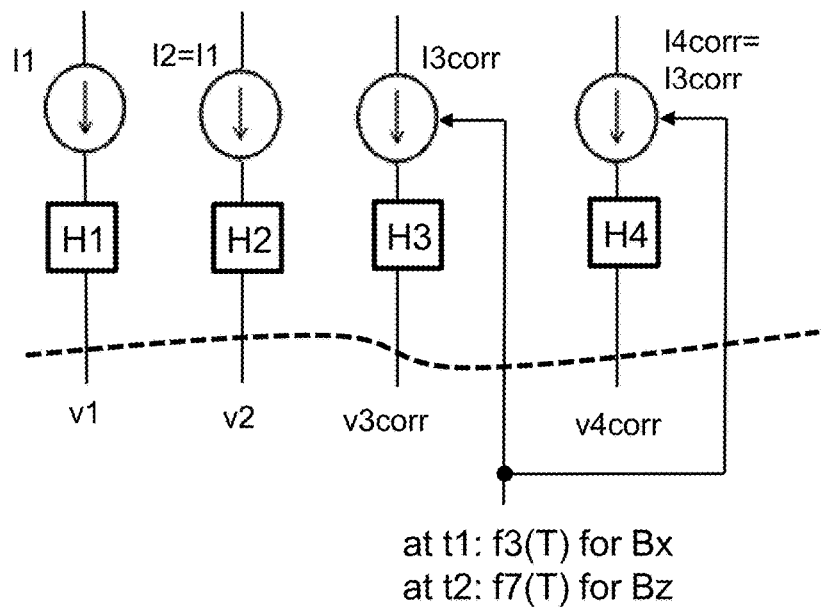
FIG. 16(d) shows a variant of the circuit of FIG. 3(c), according to an embodiment of the present invention, using a temperature sensor and two adjustable current sources, controlled using a single predefined function.

The sensor structure of FIG. 16(a) can be used to measure the same magnetic field components Bz1, Bx1, Bz2, Bx2 as the sensor structure of FIG. 14(a), from which the same magnetic field gradients dBx/dx and dBz/dx can be calculated. Everything described above for FIG. 14(a) to FIG. 14(e) is also applicable for FIG. 16(a) to FIG. 16(i), mutatis mutandis.

The attentive reader may wonder what the difference is between the embodiments of FIGS. 6(a) to 6(c) which are capable of determining only a single gradient: dBx/dx or dBz/dx, whereas the embodiments of FIGS. 16(a) to 16(i) are capable of determining two gradients: dBx/dx and dBz/dx. The answer cannot be seen in FIG. 6(a) or FIG. 16(a), but can be understood from FIG. 6(b) and FIG. 6(c), with the following explanation. In the circuits of FIGS. 6(a) to 6(c), the blocks 611, 612, 621, 622 are configured for either adding the signals from the two Hall elements under the IMC's, in which case the values Bz1, Bz2 are measured, or subtracting the signals from the two Hall elements under the IMC's, in which case the values Bx1, Bx2 are measured. In contrast, in the embodiments of FIG. 16(a) to FIG. 16(i), the circuit is configured for selectively subtracting the signals of the two Hall elements under each IMC at a first moment t1 in time when measuring a Bx-component, and for adding the signals of the two Hall elements under each IMC at a second moment t2 in time when measuring a Bz-component. Alternatively, the circuits of FIG. 16(a) to FIG. 16(i) may have both a summation block and a subtraction block. The current sources or the amplifier gains or the digital correction factors are controlled differently, however, dependent on which component is being measured: Bx or Bz, as will be explained next.

Apart from the addition and subtraction of the signals provided by the individual Hall elements of each sensor, the Hall elements can be biased in various manners, as will be illustrated in FIG. 16(d) to FIG. 16(i). In each of these cases, the following formulas can be used:

$$vx1 = (vH1 - vH2) \qquad [17]$$

where vx1 is the difference signal, indicative of Bx1, vH1 is the signal obtained from H1, and vH2 is the signal obtained from H2, $$vx2 = (vH3 - vH4) \qquad [18]$$

where vx2 is the difference signal, indicative of Bx2, vH3 is the signal obtained from H3, and vH4 is the signal obtained from H4, $$vz1 = (vH1 + vH2) \qquad [19]$$

where vz1 is the summation signal, indicative of Bz1, vH1 is the signal obtained from H1, and vH2 is the signal obtained from H2, $$vz2 = (vH3 + vH4) \qquad [20]$$

where vz2 is the summation signal, indicative of Bz2, vH3 is the signal obtained from H3, and vH4 is the signal obtained from H4.

The first gradient can then be determined (in the analog or digital domain), based on:

$$dBx/dx = vx2 - vx1 \quad [21]$$

and the second gradient can then be determined (in the analog or digital domain), based on:

$$dBz/dx = vz2 - vz1 \quad [22]$$

As mentioned above, the subtraction of [21] and [22] is preferably performed in the analog domain, before the ADC, because this yields a better SNR. The angular or linear position can then be calculated based on one of the following formulas:

$$\theta = \text{atan } 2(K \cdot dBx/dx, dBz/dx)/N \quad [23]$$

where K is a predefined constant, or:

$$\theta = \text{atan } 2(K(T) \cdot dBx/dx, dBz/dx)/N \quad [24]$$

where K is a predefined function of temperature, and the value of N is an integer value defined by the magnet (N=1 for a dipole, N=2 for a quadrupole, N=3 for a six-pole magnet, etc). The value of N, and K, or values or parameters of the predefined function K(T) can be stored in a non-volatile memory.

In FIG. 16(d), I1 and I2 are predefined current sources (e.g. two temperature stabilized current sources for generating I1 and I2; or one temperature stabilized current source for generating I1 and one current mirror for generating I2), and I3 and I4 are adjustable current sources. The current I2 is preferably chosen equal to I1, e.g. by using a current mirror. The current of I4 is preferably chosen equal to I3, e.g. using another current mirror. During normal operation, the third and fourth current source I3, I4 are dynamically adjusted using a predefined function f3(T) when measuring Bx, and using a predefined function f7(T) when measuring Bz. This allows to bias the sensor elements differently depending on which magnetic field component/gradient is being measured/determined, which in turn depends on how the values obtained from the sensor elements are mathematically combined.

The function f3(T) can be determined for example as follows: a constant magnetic field, or a zero-magnetic field is applied, e.g. by means of shielding, or using a magnet, or an electromagnet. For various temperatures T, currents I1=I2 are applied, and initial currents I3=I4 are applied, and Bx1 and Bx2 are determined using the formulas [17], [18]. Then I3 (=I4) are adjusted (e.g. repeatedly increased and/or decreased) by applying a parameter to a control gate of the third and fourth current source, and the adjusted values of Bx1, Bx2 are determined, until a parameter is found for which Bx1=Bx2 within a given tolerance margin (e.g. <1%, or <0.5%). This parameter value is the value of f3 for that particular temperature T. This process is repeated for a number of temperatures, and the working points (parameter versus T) are stored in a list. Curve fitting may be applied (similar as in FIG. 3(g)). The list-values or the coefficients of the fitted curve are stored in a non-volatile memory.

A similar procedure can be applied for determining f7(T), mutatis mutandis, meaning inter alia that Bz1 and Bz2 are to be compared rather than Bx1 and Bx2.

Figure 16E:
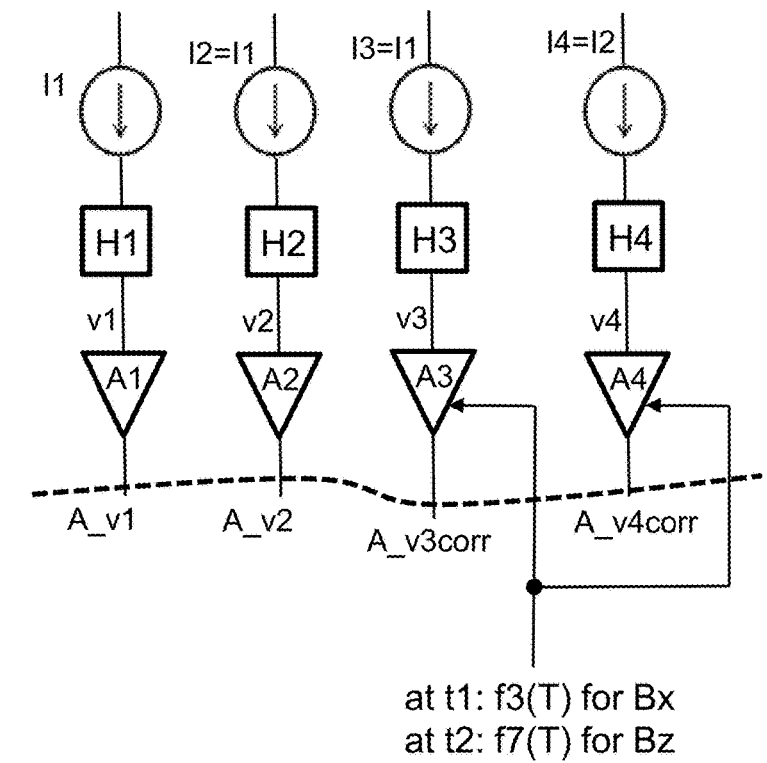
FIG. 16(e) shows a variant of the circuit of FIG. 3(d), according to an embodiment of the present invention, using a temperature sensor and two adjustable amplifiers, controlled using a single predefined function.

FIG. 16(e) shows a variant of the circuit of FIG. 16(d), where the four current sources are predefined current sources (preferably with I1=I2=I3=I4) and where the first and second amplifier A1, A2 have a predefined gain (preferably A1=A2-, and where the gain of the third and fourth amplifier is dynamically adjusted using a predefined function f3(T) at first moments in time t1, when measuring the first gradient dBx/dx, and using a function f7(T) at second moments in time t2, when measuring the second gradient dBz/dx. This solution allows to adjust the signal paths differently depending on which magnetic component/gradient is being measured/determined, which in turn depends on how the values obtained from the sensor elements are mathematically combined.

Figure 16F:
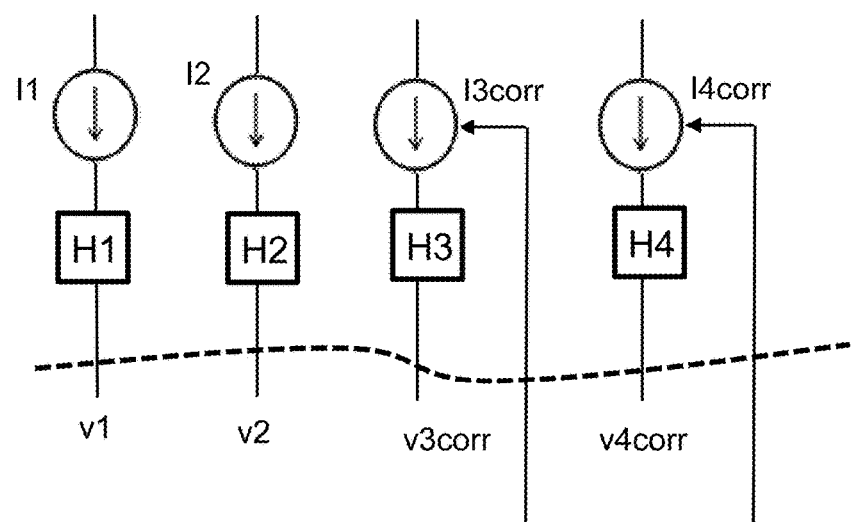
FIG. 16(f) shows a variant of the circuit of FIG. 3(c), according to an embodiment of the present invention, using a temperature sensor and two adjustable current sources, controlled using two predefined functions.

FIG. 16(f) shows a variant of FIG. 16(d) where the third current source I3 and the fourth current source I4 are controlled based on a function f3(T) and f4(T) respectively, at first moments in time, when measuring Bx (determining dBx/dx), and are controlled based on a function f7(T) and f8(T) respectively, at second moments in time, when measuring Bz (determining dBz/dx). This allows further fine-tuning, to increase the accuracy even further.

Figure 16G:
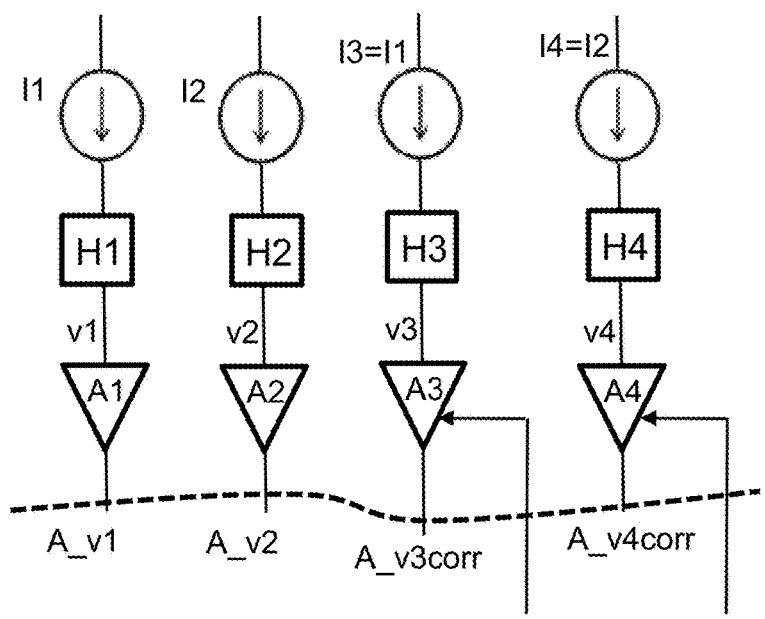
FIG. 16(g) shows a variant of the circuit of FIG. 3(e), according to an embodiment of the present invention, using a temperature sensor and two adjustable amplifiers, controlled using two predefined functions.

FIG. 16(g) shows a variant of FIG. 16(e) where the third amplifier gain A3 and the fourth amplifier gain A4 are controlled using a function f3(T) and f4(T) respectively, at first moments in time, when measuring Bx (for determining dBx/dx), and are controlled using a function f7(T) and f8(T) respectively, at second moments in time, when measuring Bz (for determining dBz/dx). This allows further fine-tuning, to increase the accuracy even further.

Figure 16H:
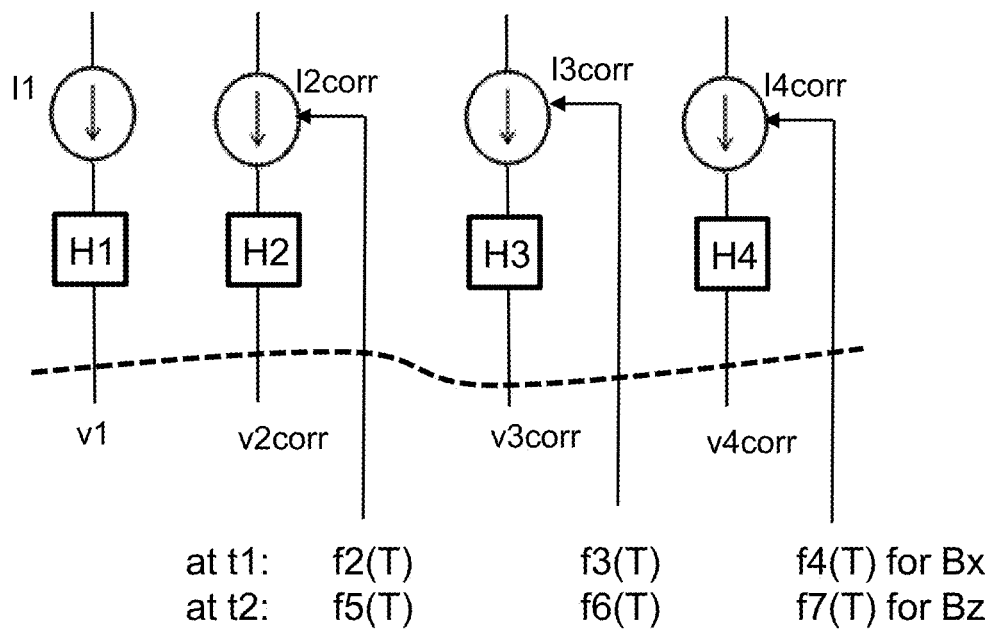
FIG. 16(h) shows a variant of the circuit of FIG. 16(d), according to an embodiment of the present invention, wherein the two adjustable current sources are controlled in a first manner when measuring a first magnetic field component (here: Bx), and are controlled in a second manner when measuring a second magnetic field component (here: Bz) orthogonal to the first magnetic field component.

FIG. 16(h) show a variant of FIG. 16(f) where also the second current source I2 is controlled, using a function f2(T) at times t1, and using a function f6(T) at times t2. As described above, the factor of K or K(T) may be omitted in this case.

Figure 16I:
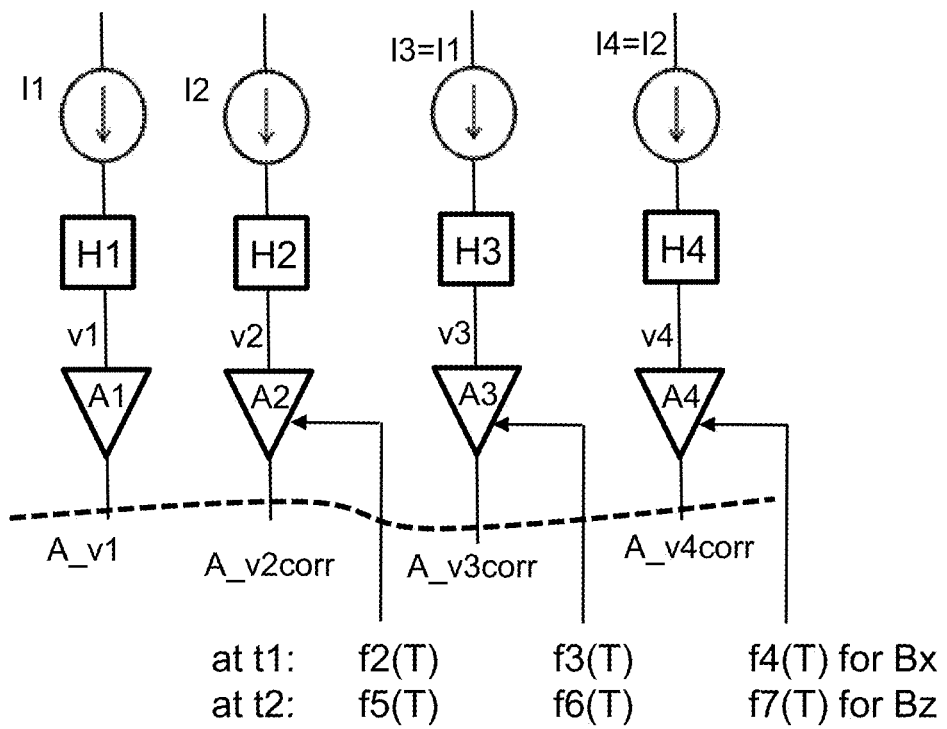
FIG. 16(i) shows a variant of the circuit of FIG. 16(e), according to an embodiment of the present invention, wherein the two adjustable amplifiers are controlled in a first manner when measuring a first magnetic field component (here: Bx), and are controlled in a second manner when measuring a second magnetic field component (here: Bz) orthogonal to the first magnetic field component.

FIG. 16(i) show a variant of FIG. 16(g) where also the second amplifier gain A2 is controlled, using a function f2(T) at times t1, and using a function f6(T) at times t2. As described above, the factor of K or K(T) may be omitted in this case.

In other variants of FIG. 16(d) to FIG. 16(i), all current sources are predefined (not adjusted), and all amplifiers are predefined (not adjusted), but the amplified and digitized signals are corrected in the digital domain, in analogy with FIG. 3(f). In an embodiment, a single correction function f3(T) is used for correcting both amplified and digitized values A_V3 and A_V4 when determining dBx/dx and when determining dBz/dx. In another embodiment, a correction function f3(T) is used for correcting the amplified and digitized value A_V3, and another correction function f7(T) is used for correcting the amplified and digitized value A_V4, when determining dBx/dx and when determining dBz/dx. In yet another embodiment, a correction function f3(T) is used for correcting the amplified and digitized value A_V3 and a correction function f4(T) is used for correcting the the amplified and digitized value A_V4 when determining dBx/dx, and a correction function f7(T) is used for correcting the amplified and digitized value A_V3 and a correction function f8(T) is used for correcting the the amplified and digitized value A_V4 when determining dBz/dx.

Figure 17A:
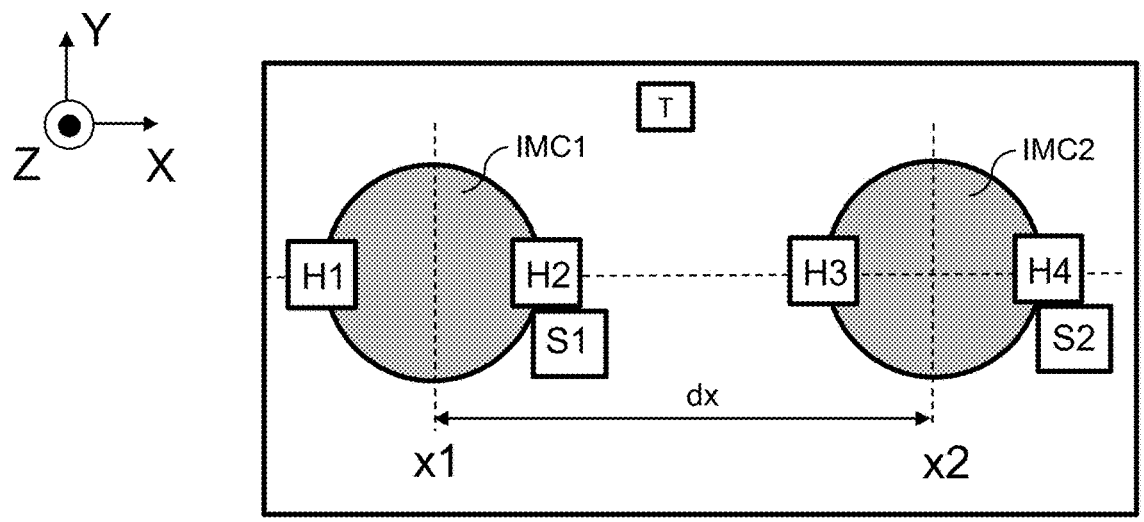
FIG. 17(a) shows a variant of the sensor arrangement of FIG. 16(a), further comprising two stress sensors, one at each sensor location (e.g. under or near the IMC).

FIG. 17(a) shows a variant of the sensor arrangement of FIG. 16(a), further comprising two stress sensors, one at each sensor location.

Figure 17B:
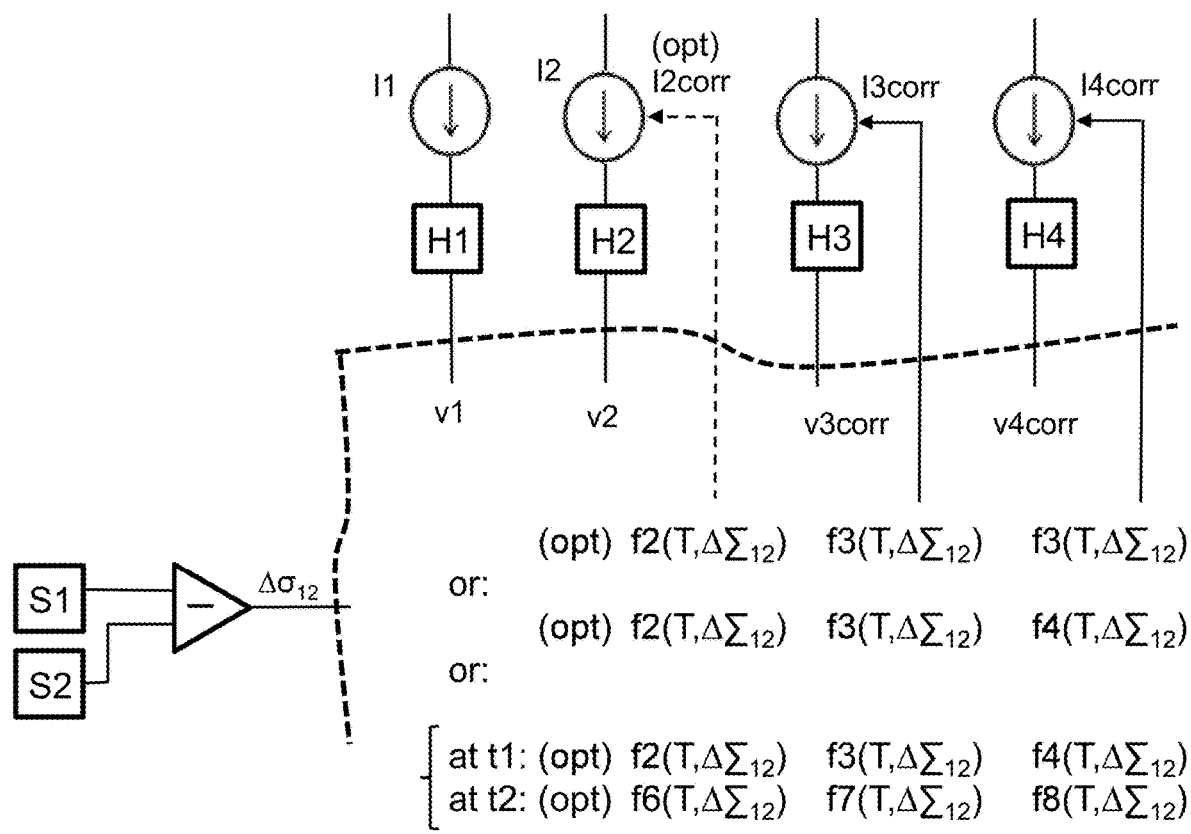
FIG. 17(b) shows a variant of the circuit of FIG. 16(d), FIG. 16(f) and FIG. 16(h), according to embodiments of the present invention, further comprising two stress sensors, in which two adjustable current sources are controlled as a function of temperature and differential stress.

FIG. 17(b) schematically illustrates the variants of FIG. 16(d) and FIG. 16(f) and FIG. 16(h), further comprising two stress sensors, wherein the predefined functions are not only dependent on temperature, but also on differential stress.

Figure 17C:
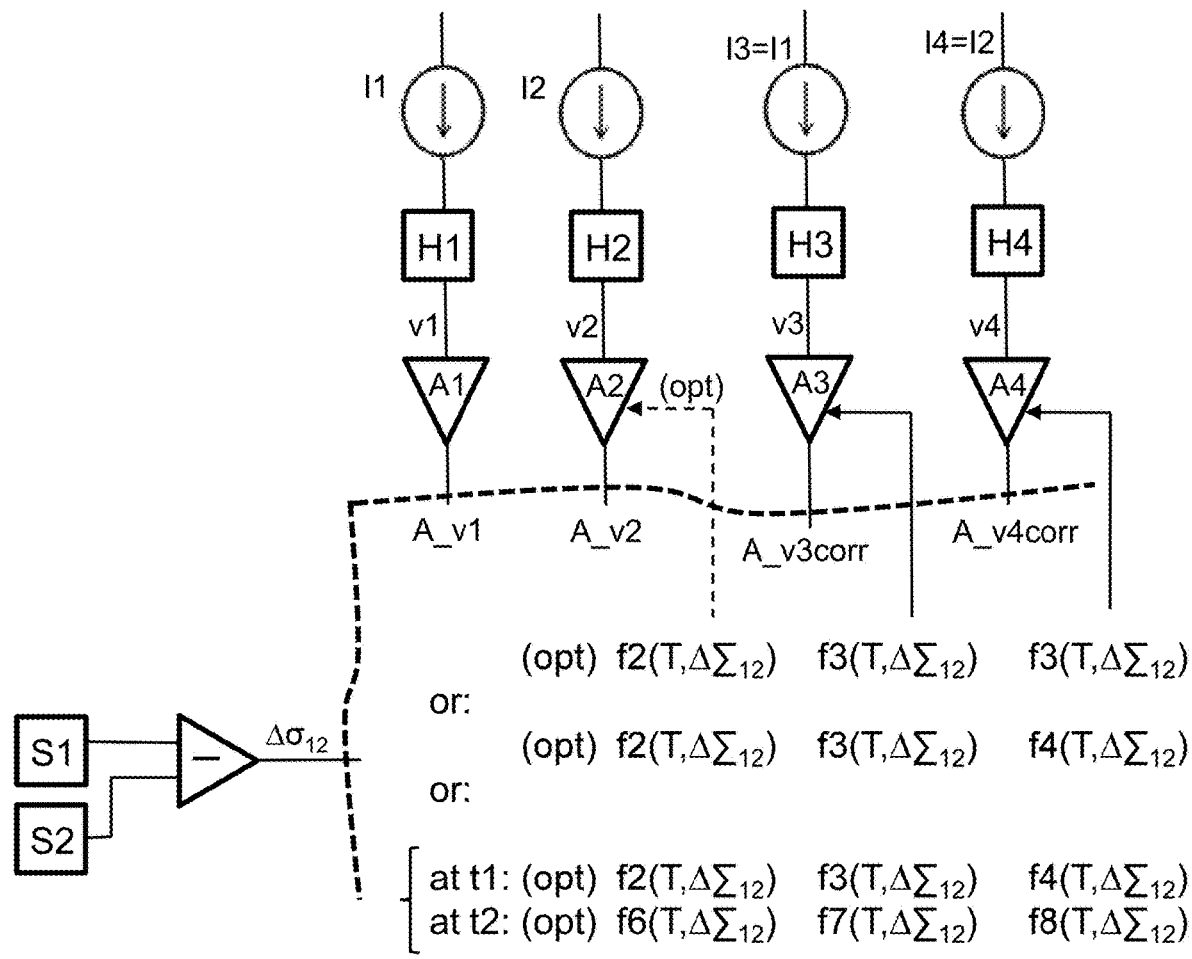
FIG. 17(c) shows a variant of the circuit of FIG. 16(e), FIG. 16(g) and FIG. 16(i), according to embodiments of the present invention, further comprising two stress sensors, in which two adjustable amplifiers are controlled as a function of temperature and differential stress.

FIG. 17(c) schematically illustrates the variants of FIG. 16(e) and FIG. 16(g) and FIG. 16(i), further comprising two stress sensors, wherein the predefined functions are not only dependent on temperature, but also on differential stress.

A variant where the biasing sources are predefined current sources, and wherein the amplifiers have a predefined gain, and where the signals originating from the second sensor are corrected in the digital domain, in analogy with FIG. 3(f), is also contemplated.

In other or further variants of FIGS. 17(a) to 17(c), the predefined functions for adjusting the biasing sources, and/or for adjusting the amplifier gains, and/or for correcting the amplified and digitized values in the digital domain are only a function of differential stress, but not of temperature, similar to what was described in FIG. 5(a) to FIG. 5(f). In these embodiments, the temperature sensor may be omitted.

FIG. 18(a) shows a variant of the sensor arrangement of FIG. 3(a) comprising two sensor structures, each comprising an integrated magnetic concentrator (IMC) and four horizontal Hall elements arranged at a periphery of the IMC. By appropriately combining (e.g. adding or subtracting) signals from the Hall elements around each IMC, each sensor structure can be used to measure Bx and/or By and/or Bz.

Indeed, Bx1 at the first sensor location X1 can be derived from (vH3−vH1), By1 at the first sensor location X1 can be derived from (vH4−vH2), and Bz1 at the first sensor location X1 can be derived from (vH1+vH3) or from (vH2+vH4) or from (vH1+vH2+vH3+vH4). Likewise, Bx2 can be calculated as (vH7−vH5), and By2 can be calculated as (vH8−vH6), and Bz2 can be calculated as (vH5+vH7), or as (vH6+vH8), or as (vH5+vH6+vH7+vH8). The gradient dBx/dx can be calculated as: (Bx2−Bx1), the gradient dBy/dx can be calculated as: (By2−By1), and the gradient dBz/dx can be calculated as: (Bz2−Bz1).

Position sensor systems using this sensor structure can determine an angular or linear position using the method of FIG. 10 or FIG. 11(a) or FIG. 11(b).

In an embodiment where a ratio of dBx/dx and dBz/dx is used, the signals from H1, H3 and of H5, H7 are pairwise subtracted for determining dBx/dx, in a manner as described above (FIGS. 6(a) to 6(c) and FIGS. 16(a) to 16(i)), and the signals from H2, H4 and H6, H8 are pairwise added for determining dBz/dx. This "addition" and "subtraction" of the signals from two Hall elements from a single magnetic sensor can be performed in the analog domain (see e.g. blocks 611, 622 of FIG. 6(c) where a subtraction is shown). This addition and subtraction is preferably performed in parallel, since signals from different Hall elements are used, hence no time-multiplex is required. In this case, the structure of FIG. 18(a) can be considered as being composed of two electrically independent sensor structures with shared IMC disks, one sensor structure identical to that shown in FIGS. 6(a) to 6(c), including the readout circuitry (with the subtraction blocks 611, 612, 621, 622), and another sensor structure with a layout similar to that of FIG. 6(a), after moving the two Hall elements over 90° around the center of the IMC disk, and with a readout circuit similar to that described in FIG. 6(b)-FIG. 6(c), but with an adder block instead of the subtraction blocks 611-621.

In an embodiment where a ratio of dBy/dx and dBz/dx is used, the signals from H1, H3 and of H5, H7 are pairwise added for determining dBz/dx, in a manner as described above (FIGS. 6(a) to 6(c) and FIGS. 16(a) to 16(i)), and the signals from H2, H4 and H6, H8 are pairwise subtracted for determining dBy/dx. In this case, the structure of FIG. 18(a) can also be considered as being composed of two electrically independent sensor structures with shared IMC disks, one sensor structure having the same layout as that shown in FIG. 6(a), but having adder blocks (instead of subtraction blocks 611, 612, 621, 622), and another sensor structure with a layout similar to that of FIG. 6(a), after moving the two Hall elements over 90° around the center of the IMC disk, and with a readout circuit as discussed in FIGS. 6(a) to 6(c) (with the subtraction blocks).

In another embodiment, the structure is used for determining a ratio of dBx/dx and dBy/dx. Similar considerations apply.

In all cases, each set of four Hall elements can be independently biased and readout using the principles described in FIG. 16(a) to FIG. 16(i), some of which are described in more detail further.

FIG. 18(b) shows an exemplary angular position sensor system 1800 comprising an axially magnetized four-pole magnet 1801 and a sensor device 1802 having a sensor arrangement as shown in FIG. 18(a), located offset from the rotation axis ("off-axis"). The sensor device 1802 is configured for determining the angular position of the magnet based on the ratio of dBx/dx and dBy/dx, using a method illustrated in FIG. 11(a) or FIG. 11(b), where the sensor device is oriented such that its X-axis is in a circumferential direction of the magnet (tangential to an imaginary circle with radius Rs), and its Z-axis is parallel to the rotation axis, and its Y-axis is substantially radially oriented.

FIG. 18(c) shows another exemplary angular position sensor system 1850 comprising a radially magnetized eight-pole ring or disk magnet 1851, and a sensor device 1852 having a sensor arrangement as shown in FIG. 18(a), located outside the magnet, substantially at half the height of the magnet ("near the equator"). The sensor device 1852 is configured for determining the angular position of the sensor device relative to the magnet 1851, or vice versa, based on the ratio of dBx/dx and dBz/dx, where the sensor device is oriented such that its X-axis is in a circumferential direction of the magnet (tangential to an imaginary circle with radius Rs), and its Y-axis is parallel to the rotation axis of the magnet, and its Z-axis is substantially radially oriented. As described above, the sensor signals H1, H3, H5, H7 have to be used to determine dBx/dx, but there are several ways to determine dBz/dx. In an embodiment where H2, H4, H6 and H8 are used to determine dBz/dx, the biasing of the odd numbered sensor elements and the even number elements can occur at the same time, even though different functions are used for determining dBx/dx and dBz/dx.

Figure 18D:
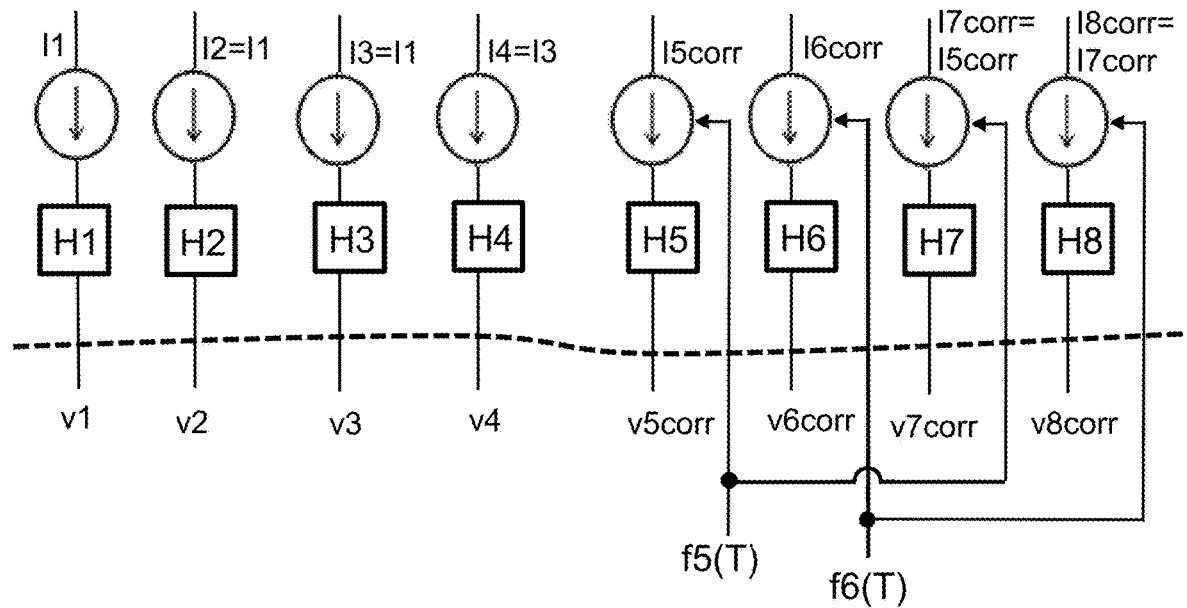
FIG. 18(d) shows a variant of the circuit of FIG. 3(c), according to an embodiment of the present invention, using a temperature sensor and four adjustable current sources using only two predefined functions.

FIG. 18(d) shows a variant of the circuit of FIG. 6(b) and of FIG. 16(d), wherein I5 and I7 are adjusted using a predefined function f5(T), and wherein I6 and I8 are adjusted using a predefined function f6(T). This is a simple implementation, requiring only two predefined functions.

The correction functions f5 and f6 can be determined in similar manners as described above. For example (brief): Choose I1=I2=I3=I4, provide adjustable I5 and I6, use a current mirror such that I7=I5, use another current mirror such that I8=I6. Apply a constant magnetic field, and adjust I5=I7 until BxL=BxR or until BzL=BzR depending on how H1,H3,H5,H7 are used. And adjust I6=I8 until ByL=ByR or until BzL=BzR depending on how H2, H4, H6, H8 are used. Store the functions f5, f6 in a suitable form in non-volatile memory.

In a variant of FIG. 18(d), also I3 and I4 are adjusted using a predefined function f3(T).

Figure 18E:
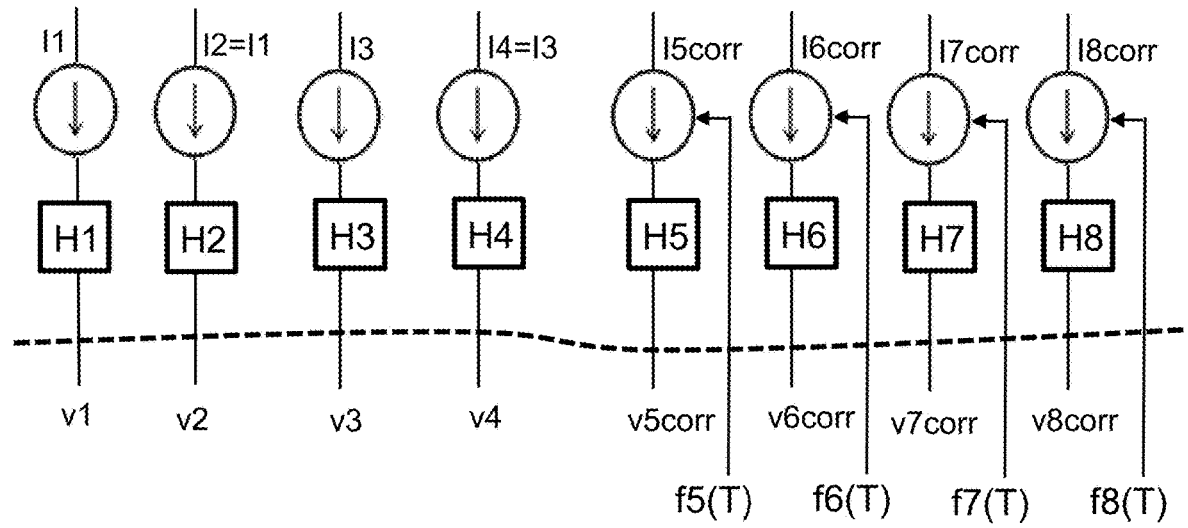
FIG. 18(e) shows a variant of the circuit of FIG. 3(c), according to an embodiment of the present invention, using a temperature sensor and four adjustable current sources using four predefined functions.
Figure 18F:
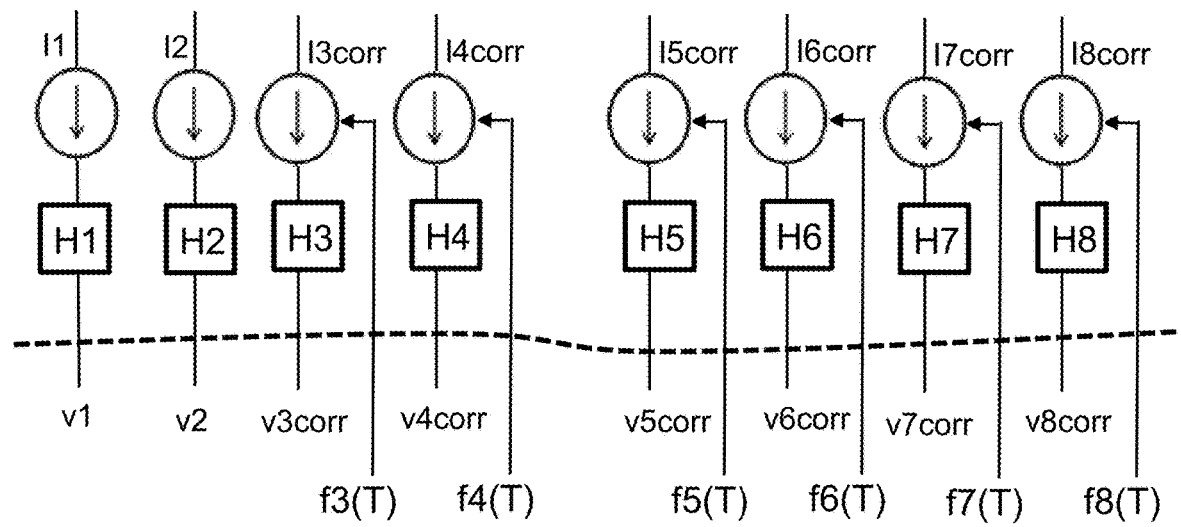
FIG. 18(f) shows a variant of FIG. 18(e) using six adjustable current sources, controlled by six predefined functions.
Figure 18G:
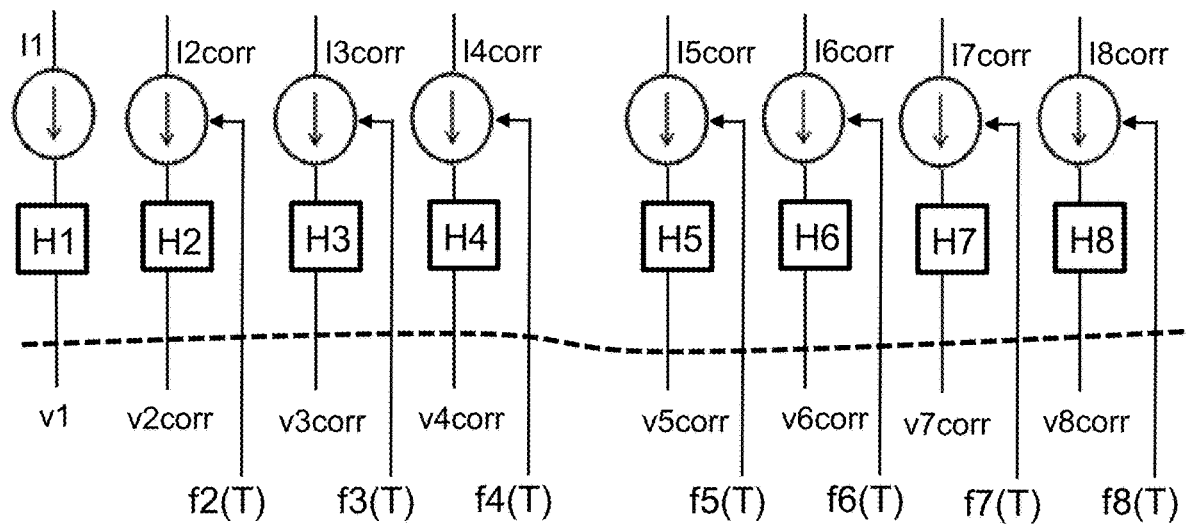
FIG. 18(g) shows a variant of FIG. 18(e) using seven adjustable current sources, controlled by seven predefined functions.
Figure 19A:
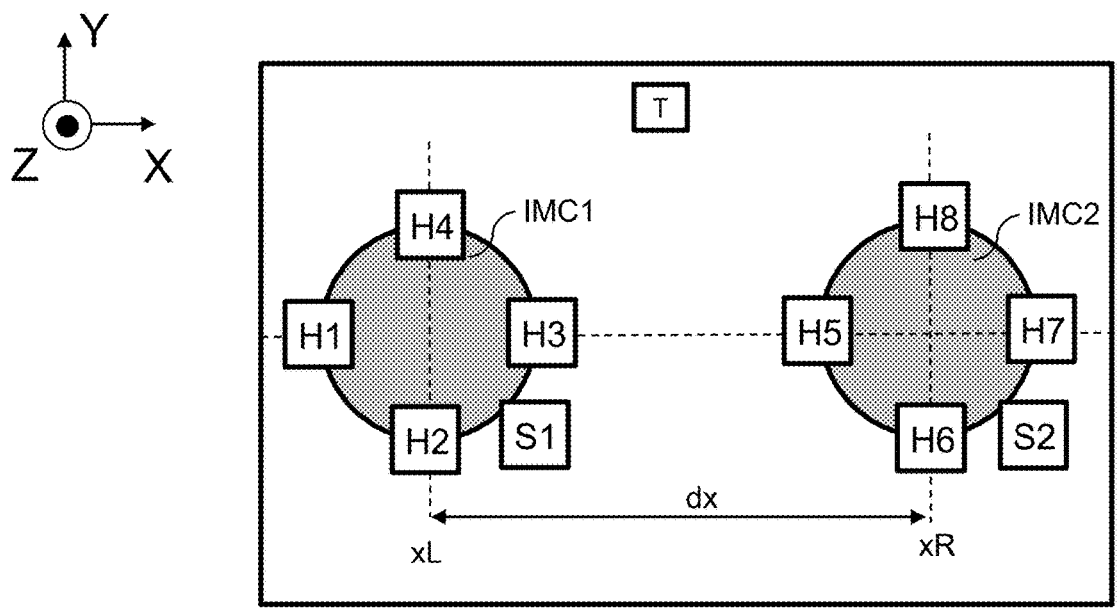
FIG. 19(a) shows a variant of the sensor arrangement of FIG. 18(a), further comprising two stress sensors, one at each sensor location.
Figure 19B:
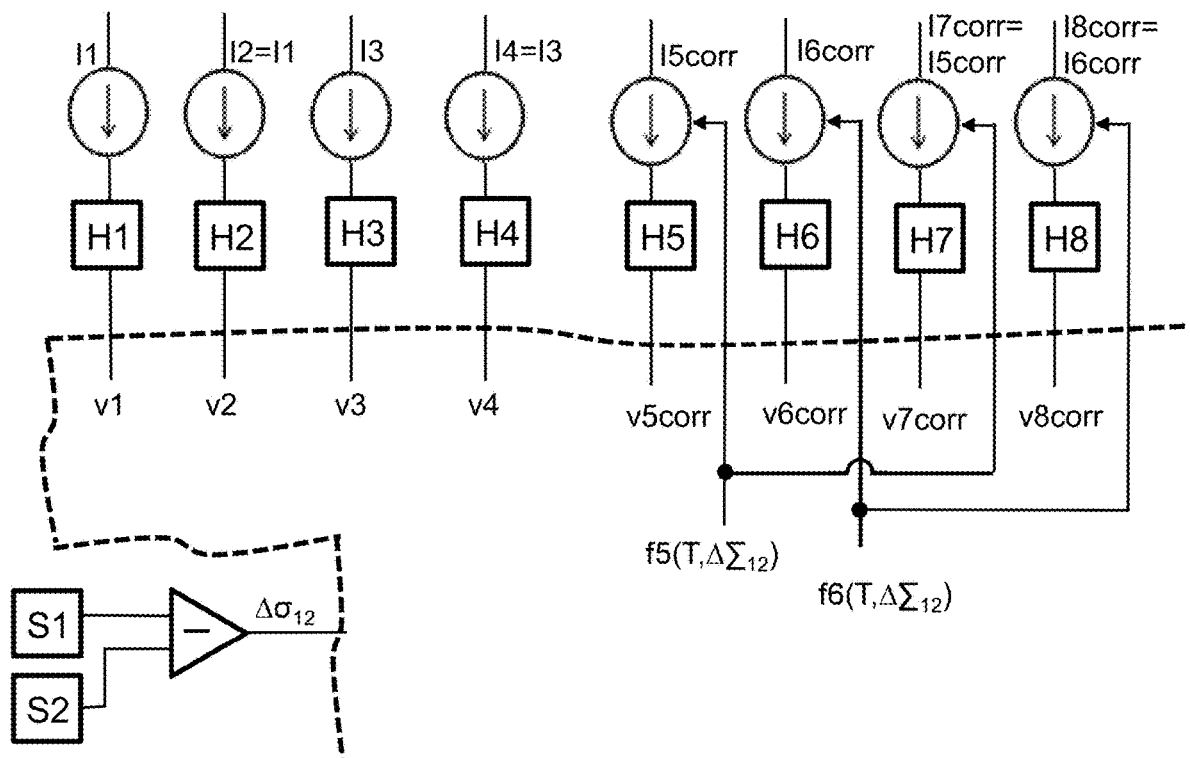
FIG. 19(b) to FIG. 19(d) are variants of FIG. 18(d) to FIG. 18(f) with the addition of stress sensors.
Figure 19C:
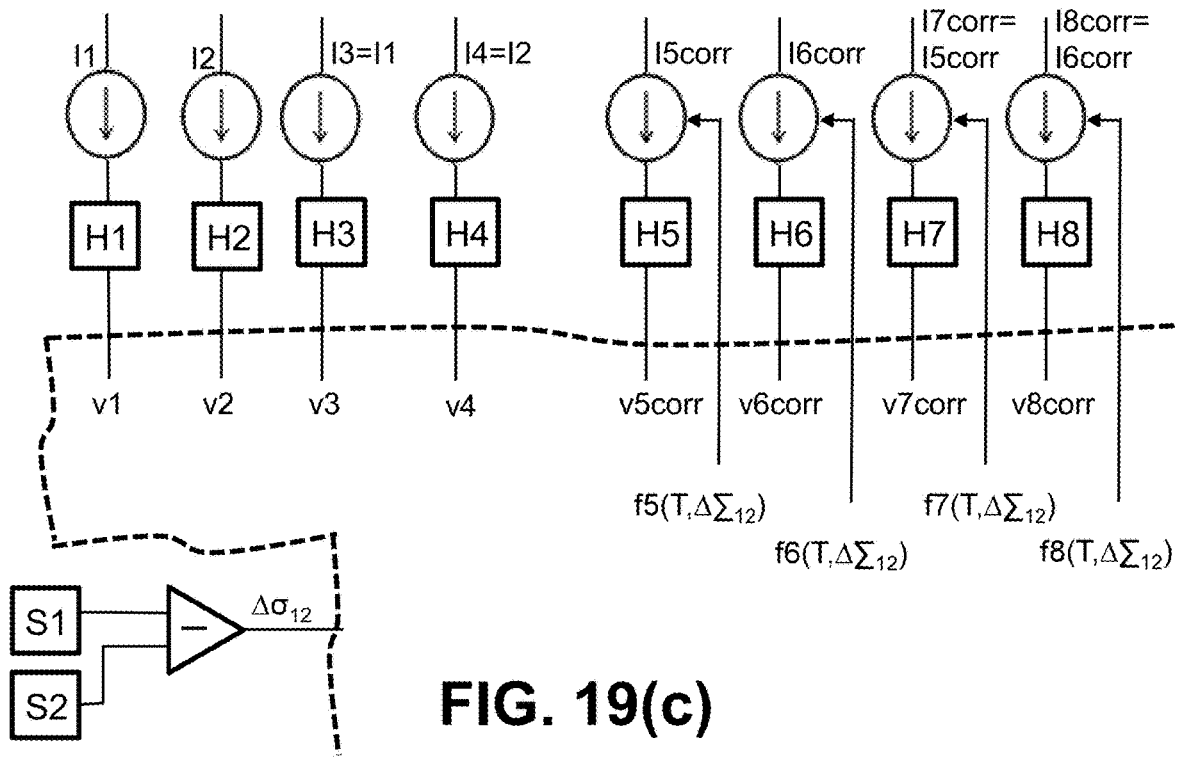
Figure 19D:
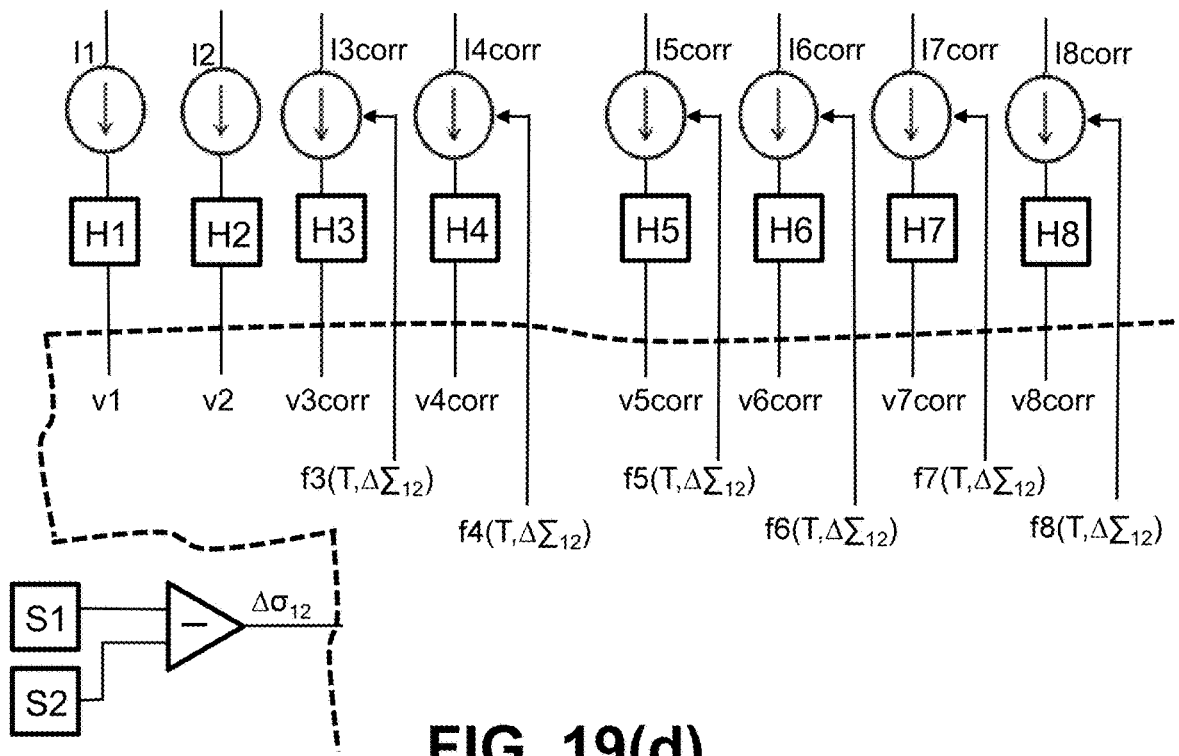

FIG. 18(e) shows a variant of the circuit of FIG. 6(b) and of FIG. 16(f), wherein I5 is adjusted using a predefined function f5(T), I6 is adjusted using a predefined function f6(T), I7 is adjusted using a predefined function f7(T), and I8 is adjusted using a predefined function f8(T).

FIG. 18(*f*) shows a variant of the circuit of FIG. 18(*e*), wherein furthermore I3 is adjusted using a predefined function f3(T), and I4 is adjusted using a predefined function f4(T).

FIG. 18(*g*) shows a variant of the circuit of FIG. 18(*e*), wherein furthermore I2 is adjusted using a predefined function f2(T). This is relatively complex, but offers the highest flexibility.

In variants of the circuits shown in FIG. 18(*d*) to FIG. 18(*g*), the current sources are predefined current sources (not adjusted), and two, four, six or seven amplifiers are amplifiers with a adjustable gain, controlled by the predefined functions shown in FIG. 18(*d*) to FIG. 18(*g*).

In other variants of the circuits shown in FIG. 18(*d*) to FIG. 18(*g*), the current sources are predefined current sources (not adjusted), and the amplifiers are predefined amplifiers (not adjusted), but the corrections are performed in the digital domain, in analogy with FIG. 3(*f*), using two, four, six or seven predefined functions.

FIG. 19(*a*) shows a variant of the sensor structure shown in FIG. 18(*a*), with the addition of two stress sensors, one at or near each sensor location.

FIG. 19(*b*), FIG. 19(*c*) and FIG. 19(*d*) show variants of FIG. 18(*d*), FIG. 18(*e*) and FIG. 18(*f*) respectively. The main difference being that the predefined functions used to control the adjustable current sources are not only dependent on temperature, but also dependent on differential stress.

All variants described for FIGS. 18(*a*) to 18(*g*) are also contemplated with the addition of a differential stress sensor.

In variants (not shown) of FIGS. 18(*a*) to 18(*g*) and FIGS. 19(*a*) to 19(*d*), the predefined functions for adjusting the biasing sources, for adjusting the amplifier gains, and for calculating the correction factors in the digital domain are functions of differential mechanical stress, but not of temperature, in analogy with FIG. 5(*a*) to FIG. 5(*f*). In these embodiments, the temperature sensor may be omitted.

Having described several embodiments of the invention in detail, the skilled person can easily come up with small modifications. For example, while the embodiments are described for a magnetic sensor providing a voltage signal, which voltage signal is amplified and/or subtracted and/or digitized, in a practical implementation, the voltage signal may be converted into a current signal, which is amplified and/or subtracted and/or digitized, or the current may be converted back to a voltage after amplification, etc.

The present invention describes position sensor systems using a combination (e.g. a ratio) of two first order magnetic field differences or two first order magnetic field components, but of course, the same techniques can also be applied to systems using a combination (e.g. a ratio) of a first order magnetic field gradient and a second order magnetic field gradient, or a ratio of two second order magnetic field gradients, or a ratio of higher order magnetic field gradients (the nominator or denominator being at least of first order). It is noted that a second order magnetic field gradient can for example be obtained by subtracting two first order magnetic field gradients, or by forming a linear combination of three magnetic field component values, such as for example B1−2*B2+B3, where B1, B2 and B3 are derived from three magnetic sensors located on an axis, B2 being located in the middle between B1 and B3.

The invention claimed is:
1. A method of determining a linear or angular position of a magnetic sensor device relative to a magnetic source, or vice versa; the magnetic sensor device comprising:
  a first, a second, a third and a fourth magnetic sensor element;
  a first, second, third and fourth biasing source for biasing said sensor elements;
  a first, second, third and fourth amplifier for amplifying a signal originating from said sensor elements;
  at least one analog-to-digital converter for digitizing signals originating from said amplifiers;
  one or both of a temperature sensor and a differential stress measurements circuit;
  a digital processing circuit connected downstream of the analog-to-digital convertor;
  the method comprising the steps of:
  obtaining one or both of a temperature value and a differential stress value;
    a) determining a first magnetic field gradient based on signals obtained from the first and the third magnetic sensor element;
    b) determining a second magnetic field gradient based on signals obtained from the second and the fourth magnetic sensor element;
    c) calculating a ratio of the first and the second magnetic field gradient;
    d) determining said linear or angular position based on said ratio;
  wherein:
  step a) comprises: adjusting the third biasing source and/or adjusting a signal path comprising the third amplifier using a first predefined function of temperature and/or differential stress, to match a signal path containing the third sensor element to a signal path containing the first sensor element; and
  step b) comprises: adjusting the fourth biasing source and/or adjusting a signal path comprising the fourth amplifier using a second predefined function of temperature and/or differential stress, different from the first predefined function to match a signal path containing the fourth sensor element to a signal path containing the second sensor element;
  step d) further comprises: determining said linear or angular position based on said ratio, optionally taking into account a predefined factor K or a predefined function K of temperature.

2. The method according to claim 1,
wherein step a) comprises: determining a first magnetic field gradient of a first magnetic field component oriented in a first direction along said first direction; and
wherein step b) comprises: determining a second magnetic field gradient of a second magnetic field component oriented in a second direction substantially perpendicular to the first direction, along said first direction.

3. The method according to claim 1,
wherein step a) comprises: determining a first magnetic field gradient of a magnetic field component oriented in a first direction along a second direction substantially perpendicular to the first direction; and
wherein step b) comprises: determining a second magnetic field gradient of said magnetic field component oriented in said first direction along a third direction substantially perpendicular to the first direction and substantially perpendicular to said second direction.

4. The method according to claim 1, wherein step a) comprises:
determining an analog difference signal between a first signal obtained by: biasing the first magnetic sensor, and amplifying the first sensor signal, and
a second signal obtained by: biasing the second magnetic sensor, and amplifying the second sensor signal, after measuring a temperature and/or a differential stress, and adjusting the second biasing source or the second amplifier using a predefined function of the measured temperature and/or differential stress; and digitizing the analog difference signal to obtain the first gradient.

5. The method according to claim 1, wherein step a) comprises:

determining a digital difference value between a first digital value obtained by: biasing the first magnetic sensor and amplifying the first sensor signal, and digitizing this amplified signal; and a second digital value obtained by: biasing the second magnetic sensor, and amplifying the second sensor signal, and digitizing this amplified signal, after measuring a temperature and/or a differential stress, and adjusting the second biasing source or the second amplifier using a predefined function of the measured temperature and/or differential stress.

6. The method according to claim 1, wherein step a) comprises:

determining a digital difference value between a first digital value obtained by: biasing the first magnetic sensor and amplifying the first sensor signal, and digitizing this amplified signal; and a second digital value obtained by: biasing the second magnetic sensor and amplifying the second sensor signal, and digitizing this amplified signal, and adjusting this digitized value by multiplication with a correction factor using a predefined function of the measured temperature and/or differential stress.

7. The method according to claim 1, wherein the predefined function for adjusting the biasing source and/or the amplifier gain and/or for correcting the digitized value, is a function of only temperature, or is a function of only differential stress, or is a function of temperature and differential stress.

8. A magnetic position sensor device comprising a semiconductor substrate comprising:

at least a first magnetic sensor located at a first sensor location, and a second magnetic sensor located at a second sensor location, spaced apart from the first sensor location;

at least a first biasing source for biasing the first magnetic sensor, and a second biasing source for biasing the second magnetic sensor;

at least a first amplifier for amplifying a signal obtained from the first magnetic sensor, and a second amplifier for amplifying a signal obtained from the second magnetic sensor;

at least a third magnetic sensor, and optionally a fourth magnetic sensor;

at least a third biasing source for biasing the third magnetic sensor, and optionally a fourth biasing source for biasing the fourth magnetic sensor;

at least a third amplifier for amplifying a signal obtained from the third magnetic sensor, and optionally a fourth amplifier for amplifying a signal obtained from the fourth magnetic sensor;

a temperature sensor located at a predefined position on the substrate;

at least one differential stress sensing circuit configured for determining at least one stress difference between two of said magnetic sensors;

at least one analog-to-digital-converter connected downstream of said amplifiers;

a digital processing circuit connected downstream of the analog-to-digital-converter;

a non-volatile memory operatively connected to the digital processing circuit, configured for storing one or more values or parameters of said predefined function;

wherein the digital processing circuit is configured for performing a method according to claim 1.

9. A magnetic position sensor system, comprising:

a two-pole ring or disk magnet, rotatable about an axis;

a magnetic position sensor device, arranged at a distance from said magnet, and comprising four horizontal Hall elements arranged on an imaginary circle, and angularly spaced apart by 90°, and four biasing sources, and four amplifiers;

the magnetic sensor further comprising: at least one analog-to-digital convertor, and a temperature sensor and two differential stress sensors; and a digital processing circuit comprising a non-volatile memory, and being configured for performing a method according to claim 1.

10. A magnetic position sensor system, comprising:

a magnetic structure having at least four poles;

a magnetic position sensor device, arranged at a distance from said magnetic structure, and comprising two magnetic sensors spaced apart from each other, each magnetic sensor comprising a horizontal Hall element and a vertical Hall element, and four biasing sources, and four amplifiers, the magnetic sensor further comprising: at least one analog-to-digital convertor, and a temperature sensor and two differential stress sensors; and a digital processing circuit comprising a non-volatile memory, and being configured for performing a method according to claim 1.

11. A magnetic position sensor system, comprising:

a magnetic structure having at least four poles;

a magnetic position sensor device, arranged at a distance from said magnetic structure, and comprising two magnetic sensors spaced apart from each other, each magnetic sensor comprising an integrated magnetic concentrator and two horizontal Hall elements located on opposite sides of the corresponding integrated magnetic concentrator, and two biasing sources, and two amplifiers, the magnetic sensor further comprising: at least one analog-to-digital convertor, and a temperature sensor and two differential stress sensors; and a digital processing circuit comprising a non-volatile memory, and being configured for performing a method according to claim 1.

12. A magnetic position sensor system, comprising:

a magnetic structure having at least four poles;

a magnetic position sensor device, arranged at a distance from said magnetic structure, and comprising two magnetic sensors spaced apart from each other, each magnetic sensor comprising an integrated magnetic concentrator and four horizontal Hall elements arranged at a periphery of the integrated magnetic concentrator, and four biasing sources, and four amplifiers;

the magnetic sensor further comprising: at least one analog-to-digital convertor, and a temperature sensor and two differential stress sensors; and a digital processing circuit comprising a non-volatile memory, and being configured for performing a method according to claim 1.

13. A method of determining a linear or angular position of a magnetic sensor device relative to a magnetic source, or vice versa; the magnetic sensor device comprising:
- a first, a second, a third and a fourth magnetic sensor element;
- a first, second, third and fourth biasing source for biasing said sensor elements;
- a first, second, third and fourth amplifier for amplifying a signal originating from said sensor elements;
- at least one analog-to-digital converter for digitizing signals originating from said amplifiers;
- one or both of a temperature sensor and a differential stress measurements circuit;
- a digital processing circuit connected downstream of the analog-to-digital convertor;

the method comprising the steps of:
- obtaining one or both of a temperature value and a differential stress value;
- a) determining a first magnetic field gradient based on a first mathematical combination of signals obtained from said magnetic sensor elements;
- b) determining a second magnetic field gradient based on a second mathematical combination of signals obtained from said magnetic sensor elements;
- c) calculating a ratio of the first and the second magnetic field gradient;
- d) determining said linear or angular position based on said ratio;

wherein:
- step a) comprises: adjusting the biasing source and/or the signal path containing the third and the fourth amplifier using a first predefined function or a first set of control functions of temperature and/or differential stress, to match the signal paths of the magnetic sensor elements when performing the first mathematical combination (or stated in other words: such that a first mathematical combination of the signals obtained from the third and fourth sensor matches the first mathematical combination of the signals obtained from the first and second sensor); and
- step b) comprises: adjusting the biasing source and/or the signal path containing the third and the fourth amplifier using a second predefined function or a second set of control functions of temperature and/or differential stress, to match the signal paths of the magnetic sensor elements when performing the second mathematical combination (or stated in other words: such that a second mathematical combination of the signals obtained from the third and fourth sensor matches the second mathematical combination of the signals obtained from the first and second sensor), the second control function or the second set of control functions being different from the first control function or the first set of control functions; and
- step d) further comprises: determining said linear or angular position based on said ratio, optionally taking into account a predefined factor K or a predefined function K of temperature.

14. The method according to claim 13, wherein step a) comprises:
- determining an analog difference signal between a first signal obtained by: biasing the first magnetic sensor, and amplifying the first sensor signal, and
- a second signal obtained by: biasing the second magnetic sensor, and amplifying the second sensor signal,
- after measuring a temperature and/or a differential stress, and adjusting the second biasing source or the second amplifier using a predefined function of the measured temperature and/or differential stress; and
- digitizing the analog difference signal to obtain the first gradient.

15. The method according to claim 13, wherein step a) comprises:
- determining a digital difference value
- between a first digital value obtained by: biasing the first magnetic sensor and amplifying the first sensor signal, and digitizing this amplified signal; and
- a second digital value obtained by: biasing the second magnetic sensor, and amplifying the second sensor signal, and digitizing this amplified signal,
- after measuring a temperature and/or a differential stress, and adjusting the second biasing source or the second amplifier using a predefined function of the measured temperature and/or differential stress.

16. The method according to claim 13, wherein step a) comprises:
- determining a digital difference value
- between a first digital value obtained by: biasing the first magnetic sensor and amplifying the first sensor signal, and digitizing this amplified signal; and
- a second digital value obtained by: biasing the second magnetic sensor and amplifying the second sensor signal, and digitizing this amplified signal, and adjusting this digitized value by multiplication with a correction factor using a predefined function of the measured temperature and/or differential stress.

17. The method according to claim 13, wherein the predefined function for adjusting the biasing source and/or the amplifier gain and/or for correcting the digitized value, is a function of only temperature, or is a function of only differential stress, or is a function of temperature and differential stress.

18. A magnetic position sensor device comprising a semiconductor substrate comprising:
- at least a first magnetic sensor located at a first sensor location, and a second magnetic sensor located at a second sensor location, spaced apart from the first sensor location;
- at least a first biasing source for biasing the first magnetic sensor, and a second biasing source for biasing the second magnetic sensor;
- at least a first amplifier for amplifying a signal obtained from the first magnetic sensor, and a second amplifier for amplifying a signal obtained from the second magnetic sensor;
- at least a third magnetic sensor, and optionally a fourth magnetic sensor;
- at least a third biasing source for biasing the third magnetic sensor, and optionally a fourth biasing source for biasing the fourth magnetic sensor;
- at least a third amplifier for amplifying a signal obtained from the third magnetic sensor, and optionally a fourth amplifier for amplifying a signal obtained from the fourth magnetic sensor;
- a temperature sensor located at a predefined position on the substrate;
- at least one differential stress sensing circuit configured for determining at least one stress difference between two of said magnetic sensors;
- at least one analog-to-digital-converter connected downstream of said amplifiers;
- a digital processing circuit connected downstream of the analog-to-digital-converter;

a non-volatile memory operatively connected to the digital processing circuit, configured for storing one or more values or parameters of said predefined function;

wherein the digital processing circuit is configured for performing a method according to claim 13.

* * * * *